United States Patent
Hasegawa et al.

(10) Patent No.: US 6,873,500 B2
(45) Date of Patent: Mar. 29, 2005

(54) EXCHANGE COUPLING FILM CAPABLE OF IMPROVING PLAYBACK CHARACTERISTICS

(75) Inventors: Naoya Hasegawa, Niigata-ken (JP); Masamichi Saito, Niigata-ken (JP); Kenichi Tanaka, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 164 days.

(21) Appl. No.: 10/197,662

(22) Filed: Jul. 17, 2002

(65) Prior Publication Data
US 2003/0035255 A1 Feb. 20, 2003

(30) Foreign Application Priority Data

Jul. 19, 2001 (JP) ........................................ 2001-219449
Nov. 14, 2001 (JP) ........................................ 2001-348557

(51) Int. Cl.[7] .............................................. G11B 5/39
(52) U.S. Cl. ................................................. 360/324.11
(58) Field of Search ...................... 360/324.11, 324.12, 360/324.1, 324, 326; 338/32 R; 428/692–693

(56) References Cited

U.S. PATENT DOCUMENTS

| 6,046,892 A | 4/2000 | Aoshima et al. | |
|---|---|---|---|
| 6,141,191 A | 10/2000 | Lee et al. | |
| 6,187,408 B1 * | 2/2001 | Bian et al. | 428/65.3 |
| 6,222,707 B1 | 4/2001 | Huai et al. | |
| 6,258,468 B1 | 7/2001 | Mahvan et al. | |
| 6,650,512 B1 * | 11/2003 | Gill | 360/324.12 |

* cited by examiner

Primary Examiner—Angel Castro
(74) Attorney, Agent, or Firm—Brinks Hofer Gilson & Lione

(57) ABSTRACT

A seed layer is formed containing Cr and an element X (wherein the element X is Fe, Ni, etc.) on a substrate layer formed from Ta, etc. At this time, the compositional ratio of the aforementioned Cr is specified to be 80 at % or more, and the seed layer is formed to have a film thickness of 20 Å or more, but 130 Å or less. According to this, the wettability of the seed layer surface can be improved remarkably compared to that heretofore attained, the unidirectional exchange bias magnetic field and rate of resistance change in the fixed magnetic layer can be increased, and it becomes possible to make the smoothness of the surface of each layer on the aforementioned seed layer excellent.

28 Claims, 24 Drawing Sheets

AT LEFT SIDE (SEED IS BCC CRYSTAL), RELATIONSHIP {110}BCC-Cr//{111}FCC-PIN/Cu/FREE IS OBSERVED. ON THE OTHER HAND, AT RIGHT SIDE (SEED IS AMORPHOUS-LIKE MAIN), {111} ORIENTATION OF PIN/Cu/FREE IS NOT CLEAR.

LEFT ANALYTICAL POINT IN SEED IS AMORPHOUS-LIKE, AND RIGHT
POINT IS MIXTURE OF BCC AND AMORPHOUS-LIKE PHASE. REGARDING
PIN/Cu/FREE LAYER ABOVE THEM, AXES NEARER TO <111> ORIENTATE IN
NORMAL DIRECTION OF FILM THICKNESS EVEN THOUGH BOTH ARE WEAK.

FIG. 10

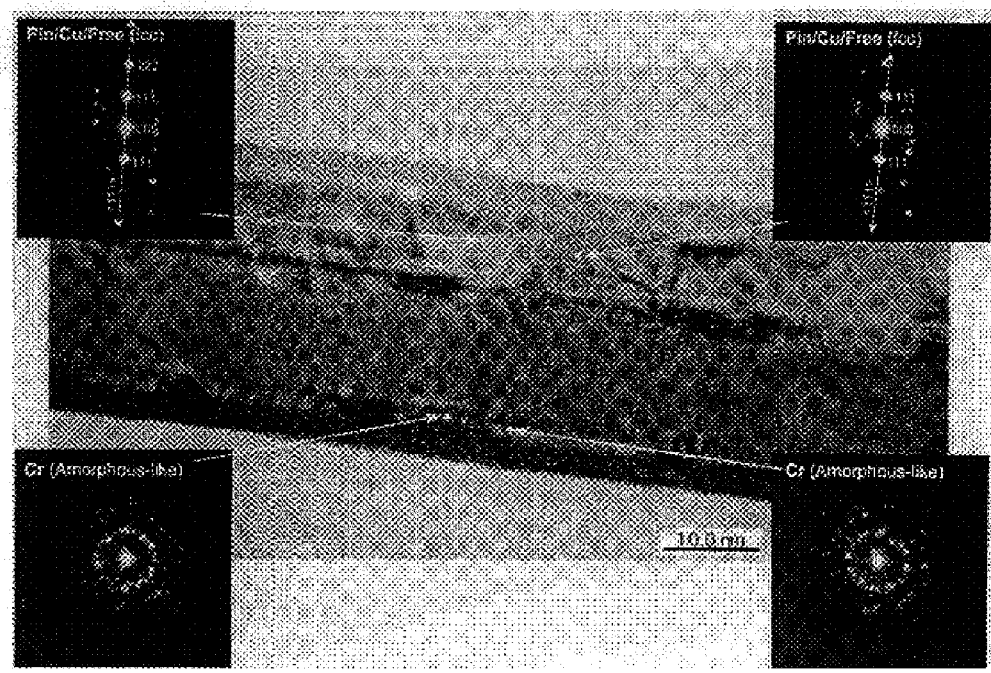

BOTH OF RIGHT AND LEFT POINTS IN SEED LAYER ARE AMORPHOUS-LIKE. IN THIS FIELD OF VIEW, EVEN WHEN SEED IS AMORPHOUS-LIKE, (111) ORIENTATION OF FCC PHASE (PIN/Cu/FREE LAYER) IS RELATIVELY EXCELLENT. IT IS ASSUMED THAT DENSEST SURFACE (OF PtMn) NATURALLY BROUGHT ABOUT LAMINAR GROWTH DUE TO STRONG WETTABILITY OF SEED LAYER, AND THAT WAS FOLLOWED BY GROWTH OF PIN/Cu/FREE LAYER (CRYSTAL OF PtMn WAS REARRANGED DURING ANNEALING). A SLIGHT DIFFERENCE IS OBSERVED BETWEEN ANGLES OF <111> AXES OF RIGHT AND LEFT FCC CRYSTALS.

AT LEFT SIDE (SEED IS BCC CRYSTAL MAIN), RELATIONSHIP
{110}BCC-Cr//{111}FCC-PIN/Cu/FREE IS OBSERVED.

IN THIS FIELD OF VIEW (SEED IS BCC CRYSTAL) AS WELL,
RELATIONSHIP {110}BCC-Cr//{111}FCC-PIN/Cu/FREE IS OBSERVED.
(HOWEVER, SINCE IT IS NOT PERFECTLY PARALLEL, IT IS ASSUMED
TO BE DIFFERENT FROM PERFECTLY EPITAXIAL GROWTH.)

CRYSTAL GRAIN BOUNDARIES

EXCHANGE COUPLING FILM CAPABLE OF IMPROVING PLAYBACK CHARACTERISTICS

BACKGROUND OF THE INVENTION

1. Field of the Invention

The present invention relates to an exchange coupling film which is composed of a seed layer, an antiferromagnetic layer, and a ferromagnetic layer in that order from the bottom, wherein the direction of magnetization of the aforementioned ferromagnetic layer is set in a specified direction due to an exchange coupling magnetic field generated at the interface between the aforementioned antiferromagnetic layer and the ferromagnetic layer, and to a magnetic detection element (spin valve type thin film element, AMR element, etc.) using the aforementioned exchange coupling film. In particular, the present invention relates to an exchange coupling film capable of properly improving reliability in current-carrying (electromigration resistance) and of achieving excellent rate of resistance change, etc., compared to those heretofore attained even in the future increase in recording density, and to a magnetic detection element using the aforementioned exchange coupling film.

2. Description of the Related Art

FIG. 25 is a partial sectional view of a conventional magnetic detection element (spin valve type thin film element) cut from the direction parallel to the surface facing a recording medium.

Reference numeral 14 shown in FIG. 25 denotes a seed layer formed from, for example, NiFeCr, and an antiferromagnetic layer 30, a fixed magnetic layer 31, a non-magnetic material layer 32, a free magnetic layer 33, and a protection layer 7 are laminated in that order on the aforementioned seed layer 14.

Regarding this sort of spin valve type thin film element, an exchange coupling magnetic field is generated at the interface between the aforementioned antiferromagnetic layer 30 and fixed magnetic layer 31 due to a heat treatment and, therefore, magnetization of the aforementioned fixed magnetic layer 31 is fixed in the direction of height (the Y direction in the drawing).

In FIG. 25, hard bias layers 5 are formed on both sides of the multilayer film from the aforementioned seed layer 14 to the protection layer 7, and by a vertical bias magnetic field from the aforementioned hard bias layers 5, magnetization of the aforementioned free magnetic layer 33 is arranged in the direction of track width (the X direction in the drawing).

As shown in FIG. 25, electrode layers 8 are formed while being overlaid on the aforementioned hard bias layers 5. A sense current from the electrode layers 8 primarily passes through three layers of the fixed magnetic layer 31, the non-magnetic material layer 32, and the free magnetic layer 33.

In the spin valve type thin film element shown in FIG. 25, the seed layer 14 has been formed under the aforementioned antiferromagnetic layer 30, and improvements of reliability in current-carrying represented by an improvement of electromigration resistance and rate of resistance change have been expected.

Hitherto, it was considered important that the crystal structure of the aforementioned seed layer 14 was a face-centered cubic structure (fcc structure).

When the aforementioned seed layer 14 had the face-centered cubic structure, each layer formed thereon was able to properly bring about {111} orientation, and the crystal particle diameter was able to increase. Consequently, scattering of conduction electrons at the grain boundaries was reduced, the electrical conductivity was improved and, in addition, an exchange coupling magnetic field which was generated at the interface between the fixed magnetic layer 30 and antiferromagnetic layer 31 was increased, and improvements of he reliability in current-carrying and the like were expected.

Hitherto, the aforementioned seed layer 14 was formed from a NiFeCr alloy, at that time, the compositional ratio of the aforementioned Cr was set at 40 at % or less and, thereby, the crystal structure of the aforementioned seed layer 14 was maintained to be a face-centered cubic structure.

However, accompanying the future increase in recording density, since the spin valve type thin film element is further miniaturized, the density of the sense current, which passes through the aforementioned spin valve type thin film element, is increased. Therefore, generation of electromigration and the like have become problems.

Consequently, it has been required to improve properly the material to become the seed layer 14, and to develop a seed layer capable of exhibiting further excellent characteristics compared to those of the seed layer 14 formed from the NiFeCr alloy having the compositional ratio of Cr of 40 at % or less.

Herein, when the inventors of the present invention formed the aforementioned seed layer 14 from a single layer of Cr, the aforementioned exchange coupling magnetic field larger than that in the case where the aforementioned seed layer was formed from the NiFeCr alloy (Cr was 40 at %) was achieved and, therefore, an improvement of the reliability in current-carrying characteristic represented by the electromigration resistance was improved compared to those which had been attained up to that time.

On the other hand, the rate of resistance change ($\Delta R/R$) of the seed layer 14 formed from Cr tended to become smaller than that of the seed layer formed from the NiFeCr alloy having the compositional ratio of Cr of 40 at % or less. In particular, that was observed more remarkably with an increase in the film thickness of Cr. Consequently, regarding the seed layer formed from Cr, it was difficult to improve the reliability in current-carrying and the rate of resistance change simultaneously.

When the conventional NiFeCr alloy having the compositional ratio of Cr of 40 at % or less was used as the seed layer 14, waves among crystal particles were generated on the surface of the antiferromagnetic layer 30, the smoothness of the surface of the aforementioned antiferromagnetic layer 30 was degraded and, thereby, the following problems were brought about.

FIG. 26 is a partial schematic diagram of the structure of the magnetic detection element shown in FIG. 25 under magnification. As shown in FIG. 26, it is clear that waves are generated on the surface 30a among crystal particles formed on the aforementioned antiferromagnetic layer 30. These waves are also generated on the surfaces of the fixed magnetic layer 31, the non-magnetic material layer 32, and the free magnetic layer 33 formed on the aforementioned antiferromagnetic layer 30.

When these waves are generated, as shown in FIG. 27 (a schematic diagram showing the cross section of the fixed magnetic layer 31, the non-magnetic material layer 32, and the free magnetic layer 33 shown in FIG. 26 cut in the Y direction), magnetic poles are generated at the wave portions on the fixed magnetic layer 31 surface, the aforementioned magnetic poles are also generated at the wave portions of the free magnetic layer 33 which faces interposing the non-magnetic material layer 32 and, thereby, a ferromagnetic coupling magnetic field $H_{in}$ due to a magnetostatic coupling (topological coupling) between the fixed magnetic layer 31 and the free magnetic layer 33 is strengthened. Therefore, an action that tends to magnetize the free magnetic layer 33, which must be magnetized essentially in the X direction shown in the drawing, in the Y direction shown in the drawing is effected. Consequently, problems have occurred in that asymmetry of the playback waveform is increased and the like.

A mirror reflection layer formed from, for example, an oxide of Ta, may be formed on the aforementioned free magnetic layer 33. In such a case, the smoothness of the surface of the aforementioned mirror reflection layer has also been Hindered by the waves on the surface 30a of the antiferromagnetic layer 30 and, thereby, the mirror reflectivity of the aforementioned mirror reflection layer has been reduced, and it has not been possible to expect increase of the rate of resistance change due to a specular effect.

SUMMARY OF THE INVENTION

Accordingly, the present invention is to overcome the aforementioned conventional problems, and it is an object of the present invention to provide an exchange coupling film in which especially a material for a seed layer is improved properly, simultaneous improvements of the reliability in current-carrying and the rate of resistance change become possible, waves on each layer surface can be made smaller than ever, and playback characteristics can be improved, and to provide a magnetic detection element using the aforementioned exchange coupling film.

The present invention provides an exchange coupling film, in which a seed layer, an antiferromagnetic layer, and a ferromagnetic layer are laminated in that order from the bottom, the direction of magnetization of the aforementioned ferromagnetic layer is set in a specified direction due to generation of an exchange coupling magnetic field at the interface between the aforementioned antiferromagnetic layer and ferromagnetic layer, a substrate layer formed from at least one element selected from the group consisting of Ta, Hf, Nb, Zr, Ti, Mo, and W is formed under the aforementioned seed layer, the aforementioned seed layer is formed containing Cr and an element X (wherein the element X is at least one element selected from the group consisting of Fe, Ni, Co, Ti, V, Nb, Zr, Hf, Ta, Mo, W, and Y), the compositional ratio of the aforementioned Cr is 80 at % or more, and the film thickness of the aforementioned seed layer is 20 Å or more, but 130 Å or less.

In the present invention, the aforementioned seed layer is formed from a material containing Cr and an element X, and the compositional ratio of the aforementioned Cr is specified to be 80 at % or more (except the case where the compositional ratio of Cr becomes 100 at %). That is, the Cr content is larger than ever by a large degree.

When the compositional ratio of Cr in the aforementioned seed layer is specified to be 80 at % or more as described above, the wettability of the surface of the aforementioned seed layer can be improved remarkably compared to that in the conventional case where the aforementioned compositional ratio of Cr has been specified to be 40 at % or less. The wettability is improved because the surface energy is increased and, therefore, the surface becomes active.

However, even when the seed layer is formed from the material containing 80 at % or more of Cr, the improvement of the wettability is not adequate. As described later, the film thickness and film making conditions, specifically, the temperature of the substrate surface and distance between the substrate and a target during formation of the seed layer, and an Ar pressure and sputtering speed during formation of the aforementioned seed layer, are important elements.

It has been made clear that when the wettability of the seed layer surface has been improved remarkably as in the present invention, each layer, for example, the antiferromagnetic layer, to be deposited thereon has become likely to bring about laminar growth, the average crystal particle diameter in the direction parallel to the film surface has been able to increase compared to that heretofore attained, and a unidirectional exchange bias magnetic field (Hex*) has been able to further increase compared to that in the case where the aforementioned seed layer has been formed from the NiFeCr alloy containing 40 at % or less of Cr.

As shown in the experiment results described later, it has been made clear that when the seed layer has been formed from an X—Cr alloy containing Cr at a compositional ratio of 80 at % or more, the aforementioned unidirectional exchange bias magnetic field (Hex*) has been able to increase compared to that even in the aforementioned case where the seed layer has been formed from Cr.

Herein, regarding the unidirectional exchange bias magnetic field (Hex*), the magnitude of an external magnetic field when the rate of resistance change ($\Delta R/R$) becomes a value half the maximum value is, defined as the aforementioned exchange bias magnetic field (Hex*). The unidirectional exchange bias magnetic field refers to the magnitude of the magnetic fields including the exchange coupling magnetic field generated between the aforementioned ferromagnetic layer and antiferromagnetic layer and, in addition, when the aforementioned ferromagnetic layer has a laminated ferrimagnetic structure, a coupling magnetic field in the RKKY interaction generated between magnetic layers constituting the aforementioned laminated ferrimagnetic structure and the like.

Therefore, when the ferromagnetic layer in the present invention does not have the laminated ferrimagnetic structure, the aforementioned unidirectional exchange bias magnetic field primarily refers to the exchange coupling magnetic field generated between the aforementioned ferromagnetic layer and antiferromagnetic layer, and when the aforementioned ferromagnetic layer has the laminated ferrimagnetic structure, the aforementioned unidirectional exchange bias magnetic field primarily refers to the magnetic fields of combination of the aforementioned exchange coupling magnetic field and the coupling magnetic field in the RKKY interaction.

Since this unidirectional exchange bias magnetic field can be increased, the improvement of reliability in current-carrying represented by the improvement of electromigration resistance can be achieved properly, for example, the aforementioned ferromagnetic layer can be pinned properly in the predetermined direction, and magnetization of the fixed magnetic layer can be maintained in the condition of being fixed in the predetermined direction even in an atmosphere of high heat.

Next, the rate of resistance change ($\Delta R/R$) will be described. Regarding the X—Cr alloy in which the compositional ratio of Cr is specified to be 80 at % or more as in the present invention, the aforementioned rate of resistance change ($\Delta R/R$) can be increased compared to that in the case where the seed layer is formed from Cr. This is because when Cr contains the element X, the resistivity value can be increased compared to that of the single layer of Cr and, therefore, the quantity of sense current shunted into the aforementioned seed layer can be reduced.

It has been made clear from the experiment described later that when the aforementioned seed layer has been formed from the NiFeCr alloy having the compositional ratio of Cr of 80 at % or more, the aforementioned rate of resistance change ($\Delta R/R$) can be increased compared to that in the case where the aforementioned seed layer is formed from the NiFeCr alloy having the compositional ratio of Cr of 40 at % or less. This is because when the compositional ratio of Cr is specified to be 80 at % or more, the wettability of the seed layer surface has been improved remarkably, and the average crystal particle diameter in the direction parallel to the film surface of each layer formed on the aforementioned seed layer can be increased.

The ferromagnetic coupling magnetic field $H_{in}$ due to the magnetostatic coupling (topological coupling) between the free magnetic layer and the fixed magnetic layer when the aforementioned exchange coupling film is used for the magnetic detection element will be described. According to the experiments described later, when the X—Cr alloy formed to have a compositional ratio of Cr of 80 at % or more is used for the seed layer, the aforementioned ferromagnetic coupling magnetic field $H_{in}$ can be set at a value getting closer and closer to 0 (A/m) by adjusting properly the film thickness of the aforementioned seed layer. Generation of only very small ferromagnetic coupling magnetic field $H_{in}$ as described above indicates that the smoothness of the surfaces of the aforementioned fixed magnetic layer and free magnetic layer is extremely excellent. In the present invention, as described above, since only the ferromagnetic coupling magnetic field $H_{in}$ having a value getting closer and closer to 0 (A/m) is generated, the magnetization of the aforementioned free magnetic layer becomes in the condition of being arranged properly in the direction of the track width when no external magnetic field is generated and, therefore, asymmetry of the playback waveform can be reduced properly compared to that heretofore attained.

In the present invention, the substrate layer formed from Ta, etc., is formed under the aforementioned seed layer, and at this time, the film thickness of the aforementioned seed layer is specified to be 20 Å or more, but 130 Å or less.

Since the surface of the aforementioned substrate layer formed from Ta, etc., has relatively excellent wettability, the seed layer made of X—Cr can be formed over the aforementioned substrate layer in a further dense condition and, therefore, the wettability of the aforementioned seed layer surface can be improved properly.

According to the experiment results described later, by specifying the film thickness of the aforementioned seed layer to be 20 Å or more, a rate of resistance change ($\Delta R/R$) of about 10% or more can be achieved, a unidirectional exchange bias magnetic field (Hex*) of $15.8 \times 10^4$ (A/m) or more can be achieved, and a ferromagnetic coupling magnetic field $H_{in}$ can be set at a value getting closer and closer to 0 (A/m). In particular, it is known from the experiments described later that the aforementioned ferromagnetic coupling magnetic field $H_{in}$, which is generated slightly, takes a negative value. By the action of the ferromagnetic coupling magnetic field $H_{in}$ having a negative value, magnetization of the free magnetic layer and that of the fixed magnetic layer tend to become antiparallel. In such a condition, the smoothness of the surfaces of the aforementioned free magnetic layer and fixed magnetic layer are further enhanced compared to those in the case where the aforementioned ferromagnetic coupling magnetic field $H_{in}$ which is generated slightly, takes a positive value (magnetization of the fixed magnetic layer and that of the free magnetic layer tend to be in the same direction).

According to the experiment results described later, it can be assumed that when the film thickness of the aforementioned seed layer is 130 Å or less, a rate of resistance change ($\Delta R/R$) of about 10% or more can be achieved, a unidirectional exchange bias magnetic field (Hex*) of $15.8 \times 10^4$ (A/m) or more can be achieved, and a ferromagnetic coupling magnetic field $H_{in}$ can be set at a value getting closer and closer to 0 (A/m).

As described above, according to the exchange coupling film in the present invention, the wettability of the aforementioned seed layer can be improved remarkably compared to that heretofore attained, the smoothness of the surface of each layer formed on the aforementioned seed layer can be improved and, therefore, the unidirectional exchange bias magnetic field (Hex*) of the ferromagnetic layer can be increased compared to that heretofore attained, and the reliability in current-carrying can be improved compared to those heretofore attained even in the future increase in recording density. In addition, the rate of resistance change ($\Delta R/R$) can be increased compared to that heretofore attained. Furthermore, the asymmetry can be reduced and the stability of the playback waveform can be achieved properly.

In the present invention, when the aforementioned substrate layer is not formed under the aforementioned seed layer, the film thickness of the aforementioned seed layer is preferably 30 Å or more, but 130 Å or less.

Since the surface itself of the aforementioned substrate layer has excellent wettability as described above, when the aforementioned substrate layer is placed, the seed layer to be deposited thereon is likely to form as a dense film and, therefore, if the aforementioned seed layer is formed to have a reduced film thickness, specifically, the film thickness is reduced to 20 Å, the aforementioned predetermined unidirectional exchange bias magnetic field (Hex*), etc., can be achieved.

On the other hand, when no substrate layer is placed under the aforementioned seed layer, unless the aforementioned seed layer is formed to have the film thickness larger than that in the case where the aforementioned substrate layer is placed, the wettability of the aforementioned seed layer surface cannot be improved properly and, therefore, the unidirectional exchange bias magnetic field (Hex*) having a predetermined magnitude, etc., cannot be achieved. According to the experiment results described later, it is known that when the film thickness of the aforementioned seed layer is specified to be 30 Å or more, a rate of resistance change ($\Delta R/R$) of about 10% or more can be achieved, a unidirectional exchange bias magnetic field (Hex*) of $15.8 \times 10^4$ (A/m) or more can be achieved, and a ferromagnetic coupling magnetic field $H_{in}$ can be set at a value getting closer and closer to 0 (A/m).

According to the experiment results described later, it can be assumed that when the film thickness of the aforementioned seed layer is 130 Å or less, a rate of resistance change ($\Delta R/R$) of about 10% or more can be achieved, a unidirectional exchange bias magnetic field (Hex*) of $15.8 \times 10^4$ (A/m) or more can be achieved, and a ferromagnetic coupling magnetic field $H_{in}$ can be set at a value getting closer and closer to 0 (A/m).

In the present invention, the film thickness of the aforementioned seed layer is preferably 60 Å or less. According to this, a rate of resistance change (ΔR/R) of about 10% or more can be achieved with reliability, a unidirectional exchange bias magnetic field (Hex*) of $15.8 \times 10^4$ (A/m) or more can be achieved, and a ferromagnetic coupling magnetic field $H_{in}$ can be set at a value getting closer and closer to 0 (A/m).

In the present invention, the aforementioned compositional ratio of Cr is preferably 90 at % or more. According to this, a rate of resistance change (ΔR/R) of about 10% or more can be achieved with reliability, a unidirectional exchange bias magnetic field (Hex*) of $15.8 \times 10^4$ (A/m) or more can be achieved, and a ferromagnetic coupling magnetic field $H_{in}$ can be set at a value getting closer and closer to 0 (A/m).

In the present invention, the aforementioned element X is preferably at least one selected from the group consisting of Ni, Fe, and Co.

Specifically, in the present invention, the aforementioned seed layer is preferably formed from a NiFeCr alloy. In this case, the atomic ratio X of $Ni_{1-X}$ and $Fe_X$ is preferably $0 \leq X \leq 0.7$, more preferably, is $0 \leq X \leq 0.5$, and further preferably, is $0 \leq X \leq 0.3$.

In the present invention, the aforementioned seed layer may be formed from a FeCr alloy.

In the present invention, the average crystal particle diameter in the direction parallel to the film surface of each layer formed on the aforementioned seed layer is preferably 200 Å or more and, more preferably, is 210 Å or more. According to this, the rate of resistance change (ΔR/R) and the unidirectional exchange bias magnetic field (Hex*) can be improved properly.

In the present invention, when the aforementioned ferromagnetic layer is formed including a mirror reflection layer as well, since the smoothness of the aforementioned mirror reflection layer surface is improved, the mirror reflectivity of the aforementioned mirror reflection layer can be improved and, therefore, the rate of resistance change (ΔR/R) can be further improved due to a specular effect.

In the present invention, preferably, when the aforementioned exchange coupling film is cut parallel to the direction of the film thickness, grain boundaries formed in the aforementioned antiferromagnetic layer and grain boundaries formed in the ferromagnetic layer, which are observed on the cut surface, are discontinuous in at least a part of the interface between the aforementioned antiferromagnetic layer and the ferromagnetic layer.

In the present invention, preferably, when the aforementioned exchange coupling film is cut parallel to the direction of the film thickness, grain boundaries formed in the aforementioned antiferromagnetic layer and grain boundaries formed in the seed layer, which are observed on the cut surface, are discontinuous in at least a part of the interface between the aforementioned antiferromagnetic layer and the seed layer.

The aforementioned condition indicates that the antiferromagnetic layer has been modified properly from the disordered lattice (face-centered cubic lattice) to the ordered lattice (face-centered tetragonal lattice) by the heat treatment and, therefore, the exchange coupling magnetic field generated between the aforementioned antiferromagnetic layer and the ferromagnetic layer can be increased.

In the present invention, preferably, twin crystals are formed in at least a part of the aforementioned antiferromagnetic layer, and twin boundaries are formed not parallel to the interface to the aforementioned seed layer in at least a part of the aforementioned twin crystals.

In the present invention, when the aforementioned twin boundaries appear after the aforementioned exchange coupling film is formed and the heat treatment is performed, it is believed that atoms in the aforementioned antiferromagnetic layer are not in the condition of being restrained by the crystal structure of the ferromagnetic layer in the stage of the film making. When the restraint force at the interface is weakened as described above, the aforementioned antiferromagnetic layer becomes likely to modify from the disordered lattice (face-centered cubic lattice) to the ordered lattice (face-centered tetraqonal lattice) by the heat treatment. However, since lattice strain is generated during this modification, unless this lattice strain can be relaxed properly, the aforementioned modification cannot be brought about effectively. It is believed that rearrangement of atoms in the antiferromagnetic layer from the disordered lattice to the ordered lattice occurs during the modification, and the lattice strain generated at this time is relaxed by change of the atomic arrangement into mirror plane symmetry at short distance intervals. After the heat treatment, the boundaries of the aforementioned mirror plane symmetry change become twin boundaries and, therefore, the formation of such twin boundaries indicates, that is to say, occurrence of modification for ordering during application of the heat treatment.

Herein, in the neighborhood of the interface of the antiferromagnetic layer and the ferromagnetic layer, the aforementioned twin boundaries are formed in the direction intersecting the aforementioned interface in order to relax lattice strain generated during rearrangement of atoms in the direction parallel to the aforementioned interface. Consequently, when overall proper modification for ordering occurs, the aforementioned twin boundaries are formed not parallel to the aforementioned interface. That is, when the twin boundaries are formed not parallel to the interface as in the present invention, very large exchange coupling magnetic field can be achieved.

Each of the discontinuity of the grain boundaries and non-parallel property of the twin boundaries described above is due to the improvement of the wettability of the seed layer surface. However, in addition to this, the compositional ratio of the aforementioned antiferromagnetic layer, etc., must be adjusted properly as well.

In the present invention, the aforementioned antiferromagnetic layer is formed from an antiferromagnetic material containing an element X (wherein X is at least one element selected from the group consisting of Pt, Pd, Ir, Rh, Ru, and Os) and Mn.

In the present invention, alternatively, the aforementioned antiferromagnetic layer may be formed from an X—Mn—X' alloy (wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements).

Regarding the aforementioned case, in the present invention, preferably, the aforementioned X—Mn—X' alloy is an interstitial solid solution in which the element X' has penetrated into a gap of the space lattice composed of the element X and Mn, or is a substitutional solid solution in which the element X' has substituted for a part of lattice points of the crystal lattice composed of the element X and Mn.

In the present invention, the compositional ratio of the aforementioned element X or elements X+X' is preferably 45 (at %) or more, but 60 (at %) or less.

The present invention provides a magnetic detection element, in which a seed layer, an antiferromagnetic layer, a fixed magnetic layer, a non-magnetic material layer, and a free magnetic layer are laminated in that order from the bottom, magnetization of the aforementioned free magnetic layer is arranged in the direction intersecting magnetization of the aforementioned fixed magnetic layer, and the seed layer, the antiferromagnetic layer, and the fixed magnetic layer are formed from the exchange coupling film described above.

The present invention provides a magnetic detection element, in which a seed layer, an antiferromagnetic exchange bias layer, a free magnetic layer, a non-magnetic material layer, a fixed magnetic layer, and an antiferromagnetic layer are laminated in that order from the bottom, magnetization of the aforementioned free magnetic layer is arranged in the direction intersecting magnetization of the aforementioned fixed magnetic layer, and the seed layer, the exchange bias layer, and the free magnetic layer are formed from the exchange coupling film described above.

The present invention provides a magnetic detection element, in which non-magnetic material layers laminated on and under the free magnetic layer, fixed magnetic layers located on one of the aforementioned non-magnetic material layers and under the other non-magnetic material layer, and antiferromagnetic layers located on one of the aforementioned fixed magnetic layers and under the other fixed magnetic layer are included, a seed layer is formed under the antiferromagnetic layer formed on the side lower than the aforementioned free magnetic layer, magnetization of the aforementioned free magnetic layer is arranged in the direction intersecting magnetization of the aforementioned fixed magnetic layer, and the aforementioned seed layer, the antiferromagnetic layer joined thereon, and the fixed magnetic layer are formed from the exchange coupling film described above.

The present invention provides a magnetic detection element, in which a seed layer, an antiferromagnetic exchange bias layer, a magnetoresistive layer, a non-magnetic layer, and a soft magnetic layer are laminated in that order from the bottom, and the aforementioned seed layer, the exchange bias layer, and the magnetoresistive layer are formed from the exchange coupling film described above.

When the exchange coupling film is used for each magnetic detection element as described above, the wettability of the aforementioned seed layer surface can be improved remarkably compared to that heretofore attained and, therefore, both the unidirectional exchange bias magnetic field (Hex*) and the rate of resistance change (ΔR/R) in the fixed magnetic layer can be improved compared to those in the conventional case where the NiFeCr alloy or Cr, in which the compositional ratio of Cr has been 40 at % or less, have been used as the seed layer, and the smoothness of the surface of each layer formed on the seed layer can be improved.

By the improvement of the aforementioned smoothness, the ferromagnetic coupling magnetic field $H_{in}$ due to the magnetostatic coupling (topological coupling) between the free magnetic layer and the fixed magnetic layer can be reduced and, therefore, playback characteristics can be improved, for example, asymmetry of the playback waveform can be reduced.

In the present invention, preferably, a mirror reflection layer is further formed on the aforementioned magnetic detection element. Even in such a case, since the smoothness of the aforementioned mirror reflection layer surface can be improved, the mirror reflectivity of the aforementioned mirror reflection layer can be improved and, therefore, the improvement of the rate of resistance change due to a specular effect can be effected.

BRIEF DESCRIPTION OF THE DRAWINGS

FIG. 10 shows a transmission electron micrograph and electron diffraction patterns of a magnetic detection element in the case where a seed layer (Example 3) made of $(Ni_{0.8}Fe_{0.2})_{10at\%}Cr_{90at\%}$ of 30 Å is formed on a Ta film.

DESCRIPTION OF THE PREFERRED EMBODIMENTS

Figure 1:
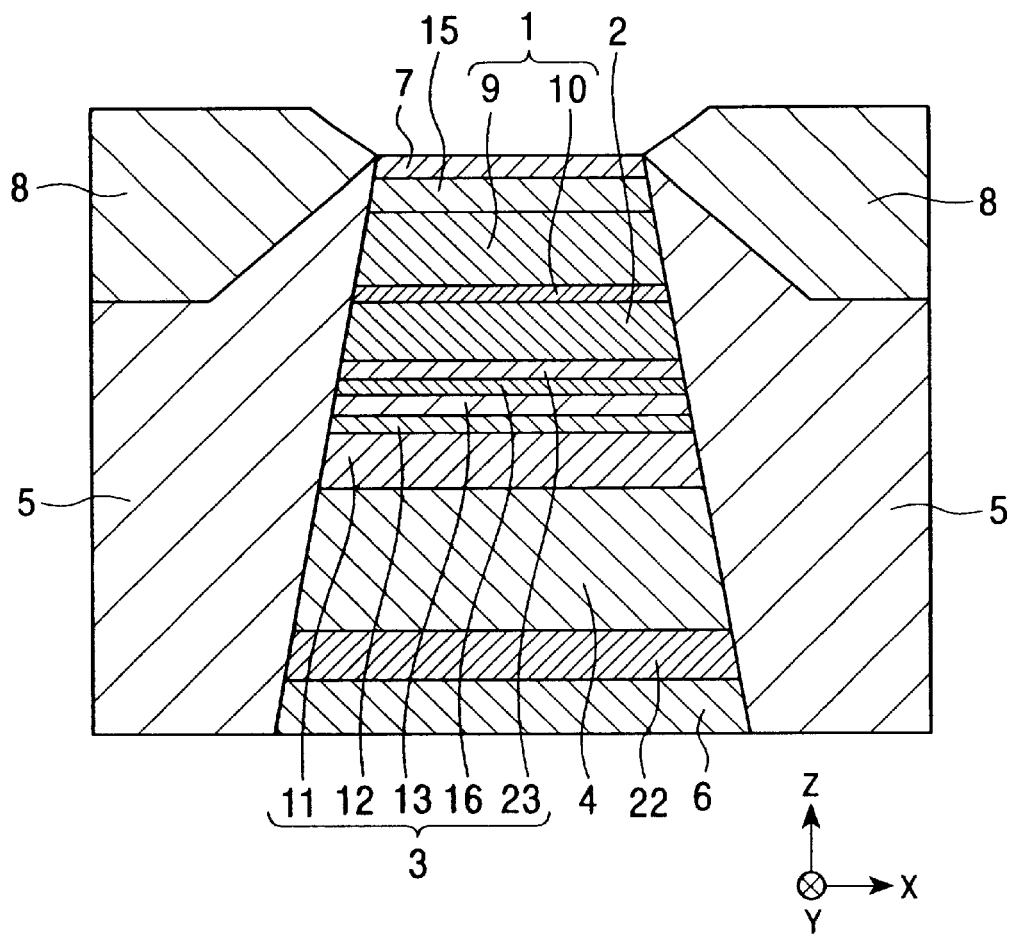
FIG. 1 is a sectional view of the structure of a magnetic detection element (single spin valve type magnetoresistance effect element) according to a first embodiment of the present invention viewed from the surface facing a recording medium side.

FIG. 1 is a sectional view of the whole structure of a magnetic detection element (single spin valve type magnetoresistance effect element) according to a first embodiment of the present invention viewed from the surface facing a recording medium side. FIG. 1 is a cutaway view showing only the center portion of the element extending in the X direction.

This single spin valve type magnetoresistance effect element is placed on an end portion on the trailing side, etc., of a floating slider placed on the hard disk device so as to detect the recording magnetic field of the hard disk, etc. The movement direction of the magnetic recording medium, for example, hard disk, is the Z direction, and the direction of the leakage magnetic field from the magnetic recording medium is the Y direction.

In FIG. 1, a substrate layer 6 formed from a non-magnetic material, for example, at least one element selected from the group consisting of Ta, Hf, Nb, Zr, Ti, Mo, and W, is formed at the bottom. On this substrate layer 6, a seed layer 22, an antiferromagnetic layer 4, a fixed magnetic layer 3, a non-magnetic material layer 2, and a free magnetic layer 1 are laminated.

The antiferromagnetic layer 4 formed on the aforementioned seed layer 22 is preferably formed from an antiferromagnetic material containing an element X (wherein X is at least one element selected from the group consisting of Pt, Pd, Ir, Rh, Ru, and Os) and Mn.

The X—Mn alloys using these platinum group elements have superior characteristics, for example, excellent corrosion resistance, a high blocking temperature, and a capability of increasing an exchange coupling magnetic field (Hex*), as an antiferromagnetic material. In particular, among the platinum group elements, Pt is used preferably. For example, a PtMn alloy formed from a binary system can be used.

In the present invention, the aforementioned antiferromagnetic layer 4 may be formed from an antiferromagnetic material containing an element X, an element X' (wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn.

As the aforementioned element X', an element which penetrates into a gap of the space lattice composed of the element X and Mn or which substitutes for a part of lattice points of the crystal lattice composed of the element X and Mn is used preferably. Herein, a solid solution refers to a solid in which components are homogeneously mixed with each other over a wide range.

When an interstitial solid solution or substitutional solid solution is produced, the lattice constant of the aforementioned X—Mn—X' alloy can be increased compared to the lattice constant of the aforementioned X—Mn alloy film. According to this, difference between the lattice constant of the antiferromagnetic layer 4 and the lattice constant of the fixed magnetic layer 3 can be increased and, therefore, the interface structure between the antiferromagnetic layer 4 and the fixed magnetic layer 3 can become easily in an incommensurate condition. Herein, the incommensurate condition refers to the condition that atoms constituting the aforementioned antiferromagnetic layer 4 and atoms constituting the aforementioned fixed magnetic layer 3 are not in a one-to-one correspondence at the aforementioned interface between the antiferromagnetic layer 4 and the fixed magnetic layer 3.

In particular, in the case where the element X' which brings about a substitutional solid-solution is used, when the compositional ratio of the aforementioned element X' becomes excessively large, characteristics as antiferromagnetism are degraded and, therefore, an exchange coupling magnetic field generated at the interface to the fixed magnetic layer 3 is reduced. In the present invention, it is especially preferable to use an inert rare gas element (at least one selected from the group consisting of Ne, Ar, Kr, Xe) which brings about an interstitial solid solution as the element X'. Since the rare gas element is an inert gas, even when the rare gas is contained in a film, the antiferromagnetism is not affected by a large degree. Furthermore, Ar, etc., are gases conventionally introduced in sputtering devices as sputtering gases, and Ar can be easily penetrated into a film only by adjusting properly a gas pressure.

When gaseous elements are used as the-element X', although it is difficult that large amounts of element X' are contained in the film, in the case of the rare gases, by penetration of very small amounts thereof into the film, the exchange coupling magnetic field generated due to a heat treatment can be increased remarkably.

In the present invention, the compositional range of the aforementioned element X' is preferably 0.2 to 10 on an at % (atomic percent) basis, and more preferably, is 0.5 to 5 on an at % basis. In the present invention, the aforementioned element X is preferably Pt and, therefore, it is preferable to use a Pt—Mn—X' alloy.

In the present invention, the atomic percent of the element X or elements X+X' of the antiferromagnetic layer 4 is preferably set at 45 (at %) or more, but 60 (at %) or less, and more preferably is 49 (at %) or more, but 56.5 (at %) or less. It is assumed that according to this, in the stage of film making, the interface to the fixed magnetic layer 3 is made to be in an incommensurate condition and, furthermore, the aforementioned antiferromagnetic layer 4 brings about proper modification for ordering by the heat treatment.

The fixed magnetic layer 3 formed on the aforementioned antiferromagnetic layer 4 has a five-layer structure.

The aforementioned fixed magnetic layer 3 is formed from a magnetic layer 11, a non-magnetic intermediate layer 12, a magnetic layer 13, a mirror reflection layer 16, and a magnetic layer 23. The magnetization direction of the aforementioned magnetic layer 11 and the magnetization direction of the magnetic layer 13 and magnetic layer 23 are made in the condition of being antiparallel to each other (the magnetic layers 13 and 23 are parallel) by the exchange coupling magnetic field at the interface to the aforementioned antiferromagnetic layer 4 and the antiferromagnetic exchange coupling magnetic field (RKKY interaction) interposing the non-magnetic intermediate layer 12. This is called as an artificial ferrimagnetic coupling condition, and according to this configuration, magnetization of the fixed magnetic layer 3 can become in a stable condition, and the exchange coupling magnetic field generated at the interface between the aforementioned fixed magnetic layer 3 and antiferromagnetic layer 4 can be increased apparently.

In the present embodiment, the mirror reflection layer 16 is formed between the aforementioned magnetic layer 13 and magnetic layer 23. By placing the aforementioned mirror reflection layer 16, when a sense current is passed, spin up conduction electrons among conduction electrons transferring through the non-magnetic material layer 2 can be mirror-reflected at the boundary between the aforementioned mirror reflection layer 16 and the magnetic layer 23 while the direction of the spin is maintained and, thereby, the mean free path of the aforementioned spin up conduction electrons is increased. Consequently, difference of the mean free paths between the aforementioned spin up conduction electrons and the spin down conduction electrons is increased and, therefore, the rate of resistance change ($\Delta R/R$) can be increased.

Regarding the aforementioned mirror reflection layer 16, after the aforementioned magnetic layer 13 is formed, the surface of the aforementioned magnetic layer 13 is oxidized, and this oxidized part can function as the mirror reflection layer 16. For example, the aforementioned magnetic layer 13 is formed from a CoFe alloy, and the surface thereof is oxidized. According to this, the mirror reflection layer 16 made of Co—Fe—O can be formed on the aforementioned magnetic layer 13 surface. In the present invention, preferably, the aforementioned magnetic layers 11 and 23 are also formed from the CoFe alloy. Furthermore, the magnetic layers 11, 13, and 23 may be formed from a magnetic material, for example, a NiFe alloy, CoFeNi alloy, and Co.

In addition, as another mode, the mirror reflection layer made of FeMO (element M is at least one selected from the group consisting of Mn, Co, Ni, Ba, Sr, Y, Gd, Cu, and Zn), etc., is formed by sputtering film making on the magnetic layer 13 or on the non-magnetic intermediate layer 12 without formation of the aforementioned magnetic layer 13, and the magnetic layer 23 is formed thereon.

As described above, in the present invention, preferably, the aforementioned fixed magnetic layer 3 is formed including the mirror reflection layer.

However, the mirror reflection layer may not be included in the aforementioned fixed magnetic layer 3. In the mode shown in FIG. 1, although the aforementioned fixed magnetic layer 3 has the laminated ferrimagnetic structure, this may be formed from a single layer of a magnetic material layer or a multilayer structure of a magnetic material layer.

The aforementioned magnetic layer 11 is formed at, for example, on the order of 12 to 20 Å, the non-magnetic intermediate layer 12 is formed at on the order of 8 Å, and the magnetic layers 11 and 13 are formed at on the order of 5 to 20 Å.

The non-magnetic intermediate layer 12 is formed from a non-magnetic conductive material, for example, Ru, Rh, Ir, Cr, Re, and Cu.

The non-magnetic material layer 2 formed on the aforementioned fixed magnetic layer 3 is formed from, for example, Cu. In the case where the magnetic detection element according to the present invention is a tunneling magnetoresistance effect element (TMR element) using the principal of the tunnel effect, the aforementioned non-magnetic material layer 2 is formed from an insulating material, for example, $Al_2O_3$.

Furthermore, the free magnetic layer 1 formed from a two-layer film is formed on the aforementioned non-magnetic material layer 2.

The aforementioned free magnetic layer 1 is formed from, for example, two layers of a NiFe alloy film 9 and a CoFe film 10. When the aforementioned CoFe film 10 is formed on the side in contact with the non-magnetic material layer 2 as shown in FIG. 1, diffusion of metal elements, etc., at the interface to the aforementioned non-magnetic material layer 2 can be prevented and, therefore, the rate of resistance change ($\Delta R/R$) can be increased.

The aforementioned NiFe alloy film 9 is formed while, for example, the aforementioned Ni is 80 (at %), and Fe is 20 (at %). The CoFe alloy 10 is formed while, for example, the aforementioned Co is 90 (at %), and Fe is 10 (at %). The aforementioned NiFe alloy film 9 is formed to have a film thickness on the order of 45 Å, and the CoFe film is formed to have a film thickness on the order of 5 Å. Furthermore, Co, a CoFeNi alloy, etc., may be used instead of the aforementioned CoFe film 10. The aforementioned free magnetic layer 1 may be formed from a single layer or a multilayer structure of a magnetic material. In such a case, preferably, the aforementioned free magnetic layer 1 is formed from a single layer structure of the CoFeNi alloy. The aforementioned free magnetic layer 1 may has the same laminated ferrimagnetic structure as the fixed magnetic layer 3.

On the aforementioned free magnetic layer 1, a backed layer 15 made of Cu, Au, or Ag, which is a metal material or non-magnetic metal, is formed. The aforementioned backed layer is formed to have the film thickness of 20 Å or less.

A protection layer 7 is formed on the aforementioned backed layer 15. Preferably, the aforementioned protection layer 7 is a mirror reflection layer made of an oxide of Ta, etc.

By formation of the aforementioned backed layer 15, the mean free path of the spin up conduction electrons, which contributes to magnetoresistance effect, is increased. Consequently, a large rate of resistance change (ΔR/R) can be achieved due to a so-called spin filter effect in the spin valve type magnetic element and, therefore, it becomes possible to respond to an increase in recording density. However, the aforementioned backed layer 15 may not be formed.

By placement of the mirror reflection layer 7 on the aforementioned backed layer 15, the aforementioned spin up conduction electrons are mirror-reflected at the aforementioned mirror reflection layer 7 portion and, therefore, the mean free path of the aforementioned conduction electrons can be increased, and the rate of resistance change (ΔR/R) can be further improved.

As the mirror reflection layer 7, oxides, for example, Fe—O ($\alpha$-$Fe_2O_3$, FeO, $Fe_3O_4$, etc.), Ni—O, Co—O, Co—Fe—O, Co—Fe—Ni—O, Al—O, Al-Q-O (wherein Q is at least one selected from the group consisting of B, Si, N, Ti, V, Cr, Mn, Fe, Co, and Ni), and R—O (wherein R is at least one selected from the group consisting of Ti, V, Cr, Zr, Nb, Mo, Hf, and W), nitrides, for example, Al—N, Al-Q-N (wherein Q is at least one selected from the group consisting of B, Si, O, Ti, V, Cr, Mn, Fe, Co, and Ni), and R—N (wherein R is at least one selected from the group consisting of Ti, V, Cr, Zr, Nb, Mo, Hf, Ta, and W), metalloid Heusler alloys, for example, NiMnSb and PtMnSb, and the like other than the oxide of Ta can be selected. These materials can be applied to the mirror reflection layer 16 formed on the fixed magnetic layer 3.

In the embodiment shown in FIG. 1, hard bias layers 5 and electrode layers 8 are formed on both sides of the laminated films from the aforementioned substrate layer 6 to protection layer (mirror reflection layer) 7. Magnetization of the free magnetic layer 1 is arranged in the direction of the track width (the X direction in the drawing) by a vertical bias magnetic field from the aforementioned hard bias layers 5.

The aforementioned hard bias layers 5 and 5 are formed from, for example, a Co—Pt (cobalt-platinum) alloy and a Co—Cr—Pt (cobalt-chromium-platinum) alloy, and the electrode layers 8 and 8 are formed from α-Ta, Au, Cr, Cu (copper), Rh, Ir, Ru, W (tungsten), etc. In the case of the aforementioned tunneling magnetoresistance effect element or CPP type magnetic detection element, the aforementioned electrode layers 8 and 8 are formed on the free magnetic layer 1 and under the antiferromagnetic layer 4, respectively.

Regarding the spin valve type thin film element shown in FIG. 1, after lamination from the substrate layer 6 to protection layer 7, a heat treatment is performed and, thereby, an exchange coupling magnetic field is generated at the interface between the aforementioned antiferromagnetic layer 4 and the fixed magnetic layer 3. At this time, by aiming the magnetization in the direction parallel to the Y direction in the drawing, the magnetization of the aforementioned fixed magnetic layer 3 is aimed in the direction parallel to the Y direction in the drawing, and is fixed. In the embodiment shown in FIG. 1, since the aforementioned fixed magnetic layer 3 has a laminated ferrimagnetic structure, when the magnetic layer 11 is magnetized in the Y direction in the drawing, the magnetic layer 13 and the magnetic layer 23 are magnetized in the direction opposite to the Y direction in the drawing.

In the embodiment shown in FIG. 1, the seed layer 22 is formed under the aforementioned antiferromagnetic layer 4.

In the present invention, the aforementioned seed layer 22 is formed including Cr and an element X (wherein the element X is at least one selected from the group consisting of Fe, Ni, Co, Ti, V, Nb, Zr, Hf, Ta, Mo, W, and Y), and the compositional ratio of the aforementioned Cr is 80 at % or more. In the present invention, the aforementioned seed layer 22 inevitably contains an element X even though at very small amounts and, therefore, the compositional ratio of Cr does not become 100 at % (that is, it does not become a single layer of Cr).

Furthermore, in the present invention, the aforementioned seed layer 22 is formed to have a film thickness within the range of 20 Å or more, but 130 Å or less.

In the present invention, since the aforementioned seed layer 22 contains very high concentration of Cr at a compositional ratio of Cr of 80 at % or more, the wettability of the aforementioned seed layer 22 surface can be improved remarkably.

When the aforementioned wettability is improved, in sputtering film making of the antiferromagnetic layer 4 on the aforementioned seed layer 22, atoms constituting the aforementioned antiferromagnetic layer 4 become unlikely to coagulate on the aforementioned seed layer 22 and, therefore, the aforementioned antiferromagnetic layer 4 can properly bring about laminar growth.

In the present invention, by the improvement of the wettability of the aforementioned seed layer 22 surface, the average crystal particle diameter in the direction parallel to the film surface of each layer formed on the aforementioned seed layer 22 can be increased compared to that heretofore attained. According to the present invention, the aforementioned average crystal particle diameter can be made 200 Å or more. In the present invention, more preferably, the aforementioned average crystal particle diameter is made 210 Å or more.

According to the experiments described later, by making the film thickness of the seed layer 22 formed from an X—Cr alloy 20 Å or more, a rate of resistance change of about 10% or more can be achieved, and a unidirectional exchange bias magnetic field (Hex*) of $15.8 \times 10^4$ (A/m) or more can be achieved. It can be assumed that when the aforementioned film thickness is 130 Å or less, a rate of resistance change of about 10% or more can be achieved, and a unidirectional exchange bias magnetic field (Hex*) of $15.8 \times 10^4$ (A/m) or more can be achieved.

Herein, regarding the unidirectional exchange bias magnetic field (Hex*), the magnitude of an external magnetic field when the rate of resistance change (ΔR/R) becomes a value half the maximum value is defined as the aforementioned exchange bias magnetic field (Hex*).

The unidirectional exchange bias magnetic field (Hex*) refers to the magnetic fields including the exchange coupling magnetic field generated between the aforementioned fixed magnetic layer 3 and antiferromagnetic layer 4 and, in addition to this, a coupling magnetic field in the RKKY interaction generated, for example, among CoFe alloys constituting the aforementioned fixed magnetic layer 3, and the like because the aforementioned fixed magnetic layer 3 has a laminated ferrimagnetic structure.

Therefore, when the aforementioned fixed magnetic layer 3 does not have the laminated ferrimagnetic structure, the aforementioned unidirectional exchange bias magnetic field (Hex*) primarily refers to the exchange coupling magnetic field generated between the aforementioned fixed magnetic layer 3 and antiferromagnetic layer 4 and, on the other hand, when the aforementioned fixed magnetic layer 3 has the laminated ferrimagnetic structure shown in FIG. 1, the aforementioned unidirectional exchange bias magnetic field (Hex*) primarily refers to the magnetic fields of combination of the aforementioned exchange coupling magnetic field and the coupling magnetic field in the RKKY interaction.

When this unidirectional exchange bias magnetic field becomes large, the aforementioned fixed magnetic layer 3 can be properly pinned in the predetermined direction properly, the magnetization of the fixed magnetic layer 3 can be maintained in the condition of being fixed strongly in the predetermined direction even in an atmosphere of high temperature, occurrence of electromigration is inhibited and, therefore, the improvement of so-called reliability in current-carrying can be achieved properly.

Furthermore, in the present invention, the smoothness of the surface of each layer formed on the seed layer 22 formed from the aforementioned X—Cr alloy can be improved properly and, according to the experiment described later, the ferromagnetic coupling magnetic field (interlayer coupling magnetic field) $H_{in}$ due to the magnetostatic coupling (topological coupling) between the fixed magnetic layer 3 and the free magnetic layer 1 with the non-magnetic material layer 2 therebetween can be set at a value getting closer and closer to 0 (A/m).

When the mirror reflection layers 16 and 7 are placed as shown in FIG. 1, since the smoothness of the surface of each layer formed on the seed layer 22 can be improved, the smoothness of the surfaces of the aforementioned mirror reflection layers 16 and 7 themselves can be improved. Consequently, the mirror reflectivities of the aforementioned mirror reflection layers 16 and 7 can be improved and, therefore, the improvement of the rate of resistance change ($\Delta R/R$) by placement of the aforementioned mirror reflection layers 16 and 7 can be achieved properly.

Herein, comparisons will be made between the NiFeCr alloy, which has been conventionally used as the seed layer and in which the compositional ratio of Cr is 40 at % or less, and the X—Cr alloy according to the present invention from the viewpoint of the aforementioned characteristics.

Regarding the unidirectional exchange bias magnetic field (Hex*), when comparisons were made between the case where a $(Ni_{0.8}Fe_{0.2})_{77at\ \%}Cr_{23at\ \%}$ alloy of 20 Å was used as the aforementioned seed layer (Conventional example) and the case where the $(Ni_{0.8}Fe_{0.2})_{10at\ \%}Cr_{90at\ \%}$ alloy having the same film thickness of 20 Å as the aforementioned Conventional example was used as the aforementioned seed layer (Example), it was made clear that the case where the $(Ni_{0.8}Fe_{0.2})_{10at\ \%}Cr_{90at\ \%}$ alloy was used as the seed layer 22 was able to achieve a high unidirectional exchange bias magnetic field (Hex*) compared to that in the case where the $(Ni_{0.8}Fe_{0.2})_{77at\ \%}Cr_{23at\ \%}$ alloy was used.

This is believed because the seed layer 22 in the Example was able to improve the wettability of the seed layer surface remarkably compared to that in the Conventional example.

Regarding the rate of resistance change ($\Delta R/R$), although the Conventional example was able to achieve a high rate of resistance change ($\Delta R/R$) on the order of 10% similarly to that in the Example, the Example was able to achieve a further high rate of resistance change (about 13%).

This is believed because the Example was able to increase the average crystal particle diameter in the direction parallel to the film surface of each layer formed on the aforementioned seed layer 22 due to a remarkable improvement of the wettability of the seed layer 22 surface compared to that in the Conventional example.

Regarding the ferromagnetic coupling magnetic field $H_{in}$ acting between the fixed magnetic layer 3 and the free magnetic layer 1, in the Conventional example, a very high ferromagnetic coupling magnetic field $H_{in}$ was generated. This is because waves on the surface of each layer formed on the aforementioned seed layer 22 are remarkable and, therefore, the smoothness is degraded by a large degree.

On the other hand, in the Example, the ferromagnetic coupling magnetic field $H_{in}$ was able to set at a value close to 0 (A/m) and, in particular, it was verified that the value thereof was a negative value. When the ferromagnetic coupling magnetic field $H_{in}$ takes a positive value, a coupling force, which tends to aim the same direction as the magnetization direction of the aforementioned fixed magnetic layer 3, is effected from the aforementioned fixed magnetic layer 3 to the free magnetic layer 1. However, when the aforementioned ferromagnetic coupling magnetic field $H_{in}$ takes a negative value, a coupling force, which tends to aim the direction antiparallel to the magnetization direction of the fixed magnetic layer 3, is effected from the aforementioned fixed magnetic layer 3 to the free magnetic layer 1.

As described above, when the aforementioned ferromagnetic coupling magnetic field $H_{in}$ gets closer and closer to 0 (A/m) and takes a negative value, a coupling force, which tends to aim the magnetization of the free magnetic layer 1 in the direction antiparallel to the magnetization direction of the fixed magnetic layer 3, is effected from the aforementioned fixed magnetic layer 3 to the free magnetic layer 1. In such a case, the smoothness of the surfaces of the aforementioned fixed magnetic layer 3 and free magnetic layer 1 is excellent compared to that in the case where the aforementioned ferromagnetic coupling magnetic field $H_{in}$ takes a positive value and, therefore, it was made clear that in the Example, the smoothness of the surface of each layer on the seed layer 22 was very excellent.

When comparisons are made between the case where Cr of 20 Å is used for the seed layer as Comparative example and the aforementioned Example, the Example had superiority in both results of the unidirectional exchange bias magnetic field (Hex*) and the rate of resistance change ($\Delta R/R$). However, when the seed layer 22 formed from Cr of 20 Å is formed on Ta (substrate layer 6), although the unidirectional exchange bias magnetic field (Hex*) was slightly inferior to that in the Example, the result was superior to the aforementioned conventional example $(Ni_{0.8}Fe_{0.2})_{77at\ \%}Cr_{23at\ \%}$.

However, in the case of the seed layer formed from Cr, when the film thickness of the aforementioned seed layer was increased, the rate of resistance change ($\Delta R/R$) was reduced rapidly, and when the film thickness of Cr exceeded 60 Å, the rate of resistance change ($\Delta R/R$) resulted in less than 10%.

On the other hand, in the case where the X—Cr alloy is used as the seed layer 22 as in the present invention, it is believed that even when the film thickness of the aforementioned seed layer 22 is increased to 130 Å, a rate of resistance change ($\Delta R/R$) of about 10% or more can be achieved. In particular, when the aforementioned film thickness was up to on the order of 60 Å, a high rate of resistance change ($\Delta R/R$) of about 12% was able to be achieved.

This is because in the present invention, the resistivity of the aforementioned seed layer 22 is increased by addition of the element X into Cr and, therefore, the quantity of the sense current shunted from the electrode layer 8 into the aforementioned seed layer 22 is reduced compared to that in the seed layer of a single layer of Cr.

Even when Cr is used as the seed layer, the ferromagnetic coupling magnetic field $H_{in}$ acting between the fixed magnetic layer 3 and the free magnetic layer 1 can be made a value getting closer and closer to 0 (A/m). However, it was made clear that the aforementioned ferromagnetic coupling magnetic field $H_{in}$ did not take a negative value in contrast to the case of the Example. Therefore, in the case where the X—Cr alloy, in which the compositional ratio of Cr was made 80 at % or more, was used, the smoothness of the surface of each layer formed on the seed layer 22 was able to improve more properly compared to that in the case where Cr was used as the seed layer.

As described above, by using the X—Cr alloy, in which the compositional ratio of Cr was made 80 at % or more, as the seed layer 22, the average crystal particle diameter in the direction parallel to the film surface of each layer formed on the aforementioned seed layer can be increased because of a remarkable improvement of the wettability, a high unidirectional exchange bias magnetic field (Hex*) and high rate of resistance change (ΔR/R) can be achieved and, in addition, the smoothness of the surface of each layer formed on the aforementioned seed layer 22 can be improved properly, and the ferromagnetic coupling magnetic field $H_{in}$ acting between the fixed magnetic layer 3 and the free magnetic layer 1 can be set at a value getting closer and closer to 0 (A/m) compared to those in the conventional case where the NiFeCr alloy, in which the compositional ratio of Cr has been made 40 at % or less, or Cr has been used as the seed layer.

In the embodiment shown in FIG. 1, the substrate layer 6 is formed under the aforementioned seed layer 22. However, when the aforementioned substrate layer 6 is not formed, the film thickness of the seed layer formed from the X—Cr alloy having the compositional ratio of Cr of 80 at % or more is preferably 30 Å or more, but 130 Å or less.

The aforementioned substrate layer 6 surface has relatively superior wettability, the seed layer 22 formed on the aforementioned substrate layer 6 can be made into the film densely and, therefore, the wettability of the aforementioned seed layer 22 surface was able to be improved even when the film thickness of the aforementioned seed layer 22 was reduced to 20 Å.

However, when the aforementioned substrate layer 6 is not formed, the aforementioned effect cannot be achieved. In such a case, the wettability of the aforementioned seed layer 22 surface cannot be improved properly unless the aforementioned seed layer is formed to have a relatively large film thickness.

According to the experiment described later, it was made clear that when the film thickness of the aforementioned seed layer 22 was made 30 Å or more, the rate of resistance change (ΔR/R) of about 10% or more was able to be achieved, the unidirectional exchange bias magnetic field (Hex*) of $15.8 \times 10^4$ (A/m) or more was able to be achieved, and the ferromagnetic coupling magnetic field $H_{in}$ acting between the fixed magnetic layer 3 and the free magnetic layer 1 was able to be set at a value getting closer and closer to 0 (A/m).

Furthermore, it is assumed that when the film thickness of the aforementioned seed layer 22 is 130 Å or less, the rate of resistance change (ΔR/R) of about 10% or more can be achieved, the unidirectional exchange bias magnetic field (Hex*) of $15.8 \times 10^4$ (A/m) or more can be achieved, and the ferromagnetic coupling magnetic field $H_{in}$ acting between the fixed magnetic layer 3 and the free magnetic layer 1 can be set at a value getting closer and closer to 0 (A/m).

In the present invention, the film thickness of the aforementioned seed layer 22 is preferably 60 Å or less. It was made clear that according to this, the rate of resistance change (ΔR/R) of about 10% or more was able to be achieved with reliability, the unidirectional exchange bias magnetic field (Hex*) of $15.8 \times 10^4$ (A/m) or more was able to achieve, and a ferromagnetic coupling magnetic field $H_{in}$ acting between the fixed magnetic layer 3 and the free magnetic layer 1 was able to be set at a value getting closer and closer to 0 (A/m).

In the present invention, the compositional ratio of Cr of the seed layer made of the X—Cr alloy is preferably 90 at % or more. It was made clear that according to this, the rate of resistance change (ΔR/R) of about 10% or more was able to be achieved with reliability, the unidirectional exchange bias magnetic field (Hex*) of $15.8 \times 10^4$ (A/m) or more was able to be achieved, and the ferromagnetic coupling magnetic field $H_{in}$ acting between the fixed magnetic layer 3 and the free magnetic layer 1 was able to be set at a value getting closer and closer to 0 (A/m).

In the present invention, the element X is preferably at least one selected from the group consisting of Ni, Fe, and Co.

Specifically, the aforementioned seed layer 22 is preferably formed from a NiFeCr alloy (the compositional ratio of Cr is 80 at % or more). When the aforementioned seed layer 22 is formed from the NiFeCr alloy, the rate of resistance change and the unidirectional exchange bias magnetic field (Hex*) can be increased with ease and, furthermore, the ferromagnetic coupling magnetic field $H_{in}$ between the fixed magnetic layer 3 and the free magnetic layer 1 can be set at a small value (absolute value).

When the aforementioned seed layer 22 is formed from the NiFeCr alloy, the atomic ratio X of $Ni_{1-X}$ and $Fe_X$ is preferably $0 \leq X \leq 0.7$, more preferably, is $0 \leq X \leq 0.5$, and further preferably, is $0 \leq X \leq 0.3$.

When the atomic ratio of Ni and Fe in the aforementioned NiFeCr alloy is within the aforementioned range, the crystal orientation of the antiferromagnetic layer 4 is improved, and increases of the crystal particle diameter and rate of resistance change, etc., can be achieved properly. The atomic ratio X is most preferably 0.2.

In the present invention, when the aforementioned seed layer 22 is formed from a FeCr alloy as well, the rate of resistance change and the unidirectional exchange bias magnetic field (Hex*) can be increased with ease and, furthermore, the ferromagnetic coupling magnetic field $H_{in}$ acting between the fixed magnetic layer 3 and the free magnetic layer 1 can be set at a small value (absolute value).

When the aforementioned seed layer 22 is formed from the FeCr alloy, both crystal structures of Fe and Cr are body-centered cubic structures (bcc structure). Consequently, it is believed that when the seed layer 22 is formed from the FeCr alloy, the wettability is improved and, in addition to this, the crystal structure of the aforementioned seed layer 22 can be adjusted properly to the body-centered cubic structure (bcc structure) and, thereby, a large unidirectional exchange bias magnetic field (Hex*), a large rate of resistance change (ΔR/R), etc., can be achieved.

In the present invention, not only that the compositional ratio of Cr of the X—Cr alloy constituting the seed layer 22 is specified to be 80 at % or more, and the film thickness of the aforementioned seed layer 22 is specified to be 20 Å or more, but 130 Å or less (30 Å or more, but 130 Å or less when the substrate layer does not exist), but also the film making condition during film making of the aforementioned seed layer 22 are important elements for improving properly the wettability of the aforementioned seed layer 22 surface.

For example, in the present invention, regarding film making of the aforementioned seed layer 22, preferably, the temperature of the substrate is specified to be 20° C. to 100° C., the distance between the substrate and the target is specified to be 40 to 80 mm, and the pressure of an Ar gas introduced during the sputtering film making is specified to be 0.5 to 3 mTorr (0.067 to 0.4 Pa).

In the present invention, the average crystal particle diameter in the direction parallel to the film surface of each layer formed on the aforementioned seed layer 22 is preferably 200 Å or more and, more preferably, is 210 Å or more. According to this, the rate of resistance change (ΔR/R) and the unidirectional exchange bias magnetic field (Hex*) can be improved compared to those in the conventional case where the seed layer has been formed from Cr or the NiFeCr alloy having the compositional ratio of Cr of 40 at % or less and, furthermore, the ferromagnetic coupling magnetic field $H_{in}$ can be set at a negative value close to 0 (A/m) on an absolute value basis. In particular, when the aforementioned average crystal particle diameter is specified to be 210 Å or more, the rate of resistance change (ΔR/R) can be further improved, and the ferromagnetic coupling magnetic field $H_{in}$ can be maintained at a negative value.

In the present invention, preferably, grain boundaries in the antiferromagnetic layer 4 and grain boundaries in the aforementioned fixed magnetic layer 3, which are observed when the aforementioned magnetic detection element is cut parallel to the direction of the film thickness, are in a condition of being discontinuous in at least a part of the interface between the aforementioned antiferromagnetic layer 4 and the fixed magnetic layer 3.

In the present invention, preferably, grain boundaries in the antiferromagnetic layer 4 and grain boundaries in the aforementioned seed layer 22, which are observed when the aforementioned magnetic detection element is cut parallel to the direction of the film thickness, are in a condition of being discontinuous in at least a part of the interface between the aforementioned antiferromagnetic layer 4 and the seed layer 22.

In the present invention, preferably, twin crystals are formed in at least a part of the aforementioned antiferromagnetic layer 4, and twin boundaries are formed not parallel to the interface to the aforementioned seed layer 22 in at least a part of the aforementioned twin crystals.

When the aforementioned relationship is established, a so-called incommensurate condition is maintained at the interface between the antiferromagnetic layer 4 and the fixed magnetic layer 3, the aforementioned antiferromagnetic layer 4 brings about proper modification for ordering from the disordered lattice (face-centered cubic lattice) to the ordered lattice (face-centered tetragonal lattice) by the heat treatment and, therefore, a large exchange coupling magnetic field can be achieved.

In order to establish the aforementioned relationship, it is important that the seed layer 22 surface has high wettability. However, not only that, it is also important to adjust properly the compositional ratio in the antiferromagnetic layer 4 and the film making condition of each layer formed on the aforementioned seed layer 22.

As described already, the compositional ratio of the element X or elements X+X' constituting the aforementioned antiferromagnetic layer 4 is preferably 45 (at %) or more, but 60 (at %) or less.

Regarding the film making condition, for example, the pressure of the Ar gas used during sputtering film making is specified to be 3 mTorr. The heat treatment temperature for generating the exchange coupling magnetic field between the antiferromagnetic layer 4 and the fixed magnetic layer 3 is specified to be 200° C. or more, but 300° C. or less, and the heat treatment in the magnetic field is performed for a heat treatment time of 2 hours or more at $10^{-6}$ Torr or less of vacuum. The distance between the aforementioned substrate and the target is specified to be 80 mm.

The interface between the aforementioned antiferromagnetic layer 4 and the fixed magnetic layer 3 and the interface between the antiferromagnetic layer 4 and the seed layer 22 can become in an incommensurate condition depending on the compositional ratio in the antiferromagnetic layer 4 and the film making condition described above and, therefore, it is possible to achieve a high exchange coupling magnetic field of $15.8 \times 10^4$ (A/m) or more between the antiferromagnetic layer 4 and the fixed magnetic layer 3.

Regarding the crystal orientation of each layer formed on the aforementioned seed layer 22, in the present invention, the crystal orientation of each layer on the aforementioned seed layer 22 is not necessarily the {111} orientation dominantly in the direction parallel to the film surface in contrast to the conventional manner, or the {111} orientation may be weak.

Hitherto, the NiFeCr alloy, in which the compositional ratio of Cr has been specified to be 40 at % or less, has been used as the seed layer, the {111} plane of each layer formed on the aforementioned seed layer 22 has been made to orientate dominantly in the film surface direction and, thereby, increase of the unidirectional exchange bias magnetic field (Hex*), rate of resistance change, etc., have been intended. However, in the present invention, by the very high wettability of the aforementioned seed layer 22 surface, each layer formed on the aforementioned seed layer 22 can be made to properly bring about laminar growth, the average crystal particle diameter in the direction parallel to the film surface of the aforementioned each layer can be increased, specifically, be made 200 Å or more, preferably, 210 Å or more and, thereby, increase of the unidirectional exchange bias magnetic field (Hex*), rate of resistance change, etc., can be achieved, and the smoothness of the aforementioned each layer surface is improved.

That is, in the present invention, the crystal orientation of each layer formed on the aforementioned seed layer 22 is a secondary element. The present invention gives importance to the improvement of the wettability of the aforementioned seed layer 22 surface, and by the aforementioned improvement of the wettability, the unidirectional exchange bias magnetic field (Hex*) higher than ever and the like can be achieved and, furthermore, it has succeeded to improve the smoothness of the aforementioned each layer surface.

Regarding the crystal structure of the aforementioned seed layer 22, in the present invention, the seed layer 22 has a very high compositional ratio of Cr of 80 at % or more and, therefore, the crystal structure of the aforementioned seed layer 22 is primarily a body-centered cubic structure (bcc structure). When the film thickness of the aforementioned seed layer 22 is reduced, an amorphous phase is also mixed in addition to a crystalline phase formed from the aforementioned body-centered cubic structure. Hitherto, it has been considered important that the crystal structure of the aforementioned seed layer 22 has been a face-centered cubic structure (fcc structure). However, in the present invention, even when the aforementioned crystal structure is a body-centered cubic structure, by the very high wettability of the aforementioned seed layer 22 surface, it has become possible to improve the unidirectional exchange bias magnetic field (Hex*), etc., compared to that have been heretofore attained.

The film structure of the seed layer 22 described above can be applied to the structure of other magnetic detection elements.

Figure 2:
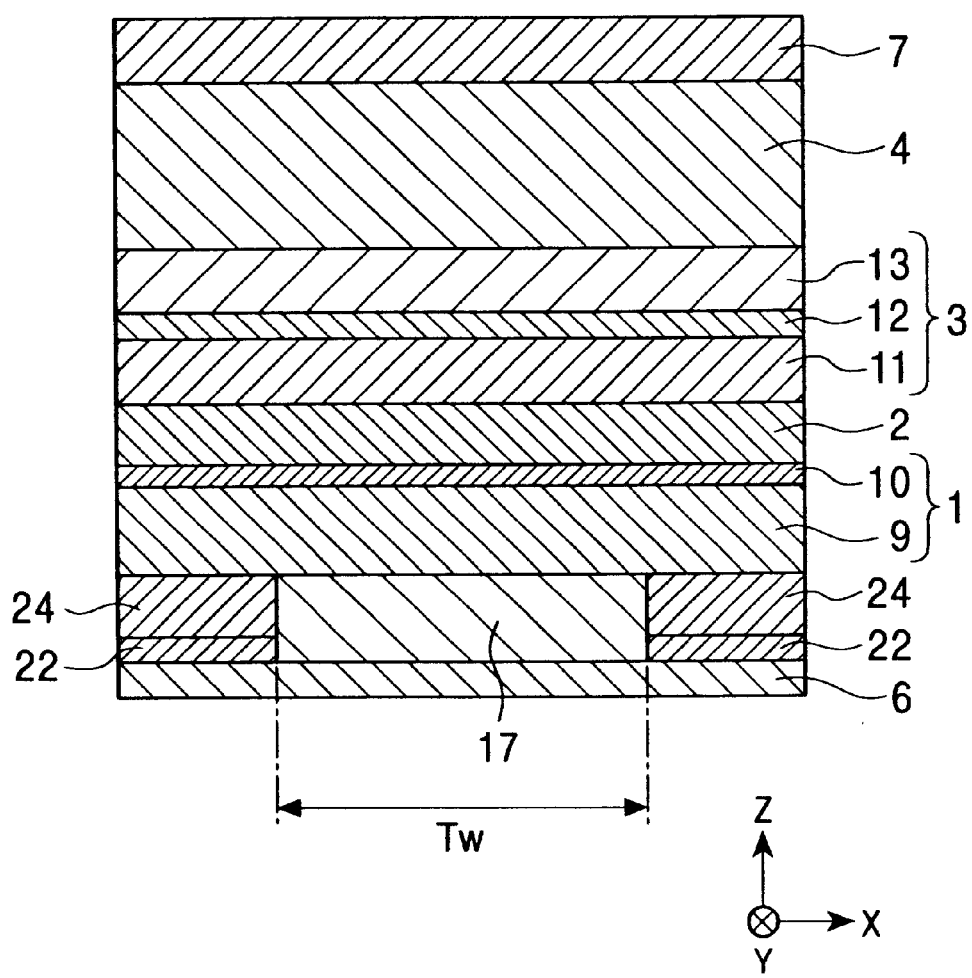
FIG. 2 is a sectional view of the structure of a magnetic detection element (single spin valve type magnetoresistance effect element) according to a second embodiment of the present invention viewed from the surface facing a recording medium side.

FIG. 2 and later drawings are magnetic detection elements having a structure different from that of the magnetic detection element shown in FIG. 1.

FIG. 2 is a partial sectional view of the structure of another magnetic detection element (spin valve type thin film element) according to the present invention viewed from the surface facing a recording medium side.

In a spin valve type thin film element shown in FIG. 2, a pair of seed layers 22 are formed at an interval of the track width Tw in the direction of the track width (the X direction in the drawing) on a substrate layer 6, and exchange bias layers 24 and 24 are formed on the aforementioned seed layers 22.

The respective gaps between the aforementioned pair of seed layers 22 and the exchange bias layers 24 are filled with an insulation layer 17 formed from an insulation material, for example, $SiO_2$ and $Al_2O_3$.

A free magnetic layer 1 is formed on the aforementioned exchange bias layers 24 and the insulation layer 17.

The aforementioned exchange bias layers 24 are formed from an X—Mn alloy or X—Mn—X' alloy. The compositional ratio of the aforementioned element X or elements X+X' is preferably 45 (at %) or more, but 60 (at %) or less, and more preferably, is 49 (at %) or more, but 56.5 (at %) or less.

At both side edge portions of the aforementioned free magnetic layer 1, a single domain in the X direction shown in the drawing is formed by the exchange coupling magnetic field between the exchange bias layers 24, and magnetization of the track width Tw region of the free magnetic layer 1 is arranged properly in the X direction shown in the drawing to the extent that response to an external magnetic field is brought about.

As shown in FIG. 2, a non-magnetic material layer 2 is formed on the aforementioned free magnetic layer 1 and, furthermore, a fixed magnetic layer 3 is formed on the aforementioned non-magnetic material layer 2. An antiferromagnetic layer 4 and a protection layer 7 are further formed on the aforementioned fixed magnetic layer 3.

In this embodiment as well, the aforementioned seed layer 22 is formed including Cr and an element X (wherein the element X is at least one selected from the group consisting of Fe, Ni, Co, Ti, V, Nb, Zr, Hf, Ta, Mo, W, and Y), the compositional ratio of the aforementioned Cr is 80 at % or more, and the film thickness of the aforementioned seed layer is 20 Å or more, but 130 Å or less.

In the present invention, by forming the seed layer 22 from the X—Cr alloy having a very high compositional ratio of Cr, the wettability of the aforementioned seed layer 22 surface can be improved remarkably compared to that heretofore attained, the crystal particle diameter of each of the layers formed on the seed layer 22 can be made large, specifically, be made 200 Å or more, and more preferably, be made 210 Å or more. Consequently, the unidirectional exchange bias magnetic field (Hex*) in the free magnetic layer 1 can be increased and, in addition, the smoothness of the surface of each layer formed on the aforementioned seed layer 22 can be improved.

Therefore, according to the present invention, the reliability in current-carrying represented by electromigration resistance can be improved and, in addition, the ferromagnetic coupling magnetic field $H_{in}$ due to the magnetostatic coupling (topological coupling) between the aforementioned free magnetic layer 1 and the fixed magnetic layer 3 can be reduced, and asymmetry of the playback waveform can be reduced.

Since the preferable film thickness, preferable compositional ratio, etc., of the aforementioned seed layer 22 are the same as those regarding FIG. 1, reference can be made to the description about them.

Figure 3:
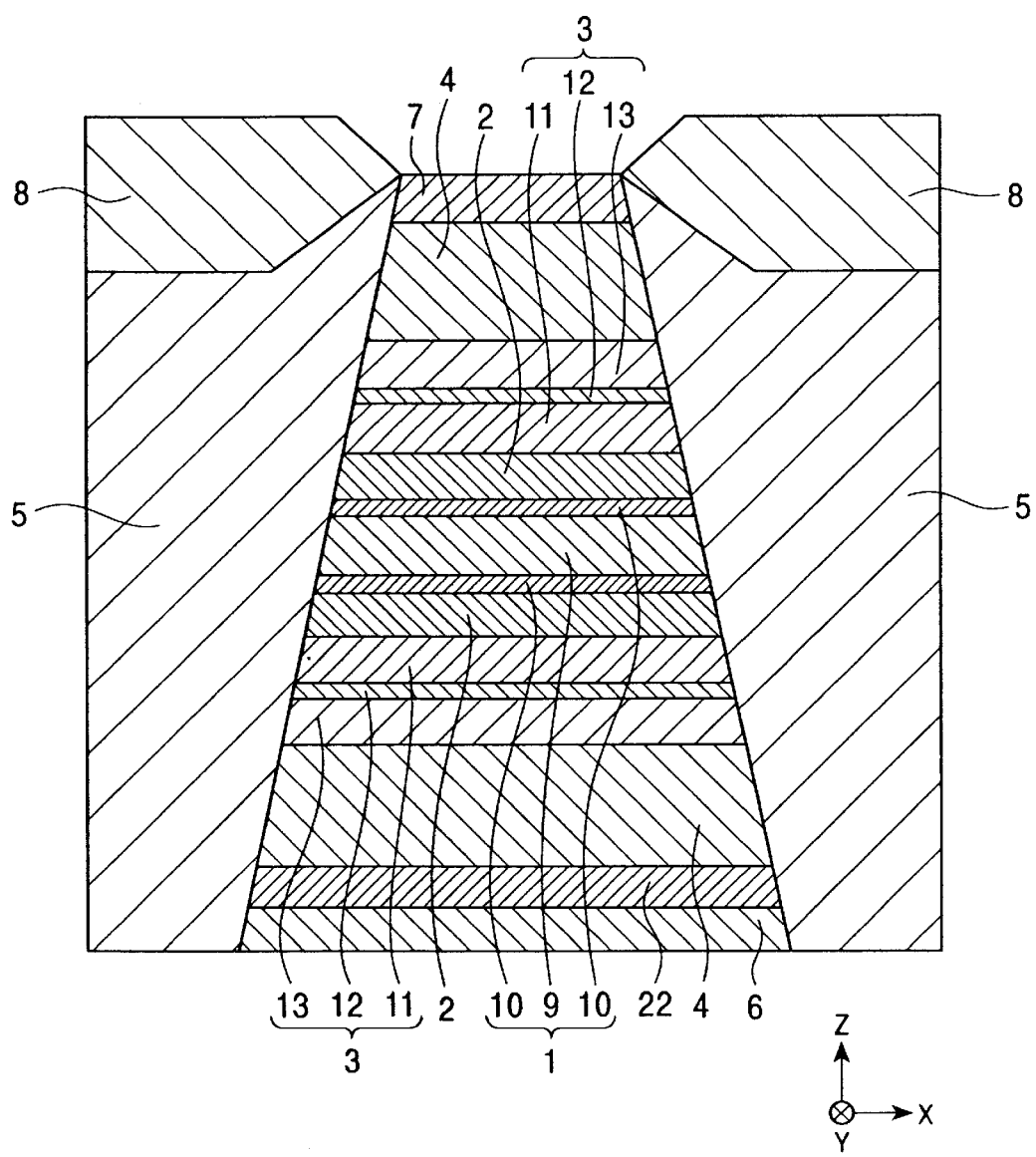
FIG. 3 is a sectional view of the structure of a magnetic detection element (dual spin valve type magnetoresistance effect element) according to a third embodiment of the present invention viewed from the surface facing a recording medium side.

FIG. 3 is a partial sectional view of the structure of a dual spin valve type thin film element according to the present invention.

As shown in FIG. 3, a substrate layer 6, a seed layer 22, an antiferromagnetic layer 4, a fixed magnetic layer 3, a non-magnetic material layer 2 and a free magnetic layer 1 are laminated sequentially from the bottom. The aforementioned free magnetic layer 1 is formed from a three-layer film, and is composed of, for example, CoFe films 10 and 10 and a NiFe alloy film 9. Furthermore, a non-magnetic material layer 2, a fixed magnetic layer 3, an antiferromagnetic layer 4, and a protection layer 7 are laminated sequentially on the aforementioned free magnetic layer 1.

Hard bias layers 5 and 5 and electrode layers 8 and 8 are laminated on both sides of the multilayer film from the substrate layer 6 to the protection layer 7. Each layer is formed from the same material as the material described regarding FIG. 1.

In this embodiment, the seed layer 22 is formed under the antiferromagnetic layer 4 located on the side lower than the free magnetic layer 1 in the drawing. The compositional ratio of the element X or elements X+X' constituting the aforementioned antiferromagnetic layer 4 is preferably 45 (at %) or more, but 60 (at %) or less, and more preferably, is 49 (at %) or more, but 56.5 (at %) or less.

In this embodiment as well, the aforementioned seed layer 22 is formed including Cr and an element X (wherein the element X is at least one selected from the group consisting of Fe, Ni, Co, Ti, V, Nb, Zr, Hf, Ta, Mo, W, and Y), the compositional ratio of the aforementioned Cr is 80 at % or more, and the film thickness of the aforementioned seed layer is 20 Å or more, but 130 Å or less.

In the present invention, by forming the seed layer 22 from the X—Cr alloy having a very high compositional ratio of Cr, the wettability of the aforementioned seed layer 22 surface can be improved remarkably compared to that heretofore attained, the crystal particle diameter of each layer formed on the seed layer 22 can be made large, specifically, be made 200 Å or more, and more preferably, be made 210 Å or more. Consequently, the unidirectional exchange bias magnetic field (Hex*) and the rate of resistance change ($\Delta R/R$) in the fixed magnetic layer 3 can be increased and, in addition, the smoothness of the surface of each layer formed on the aforementioned seed layer 22 can be improved.

Therefore, according to the present invention, the reliability in current-carrying represented by electromigration resistance can be improved and, in addition, the ferromagnetic coupling magnetic field $H_{in}$ due to the magnetostatic coupling (topological coupling) between the aforementioned free magnetic layer 1 and the fixed magnetic layer 3 can be reduced, and asymmetry of the playback waveform of the magnetic head can be reduced. When a mirror reflection layer is placed, the mirror reflectivity of the aforementioned mirror reflection layer can be improved and, therefore, the improvement of the rate of resistance change can be achieved.

Regarding the spin valve type thin film element according to the present invention having the aforementioned effects, accompanying the future increase in recording density, even when the density of the sense current passed through the aforementioned magnetic detection element is increased, the spin valve type thin film element capable of adequately responding to the aforementioned increase in recording density can be manufactured.

Since the preferable film thickness, preferable compositional ratio, etc., of the aforementioned seed layer 22 are the same as those regarding FIG. 1, reference can be made to the description about them.

Figure 4:
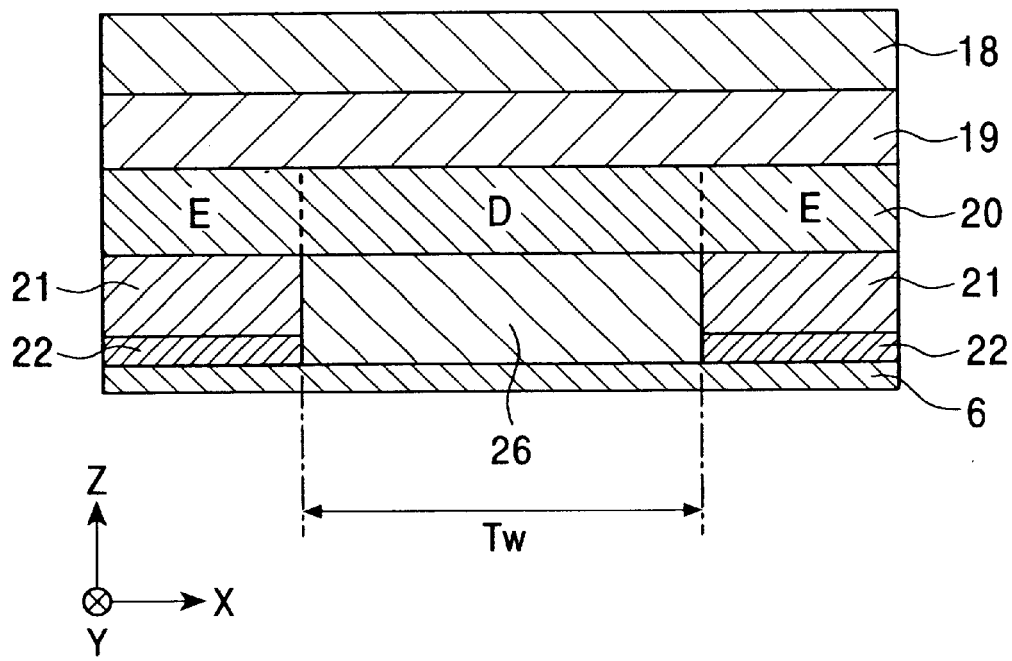
FIG. 4 is a sectional view of the structure of a magnetic detection element (AMR type magnetoresistance effect element) according to a fourth embodiment of the present invention viewed from the surface facing a recording medium side.

FIG. 4 is a partial sectional view of an anisotropic magnetoresistance effect element (AMR element) according to the present invention cut from the direction parallel to the surface facing a recording medium.

In FIG. 4, a pair of seed layers 22 are formed at an interval of the track width Tw in the direction of the track width (the X direction in the drawing) on a substrate layer 6. Exchange bias layers 21 and 21 are formed on the aforementioned seed layers 22, and the respective gaps between the aforementioned pair of seed layers 22 and the exchange bias layers 21 and 21 are filled with an insulation layer 26 formed from an insulation material, for example, $SiO_2$ and $Al_2O_3$.

A magnetoresistive layer (MR layer) 20, a non-magnetic layer (SHUNT layer) 19, and a soft magnetic layer (SAL layer) 18 are laminated on the aforementioned exchange bias layers 21 and 21 and the aforementioned insulation layer 26.

In the aforementioned AMR type thin film element shown in FIG. 4, the regions E of the magnetoresistive layer 20 shown in FIG. 4 is made into a single domain in the X direction shown in the drawing by the exchange coupling magnetic field generated at the interface between the aforementioned exchange bias layers 21 and 21 and the magnetoresistive layer 20. Consequently, due to induction by this, magnetization of the region D of the aforementioned magnetoresistive layer 20 is arranged in the X direction shown in the drawing. A current magnetic field generated when a detection current passes through the magnetoresistive layer 20 is applied to the soft magnetic layer 18 in the Y direction. By the magnetostatic coupling energy brought about by the soft magnetic layer 18, a horizontal bias magnetic field is applied to the region D of the aforementioned magnetoresistive layer 20 in the Y direction. By application of the horizontal bias magnetic field to the regions D of the magnetoresistive layer 20 having been made into a single domain in the X direction, the change of resistance relative to the change of the magnetic field (magnetoresistance effect characteristic: H—R effect characteristic) of the regions D of the magnetoresistive layer 20 is set at a condition of having linearity.

The movement direction of the recording medium is the Z direction, and when a leakage magnetic field is applied in the Y direction shown in the drawing, the resistance value of the region D of the magnetoresistive layer 20 is changed and, therefore, this is detected as a voltage change.

In this embodiment as well, the aforementioned seed layer 22 is formed including Cr and an element X (wherein the element X is at least one selected from the group consisting of Fe, Ni, Co, Ti, V, Nb, Zr, Hf, Ta, Mo, W, and Y), the compositional ratio of the aforementioned Cr is 80 at % or more, and the film thickness of the aforementioned seed layer is 20 Å or more, but 130 Å or less.

In the present invention, by forming the seed layer 22 from the X—Cr alloy having a very high compositional ratio of Cr, the wettability of the aforementioned seed layer 22 surface can be improved remarkably compared to that heretofore attained, the crystal particle diameter of each layer formed on the seed layer 22 can be made large, specifically, be made 200 Å or more, and more preferably, be made 210 Å or more. Consequently, the unidirectional exchange bias magnetic field (Hex*) in the magnetoresistive layer 20 can be increased and, in addition, the smoothness of the surface of each layer formed on the aforementioned seed layer 22 can be improved.

Therefore, according to the present invention, the reliability in current-carrying represented by electromigration resistance can be improved and, in addition, the ferromagnetic coupling magnetic field $H_{in}$ due to the magnetostatic coupling (topological coupling) between the aforementioned magnetoresistive layer 20 and the soft magnetic layer 18 can be reduced, and asymmetry of the playback waveform can be reduced.

Regarding the magnetic detection element according to the present invention having the aforementioned effects, accompanying the future increase in recording density, even when the density of the sense current passed through the aforementioned magnetic detection element is increased, the AMR type thin film element capable of adequately responding to the aforementioned increase in recording density can be manufactured.

Since the preferable film thickness, preferable compositional-ratio, etc., of the aforementioned seed layer 22 are the same as those regarding FIG. 1, reference can be made to the description about them.

Figure 5:
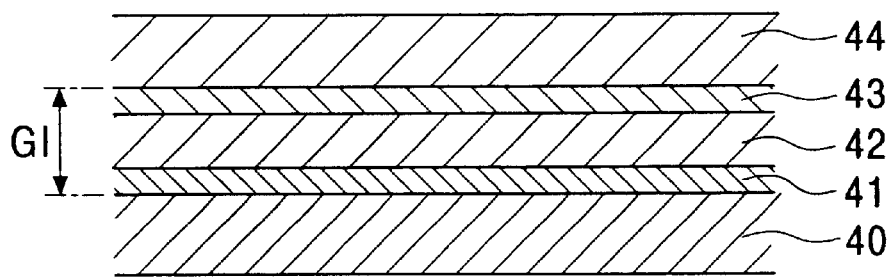
FIG. 5 is a partial sectional view of a thin film magnetic head including a magnetic detection element.

FIG. 5 is a sectional view of the structure of a reading head, in which the magnetic detection element shown in any one of FIG. 1 to FIG. 4 is formed, viewed from the surface facing a recording medium side.

Reference numeral 40 denotes a lower-shield layer formed from, for example, a NiFe alloy, and a lower gap layer 41 is formed on this lower shield layer 40. The magnetic detection element 42 shown in any one of FIG. 1 to FIG. 4 is formed on the lower gap layer 41. Furthermore, an upper gap layer 43 is formed on the aforementioned magnetic detection element 42, and an upper shield layer 44 formed from a NiFe alloy, etc., is formed on the aforementioned upper gap layer 43.

The aforementioned lower gap layer 41 and upper gap layer 43 are formed from an insulation material, for example, $SiO_2$ and $Al_2O_3$ (alumina). As shown in FIG. 5, the length from the lower gap layer 41 to the upper gap layer 43 is the gap length G1, and when this gap length G1 becomes small, the capability for responding to the increase in recording density is improved.

In the present invention, even when the film thickness of the aforementioned antiferromagnetic layer 4 is reduced, a large exchange coupling magnetic field can be generated. The aforementioned antiferromagnetic layer 4 is formed to have a film thickness of, for example, 70 Å or more and, therefore, the film thickness of the aforementioned antiferromagnetic layer 4 can be reduced adequately compared to the conventional film thickness on the order of 300 Å. Consequently, by making the gap narrow, the thin film magnetic head capable of responding to the increase in recording density can be manufactured.

An inductive head for writing may be formed on the aforementioned upper shield layer 44.

The magnetic detection element according to the present invention can be used for magnetic sensors, etc., other than the magnetic head included in the hard disk device.

Next, a manufacturing method for a magnetic detection element according to the present invention will be described below.

In the present invention, the seed layer 22 is formed on the aforementioned substrate layer 6 by sputtering film making. Preferably, the aforementioned substrate layer 6 is formed from at least one element selected from the group consisting of Ta, Hf, Nb, Zr, Ti, Mo, and W. By formation of the substrate layer 6, the seed layer 22 formed thereon can be formed as a dense film, and the wettability of the aforementioned seed layer 22 surface can be improved properly.

When the aforementioned seed layer 22 is formed by sputtering film making, a target formed from, for example, NiFeCr (Cr is 80 at % or more) is used, or a target formed from Cr and a target formed from NiFe are used.

When two or more of the aforementioned targets are used, by changing a power supply applied to each target and size of the target, the aforementioned power supply, etc., are adjusted properly in order that the compositional ratio of Cr of the seed layer 22 formed by sputtering film making becomes 80 at % or more.

When the aforementioned seed layer 22 is formed by sputtering film making, preferably, the temperature of the substrate is specified to be 20° C. to 100° C., the distance between the substrate and the target is specified to be 40 to 80 mm during the sputtering film making of the aforementioned seed layer 22, and the pressure of an Ar gas introduced during the sputtering film making is specified to be 0.5 to 3 mTorr (0.067 to 0.4 Pa).

In the present invention, the aforementioned seed layer 22 is formed to have the film thickness of 20 Å or more, but 130 Å or less. However, when the substrate layer 6 is not formed under the aforementioned seed layer 22, the aforementioned seed layer 22 is formed to have the film thickness of 30 Å or more, but 130 Å or less. Preferably, the aforementioned seed layer 22 is made into film at 60 Å or less.

The antiferromagnetic layer 4 is formed on the aforementioned seed layer 22 by sputtering film making.

In the present invention, preferably, the aforementioned antiferromagnetic layer 4 is formed by sputtering film making from an antiferromagnetic material containing an element X (wherein X is at least one element selected from the group consisting of Pt, Pd, Ir, Rh, Ru, and Os) and Mn.

In the present invention, the aforementioned antiferromagnetic layer 4 may be formed by sputtering film making from an X—Mn—X' alloy (wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements).

In the present invention, the compositional ratio of the aforementioned element X or elements X+X' is preferably 45 (at %) or more, but 60 (at %) or less.

The fixed magnetic layer 3, the non-magnetic material layer 2, the free magnetic layer 1, the backed layer 15, and the protection layer 7 are made into films on the aforementioned antiferromagnetic layer 4.

In the present invention, as described above, the seed layer 22 is formed from the X—Cr alloy having the compositional ratio of Cr of 80 at % or more, and is formed to have the film thickness of 20 Å or more, but 130 Å or less (30 Å or more, but 130 Å or less when the substrate layer 6 does not exist) and, therefore, the wettability of the aforementioned seed layer 22 surface can be improved adequately compared to that heretofore attained, each layer formed on the aforementioned seed layer 22 can be made likely to bring about laminar growth, and the crystal particle diameter is increased compared to that heretofore attained. Consequently, since in a heat treatment step performed later, the unidirectional exchange bias magnetic field (Hex*) and the rate of resistance change (ΔR/R) in the fixed magnetic layer 3 can be increased compared to that heretofore attained and, in addition, the smoothness of the surface of each layer formed on the aforementioned seed layer 22 can be improved, the ferromagnetic coupling magnetic field $H_{in}$ acting between the fixed magnetic layer 3 and the free magnetic layer 1 can be reduced, and the magnetic detection element, in which asymmetry of the playback waveform is reduced, can be manufactured.

EXAMPLES

In the present invention, the crystal structure of the aforementioned seed layer, the unidirectional exchange bias magnetic field (Hex*), etc., are measured regarding Examples 1, 2, and 3 and Comparative example 1 using the seed layer formed from NiFeCr (the compositional ratio of Cr is 90 at %), Comparative examples 2 to 5 using the seed layer formed from Cr, Conventional examples 1 and 2 formed from NiFeCr (the compositional ratio of Cr is 40 at % or 23 at %), and Conventional example 3 in which no seed layer is formed.

The film configuration and film making condition of each Example, Comparative example, and Conventional example are shown in the following Table 1.

TABLE 1

Figure 6:
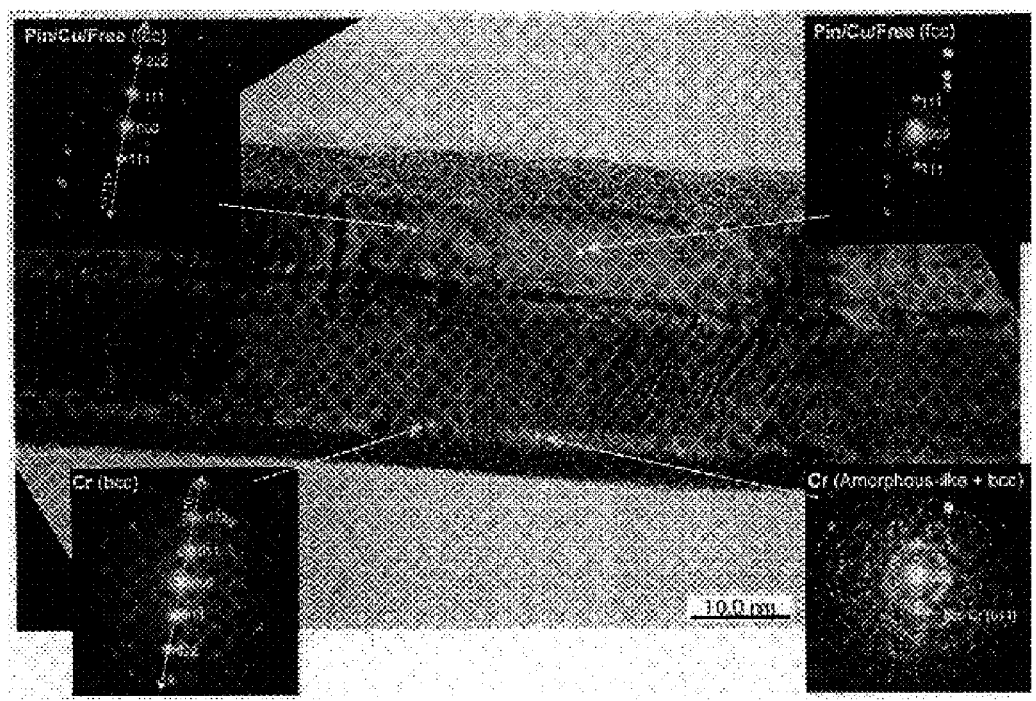
FIG. 6 shows a transmission electron micrograph and electron diffraction patterns of a magnetic detection element in the case where a seed layer (Example 1) made of $(Ni_{0.8}Fe_{0.2})_{10at\%}Cr_{90at\%}$ of 20 Å is formed on a Ta film.

| | TEM photograph | Film configuration | Annealing condition | Substrate layer/ seed layer | Seed layer crystal structure | Unidirectional exchange bias magnetic field Hex* (Oe) (A/m) | Rate of resistance change ΔR/R (%) | Ferromagnetic coupling magnetic field $H_{in}$ (Oe) (A/m) | Average crystal particle diameter in the direction of film surface Å |
|---|---|---|---|---|---|---|---|---|---|
| Example 1 | FIG. 6 | Si substrate/ alumina(1000Å)/Ta(32Å)/ (Ni$_{0.8}$Fe$_{0.2}$)$_{10}$Cr$_{90}$(20Å)/ Pt$_{50}$Mn$_{50}$(120Å)/Co$_{90}$Fe$_{10}$ (16Å)/Ru(9Å)/Co$_{90}$Fe$_{10}$ (22Å)/Cu(21Å)/Co$_{90}$Fe$_{10}$ (10Å)/Ni$_{80}$Fe$_{20}$(18Å)/ Cu(10Å)/Ta(30Å) | Heat treatment in magnetic field 290° C. × 3 hr. 40 min 800 (kA/m) | Ta(32Å)/ (Ni$_{0.8}$Fe$_{0.2}$)$_{10}$ Cr$_{90}$(20Å) | Amorphous (main) + bcc-Cr | 2114 (Oe) 168 (kA/m) ⊙ | 13.25 (%) ⊙ | -1.9 (Oe) -79.6 (A/m) ⊙ | 210Å |

TABLE 1-continued

Figure 8:
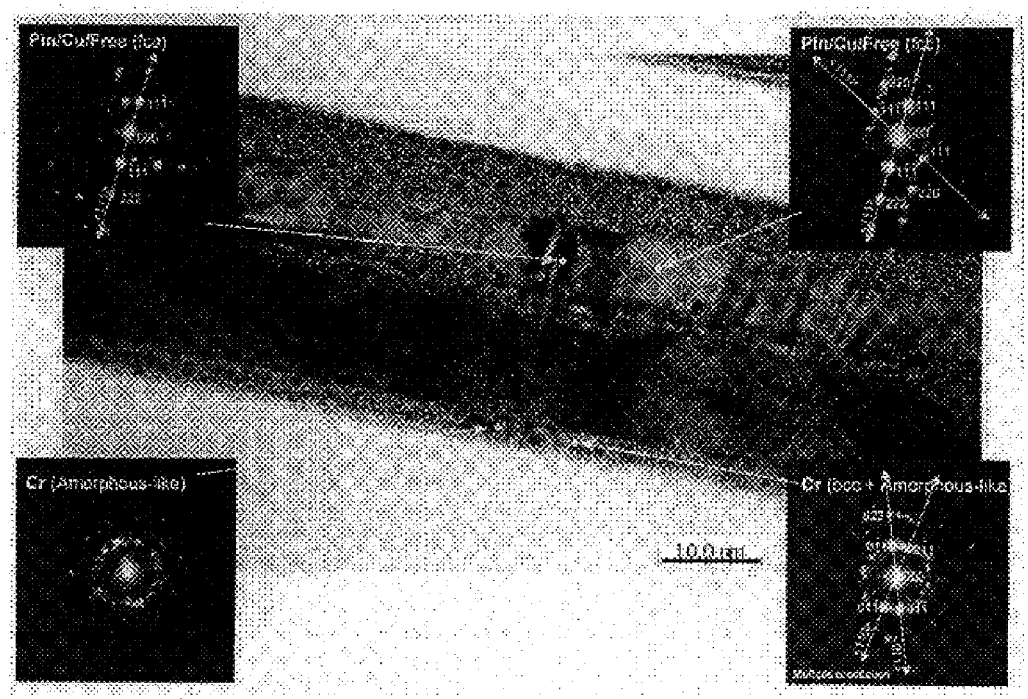
FIG. 8 shows a transmission electron micrograph and electron diffraction patterns of a magnetic detection element in the case where a seed layer (Example 2) made of $(Ni_{0.8}Fe_{0.2})_{10at\%}Cr_{90at\%}$ of 30 Å is formed while no Ta film is placed.
Figure 12:
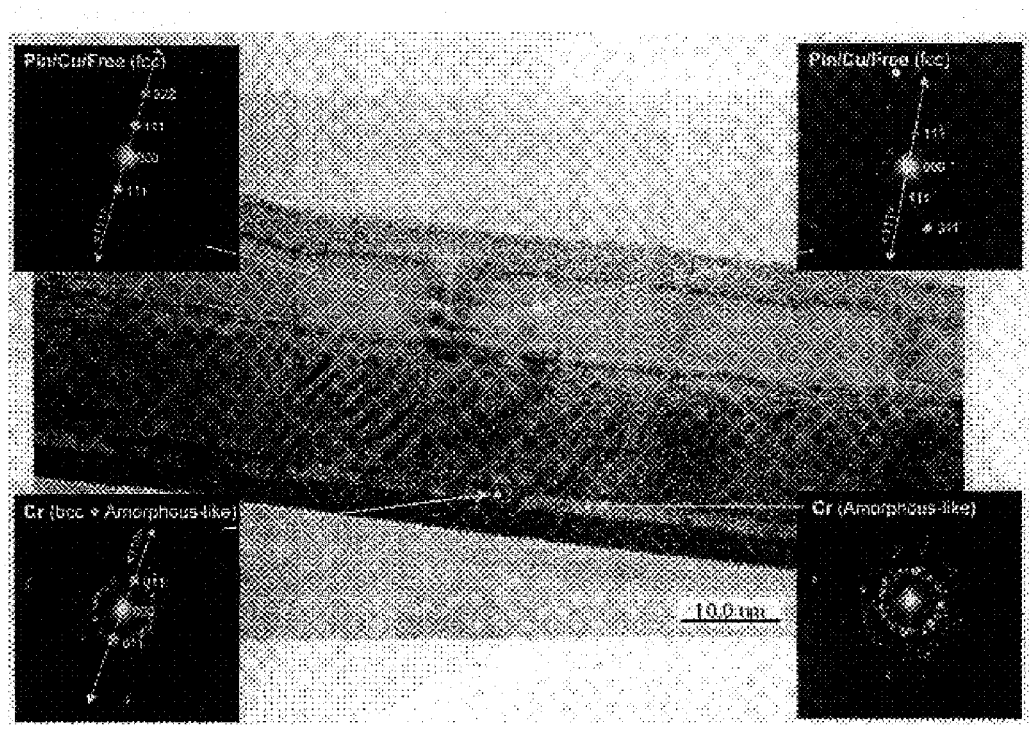
FIG. 12 shows a transmission electron micrograph and electron diffraction patterns different from FIG. 10 of the magnetic detection element in the case where the seed layer (Example 3) made of $(Ni_{0.8}Fe_{0.2})_{10at\%}Cr_{90at\%}$ of 30 Å is formed on the Ta film.
Figure 14:
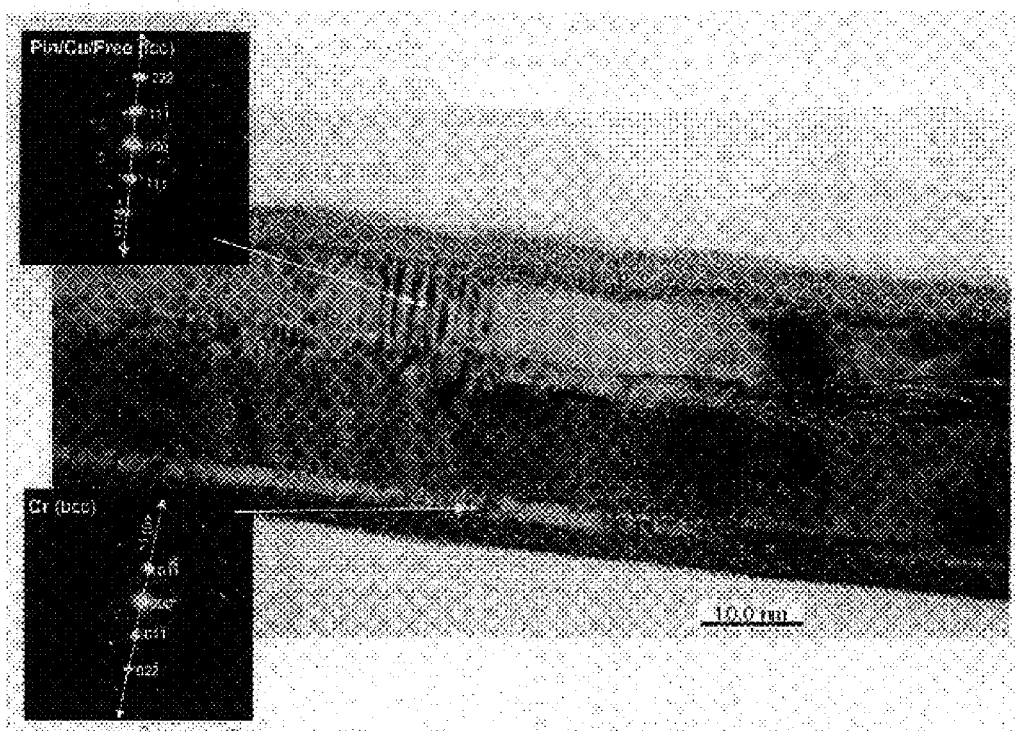
FIG. 14 shows a transmission electron micrograph and electron diffraction patterns different from FIG. 10 of the magnetic detection element in the case where the seed layer (Example 3) made of $(Ni_{0.8}Fe_{0.2})_{10at\%}Cr_{90at\%}$ of 30 Å is formed on the Ta film.
Figure 16:
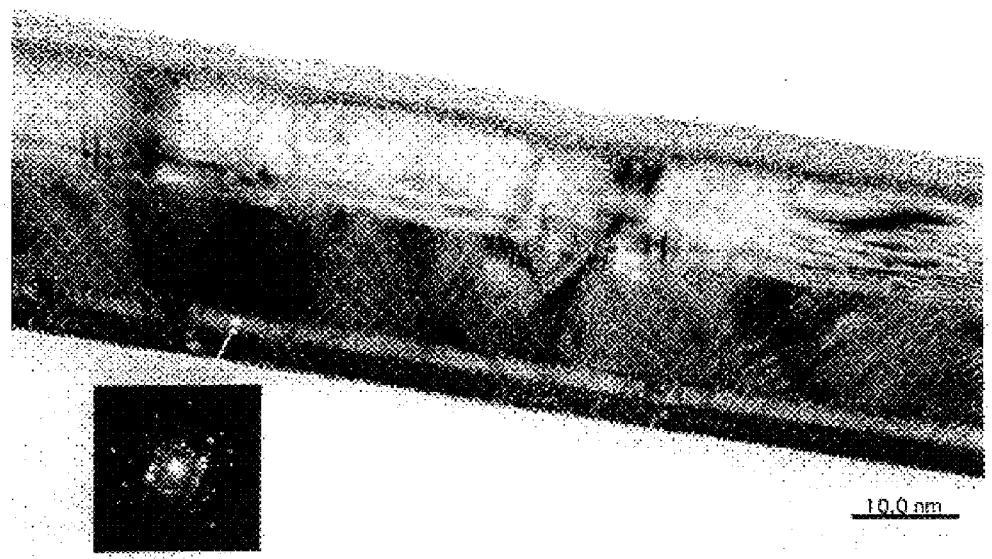
FIG. 16 shows a transmission electron micrograph of a magnetic detection element, in the case where a seed layer (Comparative example 2) made of Cr of 20 Å is formed on a Ta film, and electron diffraction patterns of the aforementioned seed layer.
Figure 18:
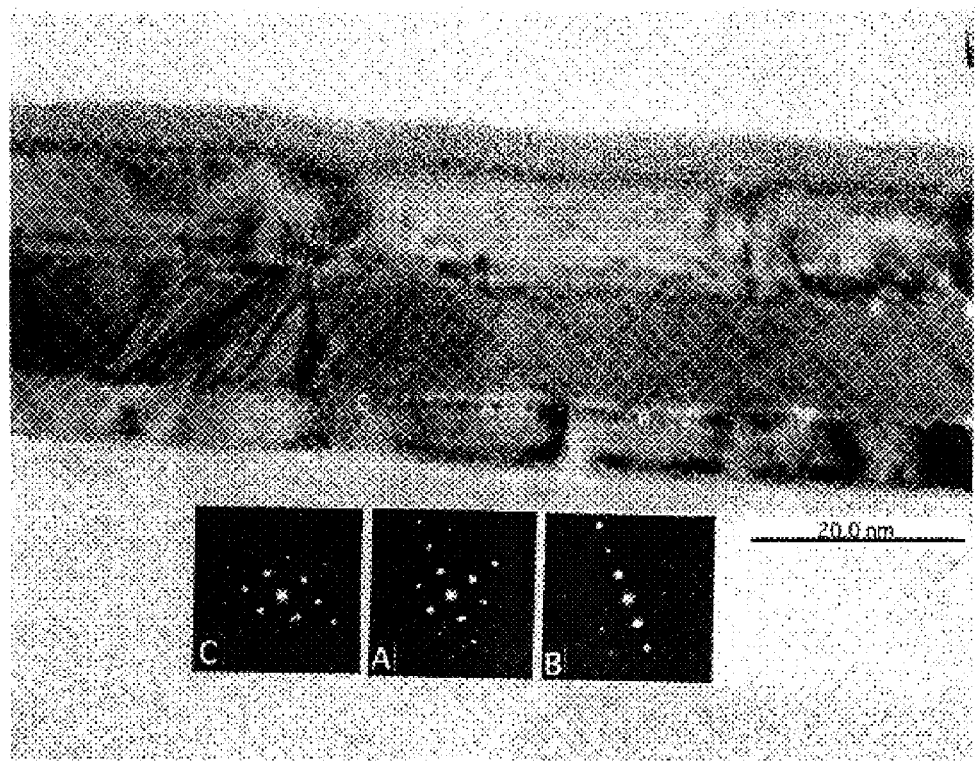
FIG. 18 shows a transmission electron micrograph of a magnetic detection element, in the case where a seed layer (Comparative example 5) made of Cr of 60 Å is formed, and electron diffraction patterns of the aforementioned seed layer.
Figure 20:
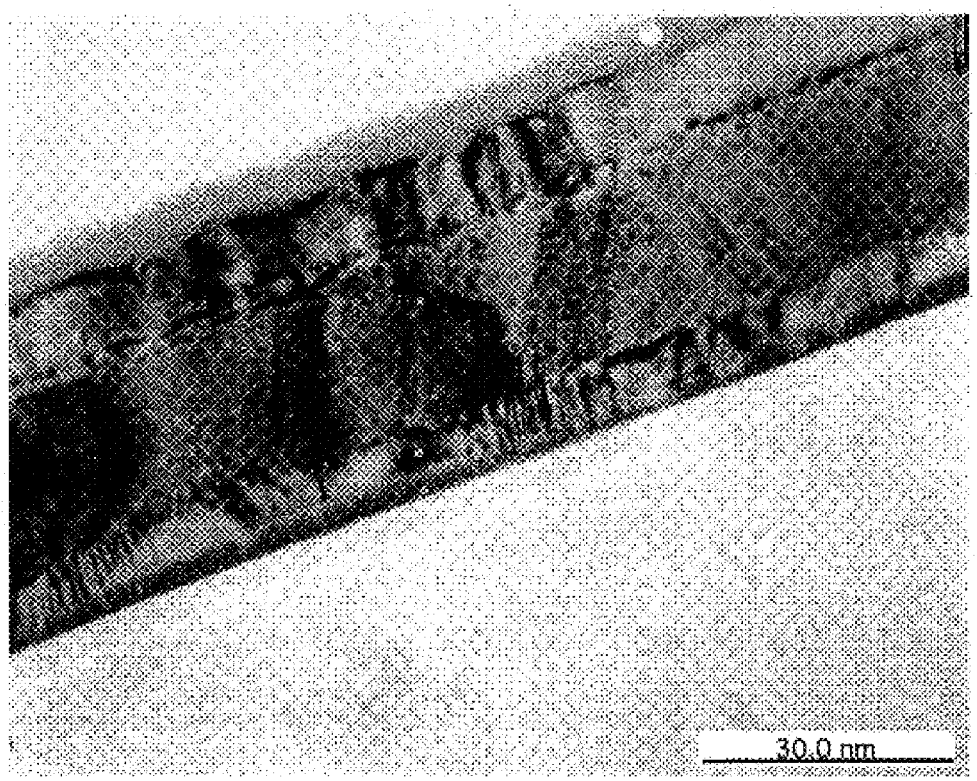
FIG. 20 shows a transmission electron micrograph of a magnetic detection element in the case where a seed layer (Conventional example 1) made of NiFeCr (Cr is 40 at %) of 55 Å is formed on a Ta film.

| | TEM photograph | Film configuration | Annealing condition | Substrate layer/ seed layer | Seed layer crystal structure | Uni-directional exchange bias magnetic field Hex* (Oe) (A/m) | Rate of resistance change ΔR/R (%) | Ferromagnetic coupling magnetic field $H_{in}$ (Oe) (A/m) | Average crystal particle diameter in the direction of film surface Å |
|---|---|---|---|---|---|---|---|---|---|
| Example 2 | FIG. 8 | Si substrate/ alumina(1000Å)/ $(Ni_{0.8}Fe_{0.2})_{10}Cr_{90}(30Å)/$ $Pt_{50}Mn_{50}(120Å)/Co_{90}Fe_{10}$ (16Å)/Ru(9Å)/Co_{90}Fe_{10} (22Å)/Cu(21Å)/Co_{90}Fe_{10} (10Å)/Ni_{80}Fe_{20}(18Å)/ Cu(10Å)/Ta(30Å) | Heat treatment in magnetic field 290° C. × 3 hr. 40 min 800 (kA/m) | $(Ni_{0.8}Fe_{0.2})_{10}Cr_{90}(30Å)$ | Amorphous (main) + bcc-Cr | 2347 (Oe) 187 (kA/m) ⊙ | 11.35 (%) ○ | 2.9 (Oe) 231 (A/m) ○ | 204Å |
| Example 3 | FIG. 10 12 14 | Si substrate/ alumina(1000Å)/Ta(32Å)/ $(Ni_{0.8}Fe_{0.2})_{10}Cr_{90}(30Å)/$ $Pt_{50}Mn_{50}(120Å)/Co_{90}Fe_{10}$ (16Å)/Ru(9Å)/Co_{90}Fe_{10} (22Å)/Cu(21Å)/Co_{90}Fe_{10} (10Å)/Ni_{80}Fe_{20}(18Å)/ Cu(10Å)/Ta(30Å) | Heat treatment in magnetic field 290° C. × 3 hr. 40 min 800 (kA/m) | Ta(32Å)/ $(Ni_{0.8}Fe_{0.2})_{10}Cr_{90}(30Å)$ | Amorphous (main) + bcc-Cr | 2162 (Oe) 171 (kA/m) ⊙ | 13.01 (%) ⊙ | -2.2 (Oe) -173.8 (A/m) ⊙ | 224Å |
| Comparative example 1 | None | Si substrate/ alumina(1000Å)/Ta(32Å)/ $(Ni_{0.8}Fe_{0.2})_{10}Cr_{90}(20Å)/$ $Pt_{50}Mn_{50}(120Å)/Co_{90}Fe_{10}$ (16Å)/Ru(9Å)/Co_{90}Fe_{10} (22Å)/Cu(21Å)/Co_{90}Fe_{10} (10Å)/Ni_{80}Fe_{20}(18Å)/ Cu(10Å)/Ta(30Å) | Heat treatment in magnetic field 290° C. × 3 hr. 40 min 800 (kA/m) | $(Ni_{0.8}Fe_{0.2})_{10}Cr_{90}(20Å)$ | — | 1112 (Oe) 88.5 (kA/m) Δ | 7.75 (%) x | 41 (Oe) 3262 (A/m) x | — |
| Comparative example 2 | FIG. 16 | Si substrate/ alumina(1000Å)/Ta(32Å)/ Cr(20Å)/ $Pt_{50}Mn_{50}(120Å)/Co_{90}Fe_{10}$ (16Å)/Ru(9Å)/Co_{90}Fe_{10} (22Å)/Cu(21Å)/Co_{90}Fe_{10} (10Å)/Ni_{80}Fe_{20}(18Å)/ Cu(10Å)/Ta(30Å) | Heat treatment in magnetic field 290° C. × 3 hr. 40 min 800 (kA/m) | Ta(32Å)/ Cr(20Å) | Amorphous (main) + bcc-Cr | 1884 (Oe) 150 (kA/m) ⊙ | 12.3 (%) ⊙ | 0.4 (Oe) 31.8 (A/m) ⊙ | 217Å |
| Comparative example 3 | None | Si substrate/ alumina(1000Å)/ Cr(20Å)/ $Pt_{50}Mn_{50}(120Å)/Co_{90}Fe_{10}$ (16Å)/Ru(9Å)/Co_{90}Fe_{10} (22Å)/Cu(21Å)/Co_{90}Fe_{10} (10Å)/Ni_{80}Fe_{20}(18Å)/ Cu(10Å)/Ta(30Å) | Heat treatment in magnetic field 290° C. × 3 hr. 40 min 800 (kA/m) | Cr(20Å) | Amorphous (main) + bcc-Cr | 963 (Oe) 76.6 (kA/m) x | 7.89 (%) x | 30.9 (Oe) 2459 (A/m) x | — |
| Comparative example 4 | None | Si substrate/ alumina(1000Å)/Ta(32Å)/ Cr(60Å)/ $Pt_{50}Mn_{50}(120Å)/Co_{90}Fe_{10}$ (16Å)/Ru(9Å)/Co_{90}Fe_{10} (22Å)/Cu(21Å)/Co_{90}Fe_{10} (10Å)/Ni_{80}Fe_{20}(18Å)/ Cu(10Å)/Ta(30Å) | Heat treatment in magnetic field 290° C. × 3 hr. 40 min 800 (kA/m) | Ta(32Å)/ Cr(60Å) | bcc-Cr (main) | 1926 (Oe) 153 (kA/m) ○ | 9.56 (%) x | 0.7 (Oe) 55.7 (A/m) ⊙ | 211Å |
| Comparative example 5 | FIG. 18 | Si substrate/ alumina(1000Å)/ Cr(60Å)/ $Pt_{50}Mn_{50}(120Å)/Co_{90}Fe_{10}$ (16Å)/Ru(9Å)/Co_{90}Fe_{10} (22Å)/Cu(21Å)/Co_{90}Fe_{10} (10Å)/Ni_{80}Fe_{20}(18Å)/ Cu(10Å)/Ta(30Å) | Heat treatment in magnetic field 290° C. × 3 hr. 40 min 800 (kA/m) | Cr(60Å) | bcc-Cr (main) | 1937 (Oe) 154 (kA/m) ○ | 8.72 (%) x | 4.6 (Oe) 366 (A/m) ○ | 202Å |
| Conventional example 1 | FIG. 20 | Si substrate/ alumina(1000Å)/Ta(32Å)/ $(Ni_{0.8}Fe_{0.2})_{60}Cr_{40}(55Å)/$ $Pt_{50}Mn_{50}(200Å)/Co_{90}Fe_{10}$ (15Å)/Ru(9Å)/Co_{90}Fe_{10} (22Å)/Cu(21Å)/Co_{90}Fe_{10} | Heat treatment in magnetic field 290° C. × | Ta(32Å)/ $(Ni_{0.8}Fe_{0.2})_{60}Cr_{40}(55Å)$ | fcc | 1773 (Oe) 141 (kA/m) ○ | 11.8 (%) ○ | 7.8 (Oe) 621 (A/m) Δ | 197Å |

TABLE 1-continued

| | TEM photograph | Film configuration | Annealing condition | Substrate layer/ seed layer | Seed layer crystal structure | Unidirectional exchange bias magnetic field Hex* (Oe) (A/m) | Rate of resistance change ΔR/R (%) | Ferromagnetic coupling magnetic field $H_{in}$ (Oe) (A/m) | Average crystal particle diameter in the direction of film surface Å |
|---|---|---|---|---|---|---|---|---|---|
| Conventional example 2 | None | Si substrate/ alumina(1000Å)/Ta(32Å)/ $(Ni_{0.8}Fe_{0.2})_{77}Cr_{23}(20Å)$/ $Pt_{50}Mn_{50}(200Å)/Co_{90}Fe_{10}$ (15Å)/Ru(9Å)/$Co_{90}Fe_{10}$ (22Å)/Cu(21Å)/$Co_{90}Fe_{10}$ (10Å)/$Ni_{80}Fe_{20}$(32Å)/ Cu(17Å)/Ta(20Å) | 3 hr. 40 min 800 (kA/m) Heat treatment in magnetic field 290° C. × 3 hr. 40 min 800 (kA/m) | Ta(32Å)/ $(Ni_{0.8}Fe_{0.2})_{77}$ $Cr_{23}(20Å)$ | fcc | 1316 (Oe) 104 (kA/m) ○ | 10.0 (%) ○ | 6.8 (Oe) (A/m) Δ | 186Å |
| Conventional example 3 | None | Si substrate/ alumina(1000Å)/Ta(32Å)/ $Pt_{50}Mn_{50}(120Å)/Co_{90}Fe_{10}$ (15Å)/Ru(9Å)/$Co_{90}Fe_{10}$ (22Å)/Cu(21Å)/$Co_{90}Fe_{10}$ (10Å)/$Ni_{80}Fe_{20}$(32Å)/ Cu(17Å)/Ta(20Å) | Heat treatment in magnetic field 290° C. × 3 hr. 40 min 800 (kA/m) | Ta(32Å) | — | 987 (Oe) 78.5 (kA/m) x | 8.72 (%) x | 8.5 (Oe) 676 (A/m) x | — |

The crystal structure of the seed layer, the magnitude of the unidirectional exchange bias magnetic field (Hex*), etc., of each sample will be described below with reference to Table 1. In sections of the unidirectional exchange bias magnetic field (Hex*), rate of resistance change (ΔR/R), and ferromagnetic coupling magnetic field $H_{in}$ of each sample, evaluations, such as ⊙, other than measured values are entered. Regarding the evaluation, ⊙ is the best, and the order of decreasing superiority is ○, Δ, and x. When the evaluation is ⊙ or ○, it is possible to use practically as a magnetic detection element. The samples which are evaluated as ⊙ or ○ regarding all evaluation items are Examples 1, 2, and 3 and Comparative example 2.

The crystal structure of the seed layer will be described. Examples 1, 2, and 3 have film structures in which the amorphous phase is the main, and the body-centered cubic structure (bcc structure) is mixed in the amorphous phase.

The factor of mixing of the amorphous phase in the film is assumed that the seed layer has a reduced thickness of 30 Å or less, and the crystal is unlikely to grow. Likewise, Comparative examples 2 and 3 had film structures in which the amorphous phase was the main, and the body-centered cubic structure (bcc structure) was mixed in the amorphous phase.

In Comparative examples 4 and 5, the aforementioned seed layer was composed of only a crystalline phase, and the aforementioned crystalline phase had a body-centered cubic structure (bcc structure). In Conventional examples 1 and 2, the aforementioned seed layer was composed of only a crystalline phase, and the aforementioned crystalline phase had a face-centered cubic structure (fcc structure).

The unidirectional exchange bias magnetic field (Hex*) will be described. It is clear that the aforementioned unidirectional exchange bias magnetic fields (Hex*) in Examples 1, 2, and 3 are very high compared to those in other samples. The reason for this is assumed that in the aforementioned Examples 1, 2, and 3, the wettability of the aforementioned seed layer surface is excellent by a large degree compared to those in other samples and, therefore, the antiferromagnetic layer, etc., made into the film on the aforementioned seed layer have properly brought about laminar growth, and the average crystal particle diameter in the direction parallel to the film surface has been increased by a large degree.

For example, in Conventional example 2, the seed layer of 20 Å is formed on the substrate layer (Ta film) in a manner similar to that in Example 1. There is a difference in the compositional ratio of Cr constituting the seed layer. In Conventional example 2, the unidirectional exchange bias magnetic field (Hex*) is reduced by a large degree compared to that in Example 1. The reason for this is believed that in the Conventional example 2, the wettability of the seed layer is degraded and, therefore, the average crystal particle diameter in the direction parallel to the film surface of each layer formed thereon is 186 Å and is not grown to an adequate size.

Although Comparative example 1 also has a compositional ratio of Cr of 90 at % similarly to those in Examples 1, 2, and 3, it is clear that the unidirectional exchange bias magnetic field (Hex*) is reduced by a large degree. As is described later in detail using graphs, the reason for this is believed that in Comparative example 1, since no substrate layer (TA film) is placed even though the seed layer has a reduced thickness of 20 Å, the wettability of the aforementioned seed layer surface is degraded. A similar phenomenon is observed in Comparative example 3 as well.

The rate of resistance change (ΔR/R) will be described. As shown in Table 1, it is clear that in Examples 1, 2, and 3, the rates of resistance change (ΔR/R) are higher than those in other samples.

One reason for this is believed that regarding the seed layers in Examples 1, 2, and 3 in which the compositional ratio of Cr was specified to be 90 at %, since the wettability of the seed layer surface was improved remarkably, each of the antiferromagnetic layer, etc., formed on the aforementioned seed layer properly brought about laminar growth, and the average crystal particle diameter in the direction parallel to the film surface was increased by a large degree and, in addition, the reason for this is believed that since the element X was added to Cr, the resistivity of the seed layer was increased, and the shunt amount of the sense current from the electrode layer to the aforementioned seed layer was able to reduce properly.

Herein, it is clear from Table 1 that regarding Comparative example 2 in which the seed layer is formed from Cr of 20 Å, a considerably high rate of resistance change (ΔR/R) can be achieved.

However, in the case where the seed layer is formed from Cr, it is clear from the rates of resistance change (ΔR/R) of Comparative examples 4 and 5, in which the film thickness thereof is increased to 60 Å, that the aforementioned rates of resistance change (ΔR/R) are less than 10% and, therefore, are reduced by a large degree.

This is because since the seed layer formed from Cr has a reduced resistivity, when the film thickness of the aforementioned seed layer is increased, the shunt amount of the sense current from the electrode layer to the aforementioned seed layer is increased.

On the other hand, regarding the Example in which the seed layer has been formed from NiFeCr (the compositional ratio of Cr is 90 at %), it has been known from the experiment described later that even when the film thickness has been increased to 60 Å, the rate of resistance change (ΔR/R) of 10% or more has been able to be maintained.

The ferromagnetic coupling magnetic field $H_{in}$ will be described. The ferromagnetic coupling magnetic field $H_{in}$ refers to an interlayer coupling magnetic field generated between the free magnetic layer and the fixed magnetic layer with the non-magnetic material layer therebetween. When this value takes a positive value, a coupling force, which tends to aim the magnetization direction of the free magnetic layer to the direction parallel to the magnetization direction of the fixed magnetic layer, is effected. On the other hand, when it takes a negative value, a coupling force, which tends to aim the magnetization direction of the free magnetic layer to the direction antiparallel to the magnetization direction of the fixed magnetic layer, is effected.

By reducing the aforementioned ferromagnetic coupling magnetic field $H_{in}$, the aforementioned magnetization of the free magnetic layer can become likely to aim in the direction intersecting the magnetization direction of the fixed magnetic layer and, thereby, asymmetry of the playback waveform can be reduced.

It is clear from Table 1 that in Examples 1, 2, and 3, the aforementioned ferromagnetic coupling magnetic field $H_{in}$ is reduced by a large degree. The reduced ferromagnetic coupling magnetic field $H_{in}$ indicates that the surfaces of the aforementioned fixed magnetic layer and the free magnetic layer have superior smoothness. In particular, when the aforementioned ferromagnetic coupling magnetic field $H_{in}$ takes a negative value (refer to Example 1 and Example 3 in Table 1), it is believed that the surfaces of the aforementioned fixed magnetic layer, etc., are in a condition of having extremely superior smoothness. Consequently, it can be said that in Example 1 and Example 3, the smoothness of the surfaces of the fixed magnetic layer, etc., is in a condition of being most improved compared to those in the other samples.

Similarly to Examples, Comparative examples 2 and 4 have reduced ferromagnetic coupling magnetic fields $H_{in}$ as well and, therefore, it is clear that the surfaces of the fixed magnetic layer and the free magnetic layer are in a condition of having superior smoothness.

It was made clear from this experiment that when the compositional ratio of Cr in the NiCrFe alloy is increased to 90 at % as in Examples 1, 2, and 3, all of the unidirectional exchange bias magnetic field (Hex*), rate of resistance change (ΔR/R), and ferromagnetic coupling magnetic field $H_{in}$ can become in a condition of being superior.

Table 1 shows that Comparative example 2, in which the seed layer is formed from Cr, has superior characteristics similarly to those in Examples as well. However, when the film thickness of Cr is increased to on the order of 60 Å (Comparative examples 4 and 5), a problem occurs in that the rate of resistance change (ΔR/R) is reduced by a large degree. Consequently, in the present invention, the seed layer having a high resistivity is formed including not only Cr, but also an element X (Fe, Ni, etc.).

Since the average crystal particle diameters in the direction parallel to the film surface of each layer on the seed layers in all of Examples 1 to 3 were 200 Å or more, in the present invention, the preferable range of the aforementioned average crystal particle diameter was set at 200 Å or more. Since Example 1 and Example 3 exhibited excellent values in all of the unidirectional exchange bias magnetic field, rate of resistance change, and ferromagnetic coupling magnetic field, the crystal particle diameter in these Examples, that is, the average crystal particle diameter of 210 Å or more, was taken as the more preferable range.

Next, the magnetic detection element in Example 1 was cut from the direction of film thickness, and the cross section thereof was observed using a transmission electron micrograph.

Figure 7:
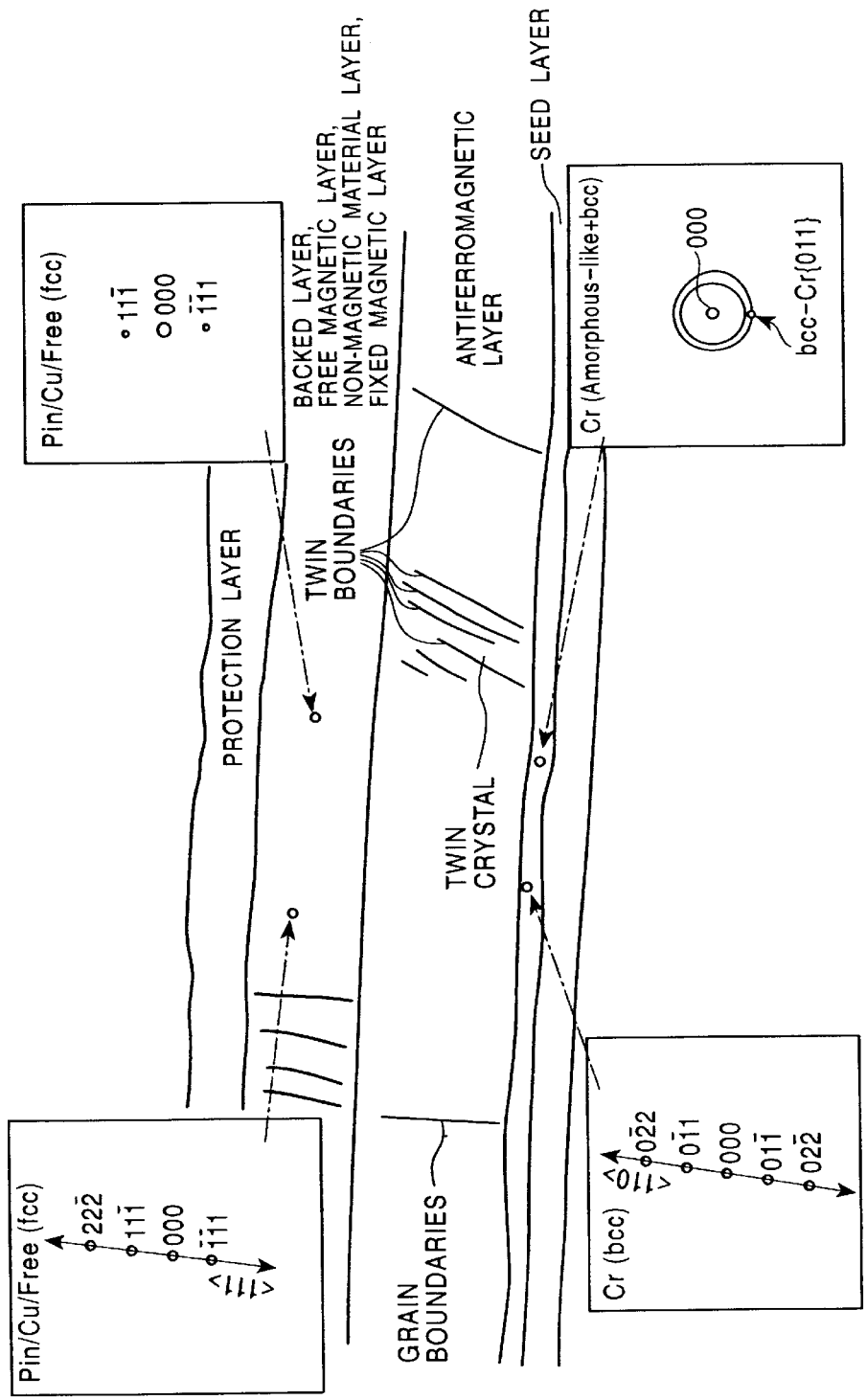
FIG. 7 is a schematic diagram of a part of the photographs shown in FIG. 6.

FIG. 6 shows a transmission electron micrograph of a magnetic detection element having the film configuration according to Example 1. FIG. 7 is a schematic diagram of a part of the photograph shown in FIG. 6.

As shown in FIGS. 6 and 7, it was made clear that the surface of each of the layers, for example, the antiferromagnetic layer formed on the seed layer formed from $(Ni_{0.8}Fe_{0.2})_{10at\%}Cr_{90at\%}$ of 20 Å and the fixed magnetic layer formed thereon, had small waves, and each layer surface was in the condition of having extremely superior smoothness.

It was made clear that the average crystal particle diameter in the direction parallel to the film surface of each layer formed on the aforementioned seed layer significantly grew to about 210 Å (refer to Table 1).

In order to examine the film structure of the aforementioned seed layer, electron diffraction patterns were taken of two parts of the aforementioned seed layer. The results of the electron diffraction patterns are shown at the lower left and the lower right in FIG. 6.

As shown in FIGS. 6 and 7, it was made clear that in the electron diffraction pattern shown at the lower left in the drawing, a plurality of diffraction spots which indicated presence of a body-centered cubic structure (bcc structure) were observed. Consequently, it was made clear that the structure of the seed layer in the neighborhood of the measured part was a crystalline phase having mainly the body-centered cubic structure (bcc structure).

The plurality of diffraction spots observed in the aforementioned electron diffraction pattern corresponded to reciprocal lattice points representing the {110} plane, and when the beam origin {point(000)} and the diffraction spots corresponding to reciprocal lattice points representing the {110} plane were bonded, a nearly linear virtual line was able to be drawn and, therefore, it was made clear that regarding the seed layer of the measured part, the normal direction of the {110} plane orientated relatively strongly in the normal direction of the film surface.

As shown in FIGS. 6 and 7, it was made clear that in the electron diffraction pattern shown at the lower right in the drawing, a broad ring (halo) which indicated presence of an amorphous phase and a diffraction spot which indicated presence of a crystalline phase having the body-centered cubic structure were observed. Consequently, it was made clear that the seed layer measured at this part was a mixed phase of the amorphous phase and the crystalline phase having the body-centered cubic structure.

Subsequently, electron diffraction patterns were taken of each layer (fixed magnetic layer/non-magnetic material layer/free magnetic layer/backed layer) on the antiferromagnetic layer at the positions nearly facing the aforementioned two measured parts of the seed layer in the direction of the film thickness. The results of the electron diffraction patterns are shown at the upper left and the upper right in FIGS. 6 and 7.

In the electron diffraction patterns shown at the upper left in FIGS. 6 and 7, diffraction spots corresponding to reciprocal lattice points representing the {111} plane having a face-centered cubic structure (fcc structure) were observed. When the beam origin {point(000)} observed in the aforementioned diffraction pattern and the diffraction spots corresponding to reciprocal lattice points representing the {111} plane were bonded, it was made clear that the resulting virtual line and the virtual line of the {110} plane observed in the electron diffraction pattern of the part of the seed layer shown at the lower left were in the relationship of being nearly parallel to each other.

This is assumed that at the stage in which each of the antiferromagnetic layer, fixed magnetic layer, non-magnetic material layer, free magnetic layer, etc., was made into the film on the seed layer, the normal direction of the {111} planes in the antiferromagnetic layer, fixed magnetic layer, non-magnetic material layer, and free magnetic layer nearly agreed with the normal direction of the {110} plane of the aforementioned seed layer.

However, the aforementioned antiferromagnetic layer becomes in an incommensurate condition at the interface to the aforementioned seed layer and the interface to the fixed magnetic layer and, therefore, the aforementioned antiferromagnetic layer properly brings about modification from the disordered lattice to the ordered lattice by a heat treatment, and the crystal orientation is changed as well. Consequently, as shown in FIGS. 6 and 7, in the aforementioned antiferromagnetic layer, no crystal plane, which agrees with the direction of the {110} plane observed in the aforementioned seed layer in the direction of the film thickness, is observed.

On the other hand, it is believed that in each layer made into the film above the antiferromagnetic layer, the crystal orientation is maintained with no change even after the aforementioned heat treatment. Consequently, it is believed that the normal direction of the {111} planes of the aforementioned fixed magnetic layer, non-magnetic material layer, free magnetic layer, etc., is still in the condition of agreeing with the normal direction of the {110} plane of the aforementioned seed layer in the direction of the film thickness.

In the electron diffraction patterns shown at the upper right in FIGS. 6 and 7, the orientation of the {111} plane was weak and, therefore, it was made clear that {111} plane orientation is not significantly strong at this part.

Figure 9:
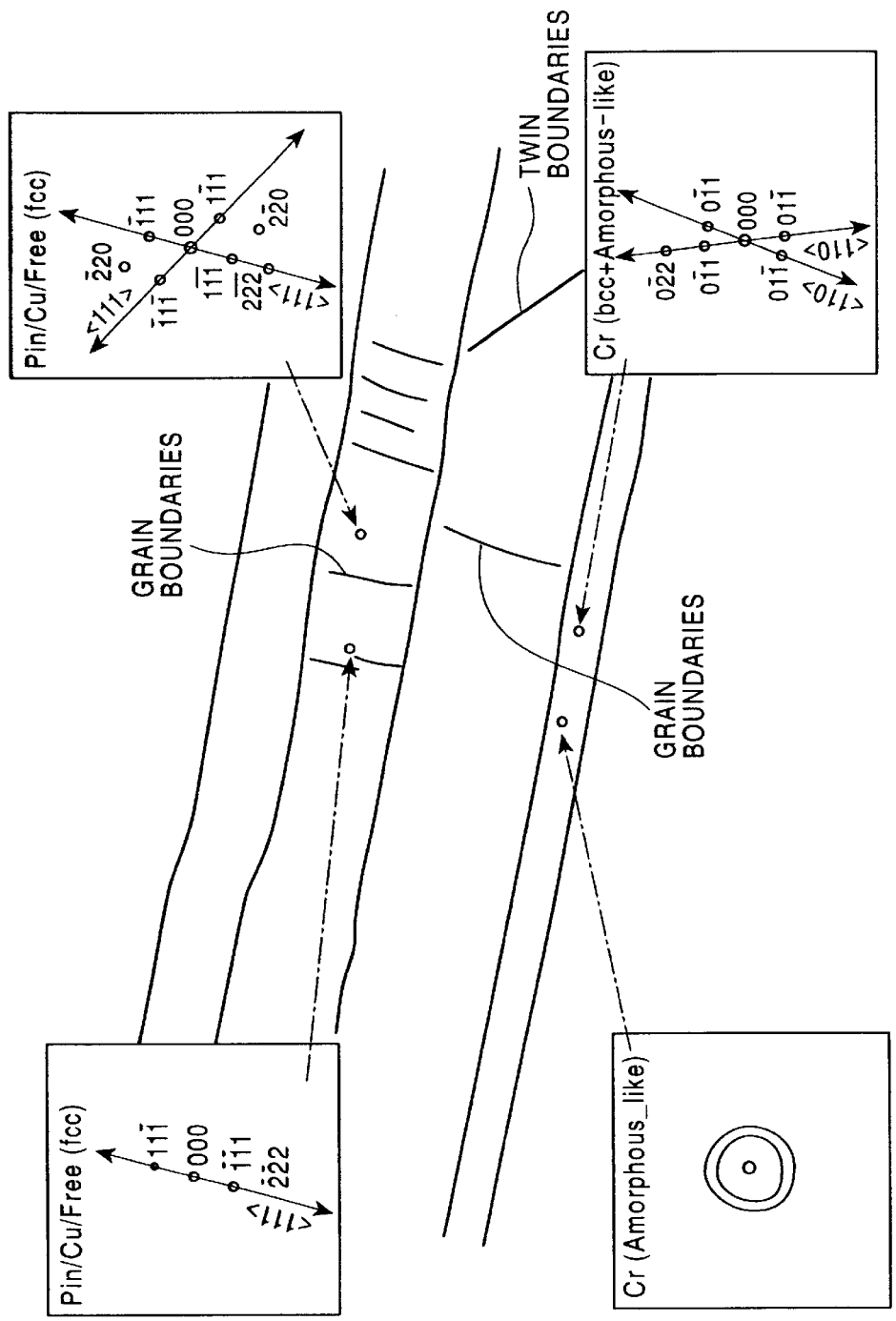
FIG. 9 is a schematic diagram of a part of the photographs shown in FIG. 8.

FIG. 8 shows a transmission electron micrograph of a magnetic detection element having the film configuration according to Example 2. FIG. 9 is a schematic diagram of a part of the photograph shown in FIG. 8.

As shown in FIGS. 8 and 9, it was made clear that the surface of each of the layers, for example, the antiferromagnetic layer formed on the seed layer formed from $(Ni_{0.8}Fe_{0.2})_{10at\%}Cr_{90at\%}$ of 30 Å and the fixed magnetic layer formed thereon, had small waves, and each layer surface was in the condition of having extremely superior smoothness.

It was made clear that the average crystal particle diameter in the direction parallel to the film surface of each layer formed on the aforementioned seed layer significantly grew to about 204 Å (refer to Table 1).

In order to examine the film structure of the aforementioned seed layer, electron diffraction patterns were taken of two parts of the aforementioned seed layer. The results of the electron diffraction patterns are attached at the lower left and the lower right in FIGS. 8 and 9.

As shown in FIGS. 8 and 9, in the electron diffraction pattern shown at the lower left in the drawing, a broad ring (halo), which indicated presence of an amorphous phase, was observed and, therefore, it was made clear that the amorphous phase was predominant.

As shown in FIGS. 8 and 9, it was made clear that in the electron diffraction pattern shown at the lower right in the drawing, a plurality of diffraction spots which indicated presence of a body-centered cubic structure (bcc structure) were observed. In addition, a broad ring (halo), which indicated presence of an amorphous phase, was observed even though by a small degree. Consequently, it was made clear that the structure of the seed layer in the neighborhood of this measured part was primarily a mixed phase of the crystalline phase having the body-centered cubic structure (bcc structure) and the amorphous phase.

The plurality of diffraction spots observed in the electron diffraction pattern at the lower right in FIGS. 8 and 9 corresponded to reciprocal lattice points representing the {110} plane, and when the beam origin {point(000)} observed in the aforementioned diffraction pattern and the diffraction spots corresponding to reciprocal lattice points representing the {110} plane were bonded, two nearly linear virtual lines were able to draw and, therefore, it was made clear that regarding the seed layer of the measured part, the normal direction of the {110} plane orientated relatively strongly in the normal direction of the film surface.

Subsequently, electron diffraction patterns were taken of each layer (fixed magnetic layer/non-magnetic material layer/free magnetic layer/backed layer) on the antiferromagnetic layer at the positions nearly facing the aforementioned two measured parts of the seed layer in the direction of the film thickness. The results of the electron diffraction patterns are shown at the upper left and the upper right in FIGS. 8 and 9.

In the electron diffraction patterns shown at the upper left in FIGS. 8 and 9, diffraction spots corresponding to reciprocal lattice points representing the {111} plane having the face-centered cubic structure (fcc structure) were observed and, therefore, it was made clear that the normal direction of the {111} plane orientated nearly in the normal direction of the film surface even though it was weak orientation. In the electron diffraction patterns shown at the upper right in FIGS. 8 and 9, diffraction spots corresponding to reciprocal lattice points representing the {111} plane having the face-centered cubic structure (fcc structure) were observed and, therefore, it was made clear that the normal direction of the {111} plane orientated nearly in the normal direction of the film surface even though it was weak orientation.

Figure 11:
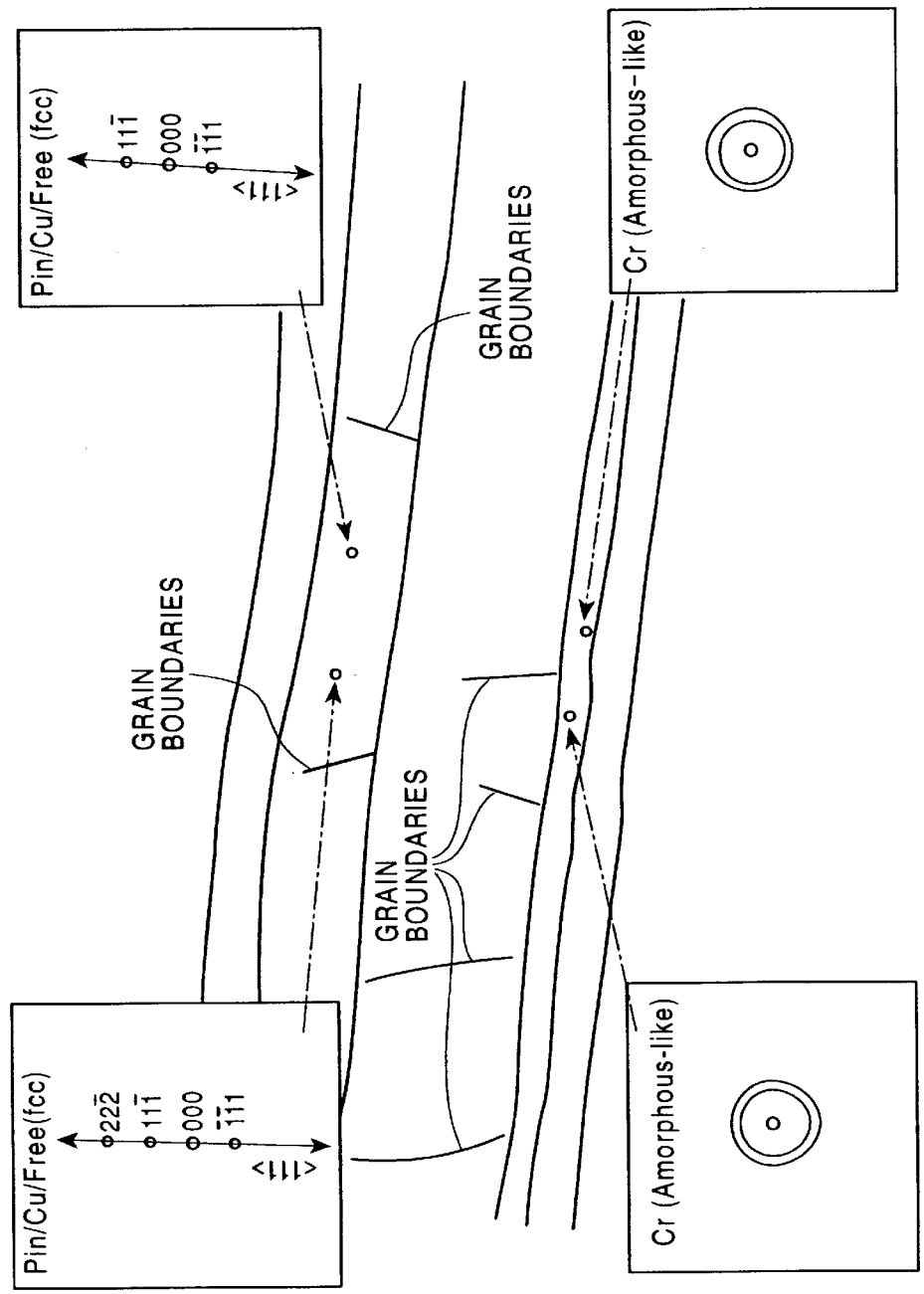
FIG. 11 is a schematic diagram of a part of the photographs shown in FIG. 10.

FIG. 10 shows a transmission electron micrograph of a magnetic detection element having the film configuration according to Example 3. FIG. 11 is a schematic diagram of a part of the photograph shown in FIG. 10.

As shown in FIGS. 10 and 11, it was made clear that the surface of each of the layers, for example, the antiferromagnetic layer on the seed layer made of $(Ni_{0.8}Fe_{0.2})_{10at}$ $_\%Cr_{90at}$ $_\%$ of 30 Å formed on the Ta film of 32 Å, and the fixed magnetic layer formed thereon, had small waves, and each layer surface was in the condition of having extremely superior smoothness.

It was made clear that the average crystal particle diameter in the direction parallel to the film surface of each layer formed on the aforementioned seed layer significantly grew to 224 Å (refer to Table 1).

In order to examine the film structure of the aforementioned seed layer, electron diffraction patterns were taken of two parts of the aforementioned seed layer. The results of the electron diffraction patterns are attached at the lower left and the lower right in FIGS. 10 and 11.

As shown in FIGS. 10 and 11, in the electron diffraction pattern shown at the lower left in the drawing, a broad ring (halo), which indicated presence of an amorphous phase, was observed and, therefore, it was made clear that the amorphous phase was predominant.

Likewise, as shown in FIGS. 10 and 11, in the electron diffraction pattern shown at the lower right in the drawing, a broad ring (halo), which indicated presence of an amorphous phase, was observed and, therefore, it was made clear that the amorphous phase was predominant. Consequently, it was made clear that the amorphous phase was primarily predominant in the structure of the seed layer in the neighborhood of this measured part.

Subsequently, electron diffraction patterns were taken of each layer (fixed magnetic layer/non-magnetic material layer/free magnetic layer/backed layer) on the antiferromagnetic layer at the positions nearly facing the aforementioned two measured parts of the seed layer in the direction of the film thickness. The results of the electron diffraction patterns are shown at the upper left and the upper right in FIGS. 10 and 11.

In the electron diffraction patterns shown at the upper left in FIGS. 10 and 11, diffraction spots corresponding to reciprocal lattice points representing the {111} plane having the face-centered cubic structure (fcc structure) were observed and, therefore, it was made clear that the normal direction of the {111} plane orientated relatively excellently in the normal direction of the film surface.

Likewise, in the electron diffraction patterns shown at the upper right in FIGS. 10 and 11, diffraction spots corresponding to reciprocal lattice points representing the {111} plane and, therefore, it was made clear that the normal direction of the {111} plane orientated relatively excellently in the normal direction of the film surface.

As described above, even when the amorphous phase is predominant in the structure of the seed layer, the {111} plane orientation of each layer of the fixed magnetic layer, free magnetic layer, etc., formed thereon with the antiferromagnetic layer therebetween is relatively excellent. The reason for this is believed that the densest surface of the antiferromagnetic layer brings about naturally laminar growth by the strong wettability of the aforementioned seed layer surface, and that is followed by growth of each layer of the fixed magnetic layer, free magnetic layer, etc., and, therefore, the excellent orientation is exhibited. Since the crystal structure of the antiferromagnetic layer is rearranged by the heat treatment in a magnetic field performed in succession to the film making stage, the antiferromagnetic layer does not have the same crystal structure as each layer of the fixed magnetic layer, free magnetic layer, etc.

Figure 13:
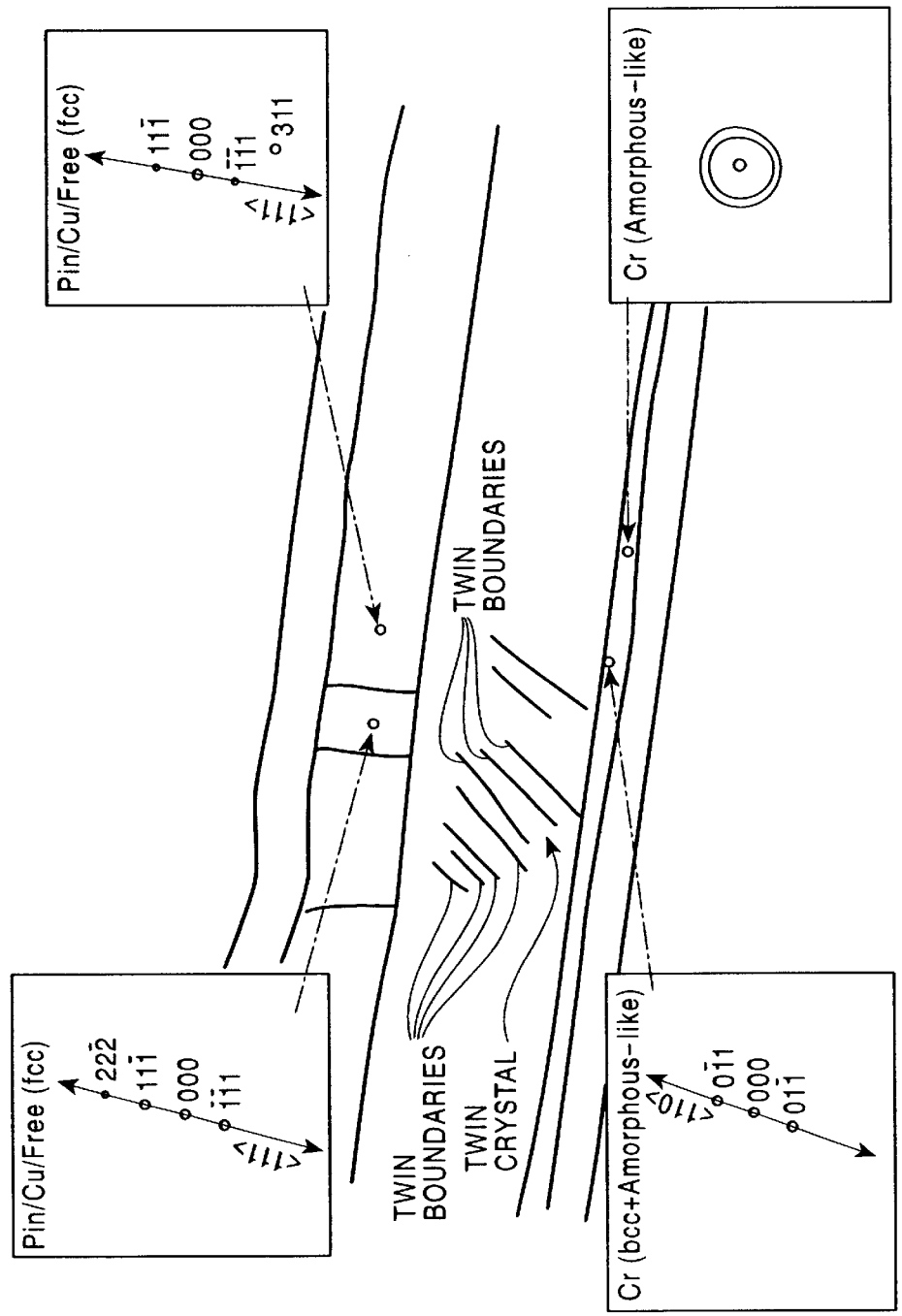
FIG. 13 is a schematic diagram of a part of the photographs shown in FIG. 12.

FIG. 12 shows a transmission electron micrograph of the magnetic detection element having the film configuration according to Example 3 measured from another position. FIG. 13 is a schematic diagram of a part of the photograph shown in FIG. 12.

As shown in FIGS. 12 and 13, it was made clear that the surface of each of the layers, for example, the antiferromagnetic layer formed on the seed layer made of $(Ni_{0.8}Fe_{0.2})_{10at}$ $_\%Cr_{90at}$ $_\%$ of 30 Å formed on the Ta film of 32 Å, and the fixed magnetic layer formed thereon, had small waves, and each layer surface was in the condition of having extremely superior smoothness.

In order to examine the film structure of the aforementioned seed layer, electron diffraction patterns were taken of two parts of the aforementioned seed layer. The results of the electron diffraction patterns are attached at the lower left and the lower right in FIGS. 12 and 13.

As shown in FIGS. 12 and 13, it was made clear that in the electron diffraction pattern shown at the lower left in the drawing, a plurality of diffraction spots which indicated presence of a body-centered cubic structure (bcc structure) and a broad ring (halo), which indicated presence of an amorphous phase were observed. Consequently, it was made clear that the structure of the seed layer in the neighborhood of this measured part was a mixed phase of a crystalline phase having the body-centered cubic structure (bcc structure) and the amorphous phase in the main.

The plurality of diffraction spots observed in the aforementioned electron diffraction pattern corresponded to reciprocal lattice points representing the {110} plane, and when the beam origin {(000) point} observed in the aforementioned diffraction pattern and the diffraction spots corresponding to reciprocal lattice points representing the {110} plane were bonded, a nearly linear virtual line was able to draw and, therefore, it was made clear that regarding the seed layer of the measured part, the normal direction of the {110} plane orientated in the normal direction of the film surface.

As shown in FIGS. 12 and 13, in the electron diffraction pattern shown at the lower right in the drawing, a broad ring (halo), which indicated presence of an amorphous phase, was observed clearly and, therefore, it was made clear that the amorphous phase was predominant in the seed layer of the measured part.

Subsequently, electron diffraction patterns were taken of each layer (fixed magnetic layer/non-magnetic material layer/free magnetic layer/backed layer) on the antiferromagnetic layer at the positions nearly facing the aforementioned two measured parts of the seed layer in the direction of the film thickness. The results of the electron diffraction patterns are shown at the upper left and the upper right in FIGS. 12 and 13.

In the electron diffraction patterns shown at the upper left in FIGS. 12 and 13, diffraction spots corresponding to reciprocal lattice points representing the {111} plane having the face-centered cubic structure (fcc structure) were observed and, therefore, it was made clear that the normal direction of the {111} plane orientated relatively excellently in the normal direction of the film surface.

Likewise, in the electron diffraction patterns shown at the upper right in FIGS. 12 and 13, diffraction spots corresponding to reciprocal lattice points representing the {111} plane having the face-centered cubic structure (fcc structure) and, therefore, it was made clear that the normal direction of the {111} plane orientated relatively excellently in the normal direction of the film surface.

It was also made clear that the {111} plane of each layer (fixed magnetic layer/non-magnetic material layer/free magnetic layer/backed layer) on the antiferromagnetic layer at the positions of measurement of the electron diffraction patterns shown at the upper left in FIGS. 12 and 13 and the {110} plane of the seed layer at the positions of measurement of the electron diffraction patterns shown at the lower left in FIGS. 12 and 13 were in the relationship of being nearly parallel to each other. The reasons for this, etc., have been described regarding FIGS. 6 and 7 and, therefore, reference can be made to the description about them.

Figure 15:
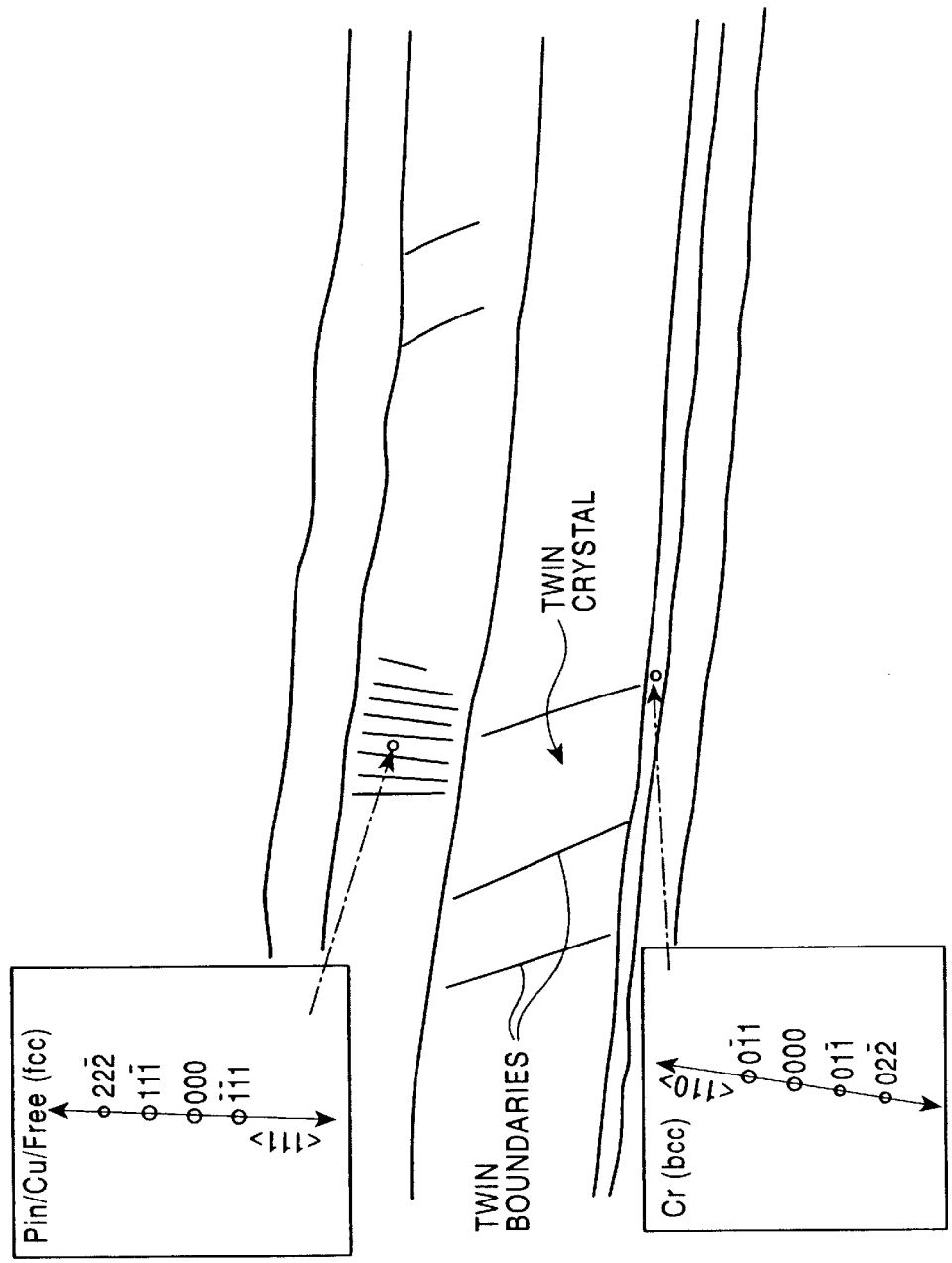
FIG. 15 is a schematic diagram of a part of the photographs shown in FIG. 14.

FIG. 14 shows a transmission electron micrograph of the magnetic detection element having the film configuration according to Example 3 measured from another position. FIG. 15 is a schematic diagram of a part of the photograph shown in FIG. 14.

As shown in FIGS. 14 and 15, it was made clear that the surface of each of the layers, for example, the antiferromagnetic layer formed on the seed layer made of $(Ni_{0.8}Fe_{0.2})_{10at}$ $\%Cr_{90at}\%$ of 30 Å formed on the Ta film of 32 Å, and the fixed magnetic layer formed thereon, had small waves, and each layer surface was in the condition of having extremely superior smoothness.

In order to examine the film structure of the aforementioned seed layer, an electron diffraction pattern was taken of one part of the aforementioned seed layer. The results of the electron diffraction pattern are attached at the lower left in FIGS. 14 and 15.

As shown in FIGS. 14 and 15, it was made clear that in the electron diffraction pattern shown at the lower left in the drawing, a plurality of diffraction spots which indicated presence of the body-centered cubic structure (bcc structure) were observed. Consequently, it was made clear that the structure of the seed layer in the neighborhood of this measured part was a crystalline phase having the body-centered cubic structure (bcc structure) in the main.

The plurality of diffraction spots observed in the aforementioned electron diffraction pattern corresponded to reciprocal lattice points representing the {110} plane, and when the beam origin {point(000)} and the diffraction spots corresponding to reciprocal lattice points representing the {110} plane were bonded, a nearly linear virtual line was able to draw and, therefore, it was made clear that regarding the seed layer of this measured part, the normal direction of the {110} plane orientated in the normal direction of the film surface.

Subsequently, an electron diffraction pattern was taken of each layer (fixed magnetic layer/non-magnetic material layer/free magnetic layer/backed layer) on the antiferromagnetic layer at the position nearly facing the aforementioned measured part of the seed layer in the direction of the film thickness. The results of the electron diffraction pattern are shown at the upper left in FIGS. 14 and 15.

In the electron diffraction patterns shown at the upper left in FIGS. 14 and 15, diffraction spots corresponding to reciprocal lattice points representing the {111} plane having the face-centered cubic structure (fcc structure) were observed and, therefore, it was made clear that the normal direction of the {111} plane orientated relatively excellently in the normal direction of the film surface.

It was also made clear that the {111} plane of each layer (fixed magnetic layer/non-magnetic material layer/free magnetic layer/backed layer) on the antiferromagnetic layer at the-measurement position of the electron diffraction pattern shown at the upper left in FIGS. 14 and 15 and the {110} plane of the seed layer at the position of measurement of the electron diffraction pattern shown at the lower left in FIGS. 14 and 15 were in the relationship of being nearly parallel to each other.

It was made clear from the aforementioned experiment results that in all Examples, the surface of each of the layers, for example, the antiferromagnetic layer formed on the seed layer and the fixed magnetic layer formed thereon, had small waves, and each layer surface was in the condition of having extremely superior smoothness.

Although parts in which the body-centered cubic structure (bcc structure) is predominant and parts in which the amorphous phase is predominant are observed in places, the film configuration of the seed layer seems to be in a condition of mixed phase of the body-centered cubic structure and the amorphous phase as a whole. This is because the seed layer has a reduced film thickness of 30 Å or less.

It is observed that the {110} plane of the crystal phase contained in the seed layer and the {111} plane of each layer of the fixed magnetic layer, free magnetic layer, etc., facing with the antiferromagnetic layer therebetween are in the relationship of being nearly parallel to each other. This is believed to indicate that since the aforementioned seed layer surface had superior wettability during the film making stage, each layer of the antiferromagnetic layer, fixed magnetic layer, free magnetic layer, etc., properly brought about laminar growth thereon. Furthermore, it is assumed that very large crystal particles having an average crystal particle diameter exceeding 200 Å in the direction parallel to the film surface of each layer formed on the aforementioned seed layer grew due to such a laminar growth.

In Examples, the interface between the antiferromagnetic layer and the fixed magnetic layer formed thereon and the interface between the antiferromagnetic layer and the seed layer formed thereunder were in an incommensurate condition in at least a part thereof, and it is believed that the aforementioned antiferromagnetic layer properly brought about modification from the disordered lattice to the ordered lattice by the heat treatment in a magnetic field.

It can be adduced as an evidence thereof that as shown in FIGS. 6, 7, 8, 9, 12, 13, 14, and 15, twin crystals are formed in at least a part of the antiferromagnetic layer, twin boundaries are formed not parallel to the interface to the aforementioned seed layer in at least a part of the aforementioned twin crystals, and in FIGS. 8, 9, 10, 11, grain boundaries formed in the antiferromagnetic layer and grain boundaries formed in the fixed magnetic layer are discontinuous in at least a part of the interface between the aforementioned antiferromagnetic layer and the fixed magnetic layer.

Next, the magnetic detection elements in Comparative example 2, Comparative example 5, and Conventional example 1 were cut from the direction of film thickness, and the cross sections thereof were observed with a transmission electron micrograph.

Figure 17:
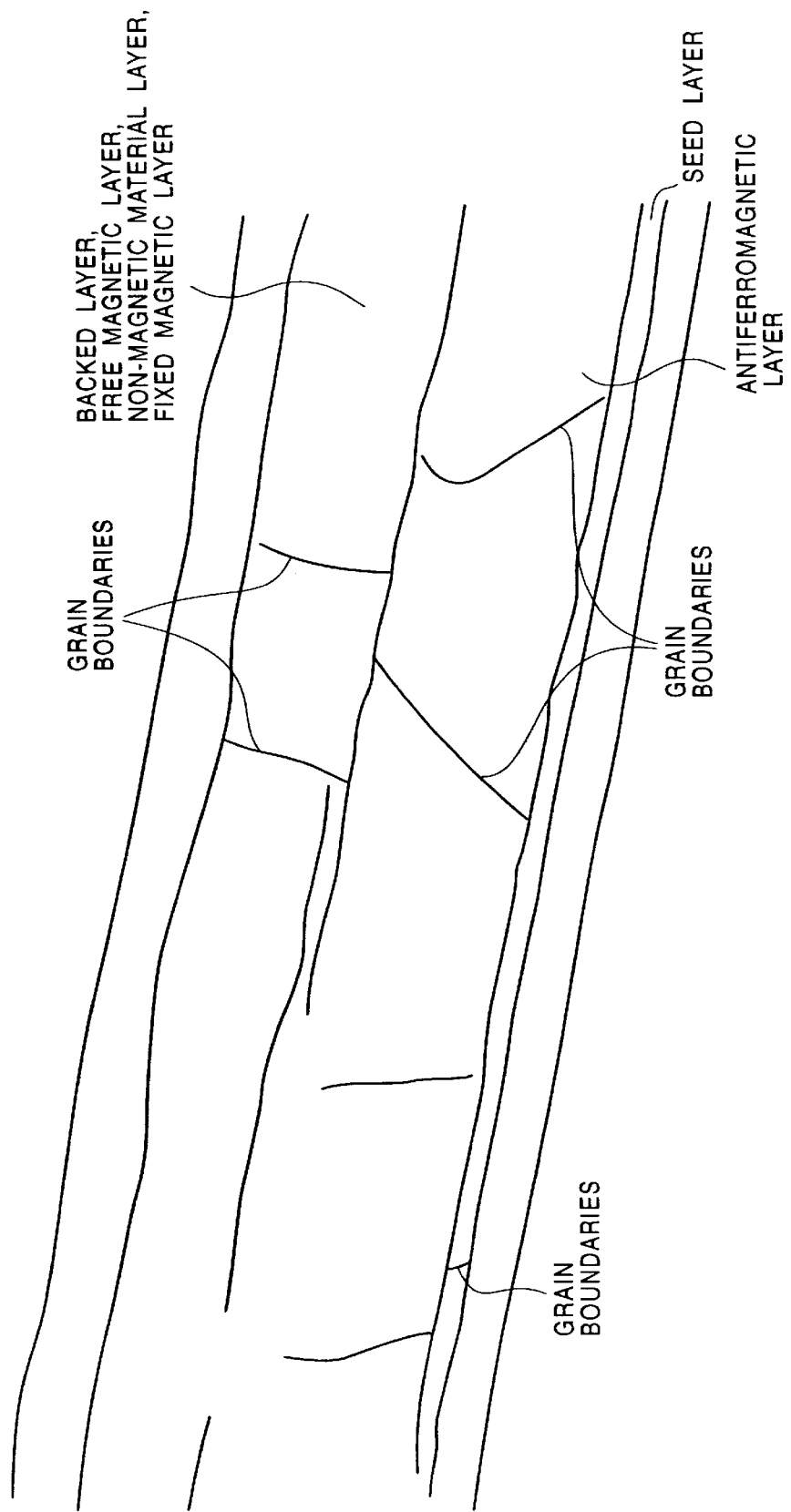
FIG. 17 is a schematic diagram of a part of the photographs shown in FIG. 16.

FIG. 16 shows a transmission electron micrograph of a magnetic detection element having the film configuration according to Comparative example 2. FIG. 17 is a schematic diagram of a part of the photograph shown in FIG. 16.

As shown in FIGS. 16 and 17, it was made clear that the surface of each of the layers, for example, the antiferromagnetic layer formed on the seed layer formed from Cr of 20

Å and the fixed magnetic layer formed thereon, had small waves, and each layer surface was in the condition of having extremely superior smoothness.

It was made clear that the average crystal particle diameter in the direction parallel to the film surface of each layer formed on the aforementioned seed layer significantly grew to about 217 Å (refer to Table 1).

In order to examine the film structure of the aforementioned seed layer, an electron diffraction pattern was taken of the part of the aforementioned seed layer. The result of the electron diffraction pattern is attached at the lower left in FIG. 16.

As shown in FIG. 16, it is clear that in the electron diffraction pattern of the seed layer formed from Cr, a broad ring (halo), which indicates presence of an amorphous phase, and a diffraction spot, which indicates presence of a crystalline phase having a body-centered cubic structure, are observed.

Consequently, it was made clear that the seed layer formed from Cr was in a condition of being a mixed phase of the amorphous phase and the crystalline phase. The aforementioned crystalline phase had a body-centered cubic structure.

Figure 19:
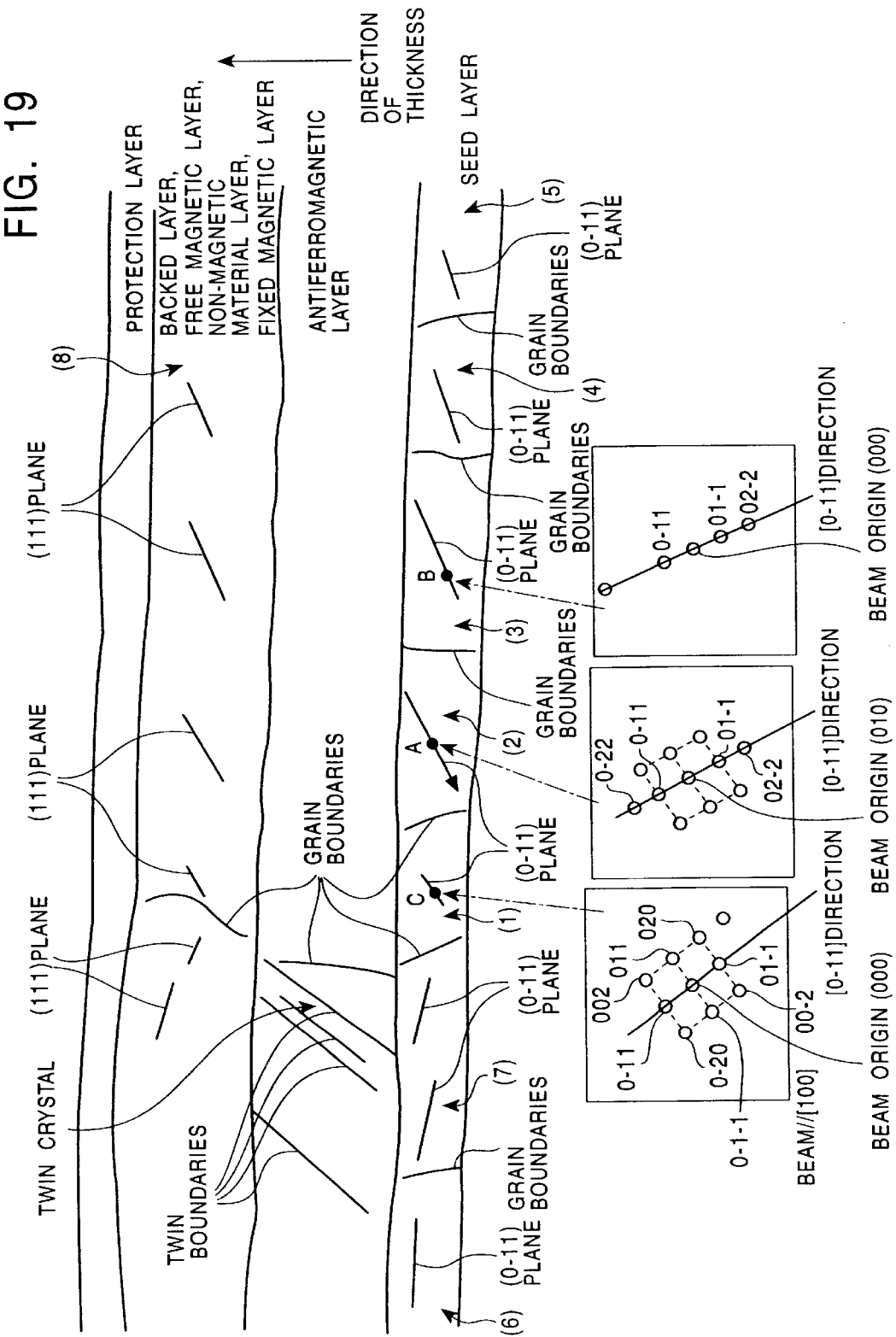
FIG. 19 is a schematic diagram of a part of the photographs shown in FIG. 18.

FIG. 18 shows a transmission electron micrograph of a magnetic detection element having the film configuration according to the aforementioned Comparative example 5. FIG. 19 is a schematic diagram of a part of the photograph shown in FIG. 18.

As shown in FIGS. 18 and 19, it was made clear that the surface of each of the layers, for example, the antiferromagnetic layer formed on the seed layer formed from Cr of 60 Å and the fixed magnetic layer formed thereon, had small waves, and each layer surface was in the condition of having superior smoothness.

It was made clear that the average crystal particle diameter in the direction parallel to the film surface of each layer formed on the aforementioned seed layer significantly grew to about 202 Å (refer to Table 1).

It was made clear from the transmission electron micrographs at the positions A, B, and C of the seed layer that the aforementioned seed layer was composed of a crystalline phase alone. The aforementioned crystalline phase had a body-centered cubic structure.

Figure 21:
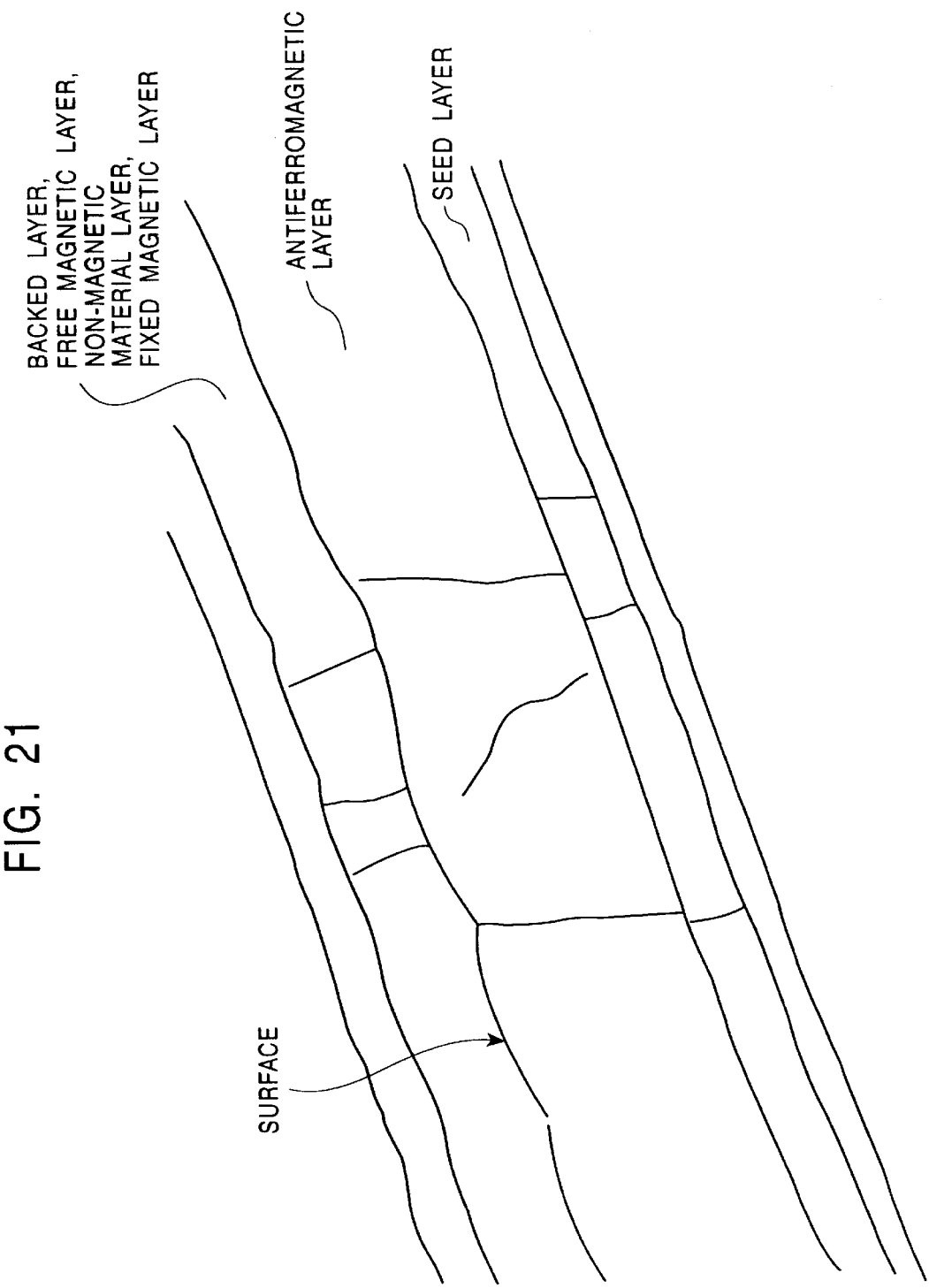
FIG. 21 is a schematic diagram of a part of the photograph shown in FIG. 20.

FIG. 20 shows a transmission electron micrograph of a magnetic detection element having the film configuration according to the aforementioned Conventional example 1. FIG. 21 is a schematic diagram of a part of the photograph shown in FIG. 20.

As shown in FIGS. 20 and 21, it was made clear that regarding the surface of each of the layers, for example, the antiferromagnetic layer formed on the seed layer formed from NiFeCr (the compositional ratio of Cr was 40 at %) of 55 Å and the fixed magnetic layer formed thereon, the surface of each layer did not have superior smoothness. It was made clear that regarding the seed layer shown in FIGS. 20 and 21, the {111} plane orientated predominantly relative to the direction parallel to the film surface. It was made clear that the aforementioned seed layer had a face-centered cubic structure (fcc structure).

As described above, regarding the experiment results in Comparative examples 2 and 5, waves of the surface of each layer was small and, therefore, excellent results were obtained. However, they are not excellent to the extent of those in Examples 1 to 3. For example, as is clear from Table 1, the ferromagnetic coupling magnetic fields ($H_{in}$), etc., in Examples are smaller than those in Comparative examples and, therefore, it is assumed to be possible to conclude that the wettability of each surface of the seed layer in Example is superior to those in Comparative examples.

Subsequently, according to the relationships between the film thickness of the seed layer formed from NiFeCr (the compositional ratio of Cr is 90 at %) alloy or Cr and the rate of resistance change ($\Delta R/R$), etc., a proper film thickness of the seed layer formed from the aforementioned NiFeCr alloy was derived.

A film configuration used in the experiment was Si substrate/alumina (1000)/seed layer: $(Ni_{0.8}Fe_{0.2})_{10 at \%}Cr_{90 at \%}$ or Cr (X)/antiferromagnetic layer: PtMn (120)/fixed magnetic layer: {CoFe (16)/Ru (8.7)/CoFe (22)}/non-magnetic material layer: Cu (21)/free magnetic layer: {CoFe (10)/$Ni_{81.5 at \%}Fe_{18.5 at \%}$ (18)/backed layer: Cu (10)/protection layer: Ta (30) from the bottom, wherein a parenthesized value indicates a film thickness in the unit angstrom.

An experiment was performed using the one in which a Ta film (32 Å) was placed between the seed layer and the alumina film in the aforementioned film configuration as well.

Regarding film making of the seed layer formed from Cr, the pressure of an Ar gas introduced during sputtering film making was specified to be 1 mTorr, the power supplied to a sputtering device was specified to be 100 W, and the distance between the target and the substrate was specified to be about 7 cm.

After film making of the magnetic detection element formed with the aforementioned film configuration, magnetic annealing was performed in the magnetic field of about 800 k (A/m) at 290° C. for about 4 hours.

Figure 22:
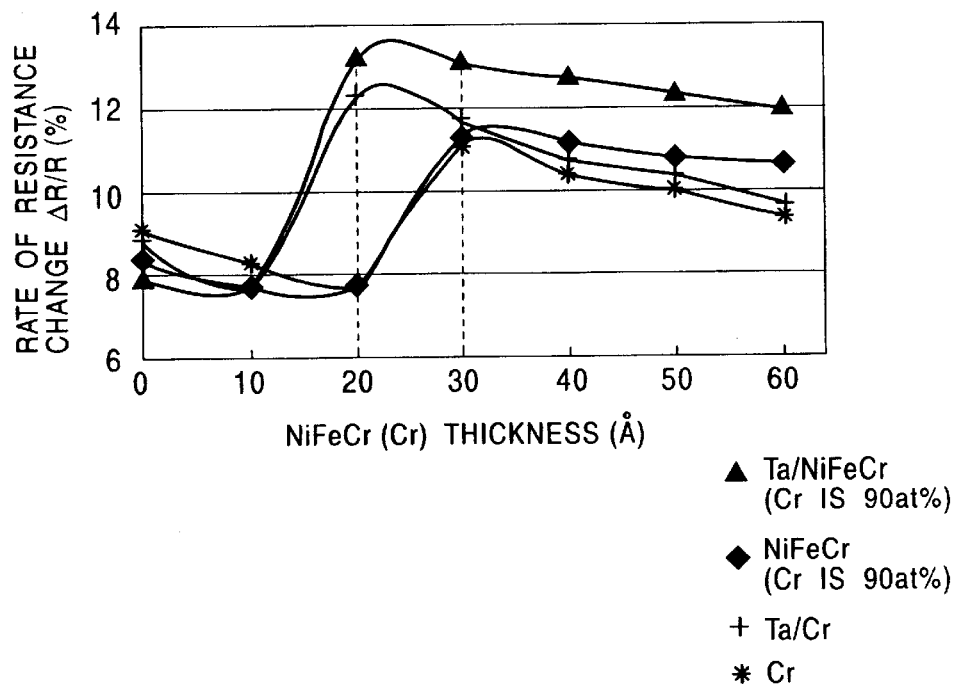
FIG. 22 is a graph showing the relationship between the film thickness of the seed layer formed from NiFeCr (the compositional ratio of Cr is 90 at %) or Cr, or the seed layer formed from the aforementioned NiFeCr or Cr on Ta, and the rate of resistance change.

FIG. 22 is a graph showing the relationship between the film thickness of the seed layer formed from NiFeCr (the compositional ratio of Cr is 90 at %) or Cr and the rate of resistance change ($\Delta R/R$).

As shown in FIG. 22, according to the experiment results regarding "Ta/NiFeCr (the compositional ratio of Cr is 90 at %)", in which the Ta film was placed under the seed layer, it was made clear that when the film thickness of NiFeCr was 20 Å or more, the aforementioned rate of resistance change became about 12% or more and, therefore, a very high rate of resistance change was able to be achieved.

On the other hand, according to the experiment results regarding "Ta/Cr", when the film thickness of the seed layer becomes 20 Å or more, the rate of resistance change of about 12% or more can be achieved. However, as is clear from FIG. 22, when the aforementioned film thickness of the seed layer is increased, the rate of resistance change begins to reduce, the degree of the reduction thereof is larger than that in the experiment result in the aforementioned "Ta/NiFeCr (the compositional ratio of Cr is 90 at %)", and when the aforementioned film thickness of the seed layer is increased to on the order of 60 Å, the aforementioned rate of resistance change becomes less than 10%. On the other hand, it was made clear that in the case of "Ta/NiFeCr (the compositional ratio of Cr is 90 at %)", even when the aforementioned film thickness of the seed layer was increased to on the order of 60 Å, the rate of resistance change on the order of 12% was maintained.

In the case of the Cr single layer, the resistivity was reduced, specifically, was on the order of 20 $\mu\Omega$·cm at a film thickness of 1,000 Å. In contrast to this, in the case of NiFeCr (the compositional ratio of Cr is 90 at %) alloy, the resistivity was increased, specifically, was on the order of 75 $\mu\Omega$·cm at a film thickness of 1,000 Å.

Consequently, when the seed layer is formed from the NiFeCr (the compositional ratio of Cr is 90 at %) alloy, the quantity of the sense current shunted from the electrode layer into the aforementioned seed layer is smaller than that in the case where the seed layer is formed from Cr and, therefore, it becomes possible to maintain a high rate of resistance change (ΔR/R).

Furthermore, it can be predicted from this experiment result that even when the aforementioned film thickness of the seed layer is increased to on the order of 130 Å, the rate of resistance change of 10% or more can be achieved.

Accordingly, in the present invention, the film thickness of the seed layer of X—Cr (the compositional ratio of Cr is 80 at % or more) alloy formed on the Ta substrate is set at 20 Å or more, but 130 Å or less.

The aforementioned film thickness is preferably 60 Å or less and, thereby, the rate of resistance change on the order of 12% can be achieved. It is clear that when the compositional ratio of Cr is 90 at % or more (although except 100 at %), the rate of resistance change of about 10% or more and, preferably, 12% or more can be achieved with reliability.

Next, the experiment results in the case where no Ta substrate layer is formed will be discussed. As shown in FIG. 22, according to the experiment results regarding "NiFeCr (the compositional ratio of Cr is 90 at %)" it is clear that when the film thickness of the seed layer is specified to be 30 Å or more, the rate of resistance change of about 10% or more can be achieved.

On the other hand, according to the experiment results regarding "Cr", when the film thickness of the seed layer is specified to be 30 Å or more, the rate of resistance change of about 10% or more can be achieved as well. However, as is clear from FIG. 22, when the aforementioned film thickness of the seed layer is increased, the rate of resistance change begins to reduce, the degree of the reduction thereof is larger than that in the experiment result in the aforementioned "NiFeCr (the compositional ratio of Cr is 90 at %)", and when the aforementioned film thickness of the seed layer is increased to on the order of 60 Å, the aforementioned rate of resistance change becomes less than 10%. On the other hand, it was made clear that in the case of "NiFeCr (the compositional ratio of Cr is 90 at %)", even when the aforementioned film thickness of the seed layer was increased to on the order of 60 Å, the rate of resistance change on the order of 10% or more was maintained.

Furthermore, it can be predicted from this experimental result that even when the aforementioned film thickness of the seed layer is increased to on the order of 130 Å, the rate of resistance change of 10% or more can be achieved.

Accordingly, in the present invention, the film thickness of the seed layer of X—Cr (the compositional ratio of Cr is 80 at % or more) alloy in the case where no Ta substrate is placed is set at 30 Å or more, but 130 Å or less.

The aforementioned film thickness is preferably 60 Å or less and, thereby, the rate of resistance change (ΔR/R) of 10% or more can be achieved. It was made clear that when the compositional ratio of Cr is 90 at % or more, the rate of resistance change of about 10% or more was able to be achieved with reliability.

Figure 23:
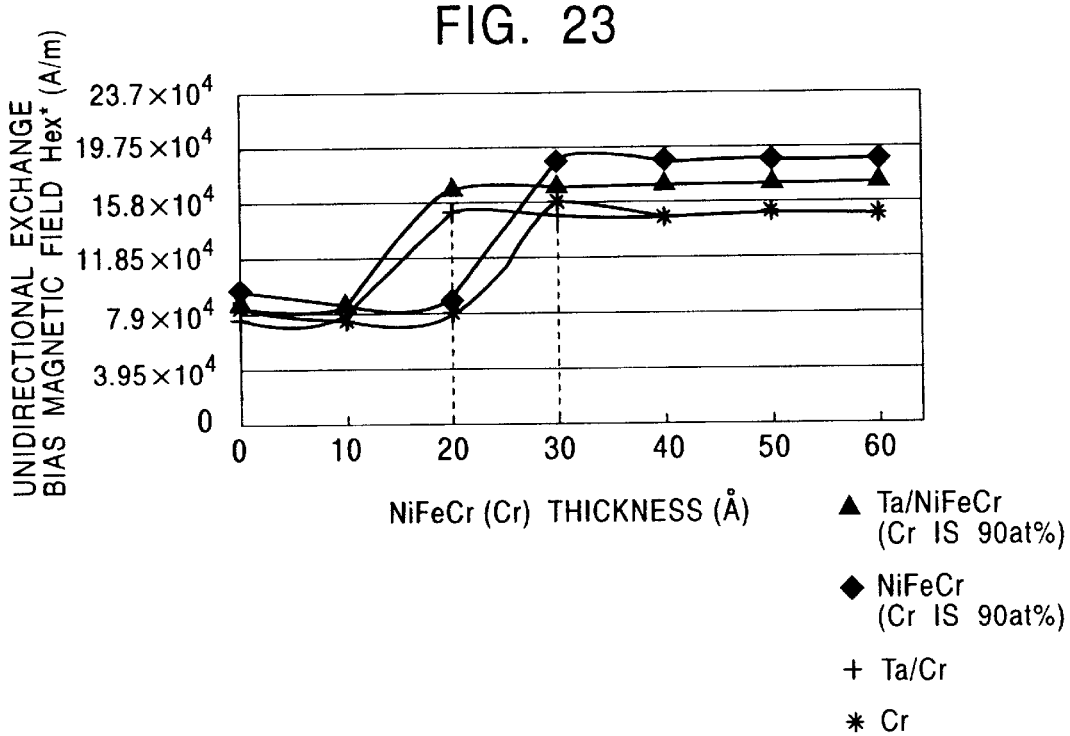
FIG. 23 is a graph showing the relationship between the film thickness of the seed layer formed from NiFeCr (the compositional ratio of Cr is 90 at %) or Cr, or the seed layer formed from the aforementioned NiFeCr or Cr on Ta, and the unidirectional exchange bias magnetic field (Hex*) of the fixed magnetic layer.

FIG. 23 is a graph showing the relationship between the film thickness of the seed layer formed from NiFeCr (the compositional ratio of Cr is 90 at %) or Cr and the unidirectional exchange bias magnetic field (Hex*).

As shown in FIG. 23, according to the experiment results regarding "Ta/NiFeCr (the compositional ratio of Cr is 90 at %)", in which the Ta film was placed under the seed layer, it was made clear that when the film thickness of NiFeCr was 20 Å or more, the aforementioned unidirectional exchange bias magnetic field became 15.8×10$^4$ (A/m) or more and, therefore, very high unidirectional exchange bias magnetic field was able to be achieved.

On the other hand, according to the experiment results regarding "Ta/Cr", it was made clear that when the film thickness of the seed layer became 20 Å, the unidirectional exchange bias magnetic field of a value close to about 15.8×10$^4$ (A/m) was able to achieve, although the value is smaller than that in the experiment results regarding "Ta/NiFeCr (the compositional ratio of Cr is 90 at %)".

In the present invention, the aforementioned film thickness of the seed layer is preferably 60 Å or less and, thereby, the unidirectional exchange bias magnetic field (Hex*) of 15.8×10$^4$ (A/m) or more can be achieved with reliability. It is clear that when the compositional ratio of Cr is 90 at % or more, the unidirectional exchange bias magnetic field (Hex*) of 15.8×10$^4$ (A/m) or more can be achieved with reliability.

Next, the experiment results in the case where no Ta substrate layer is formed will be discussed. As shown in FIG. 23, according to the experiment results regarding "NiFeCr (the compositional ratio of Cr is 90 at %)", it is clear that when the film thickness of the seed layer is specified to be 30 Å or more, the unidirectional exchange bias magnetic field (Hex*) of 15.8×10$^4$ (A/m) or more can be achieved.

On the other hand, according to the experiment results regarding "Cr" as well, it is clear that when the film thickness of the seed layer is specified to be 30 Å or more, the unidirectional exchange bias magnetic field of a value close to 15.8×10$^4$ (A/m) can be achieved, although the value is smaller than that in the case of "Ta/NiFeCr (the compositional ratio of Cr is 90 at %)".

In the present invention, the aforementioned film thickness of the seed layer is preferably 60 Å or less and, thereby, the unidirectional exchange bias magnetic field (Hex*) of 15.8×10$^4$ (A/m) or more can be achieved with reliability. It is clear that when the compositional ratio of Cr is 90 at % or more, the unidirectional exchange bias magnetic field (Hex*) of 15.8×10$^4$ (A/m) or more can be achieved with reliability.

Figure 24:
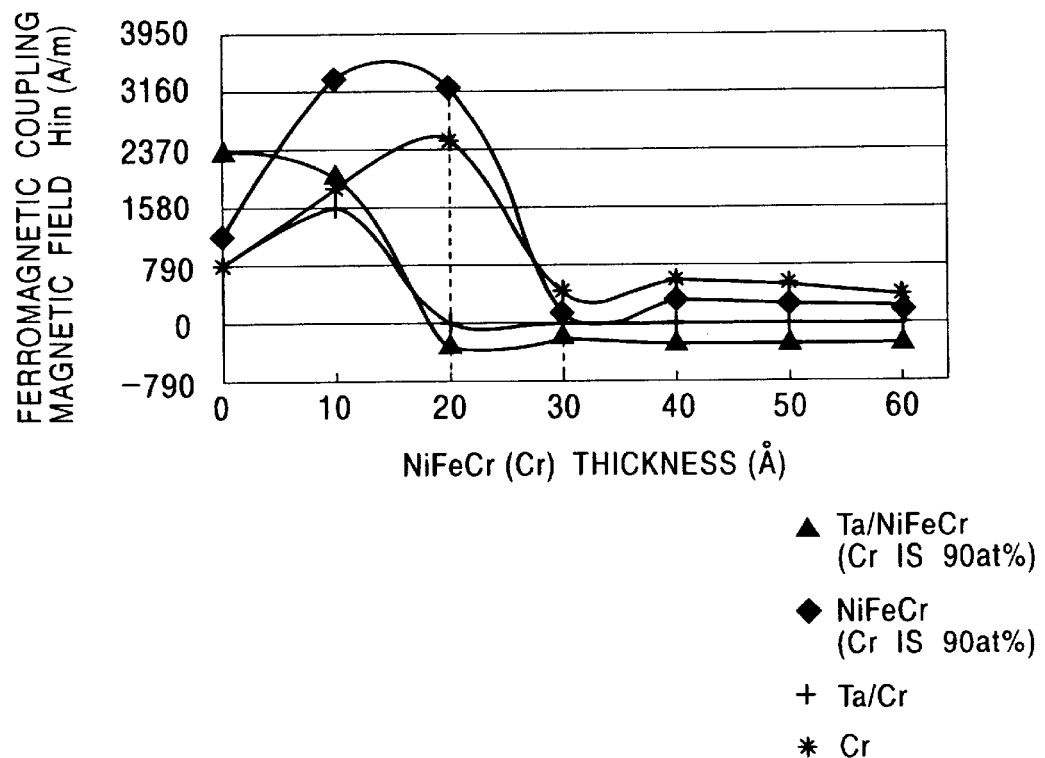
FIG. 24 is a graph showing the relationship between the film thickness of the seed layer formed from NiFeCr (the compositional ratio of Cr is 90 at %) or Cr, or the seed layer formed from the aforementioned NiFeCr or Cr on Ta, and the ferromagnetic coupling magnetic field $H_{in}$.
Figure 25:
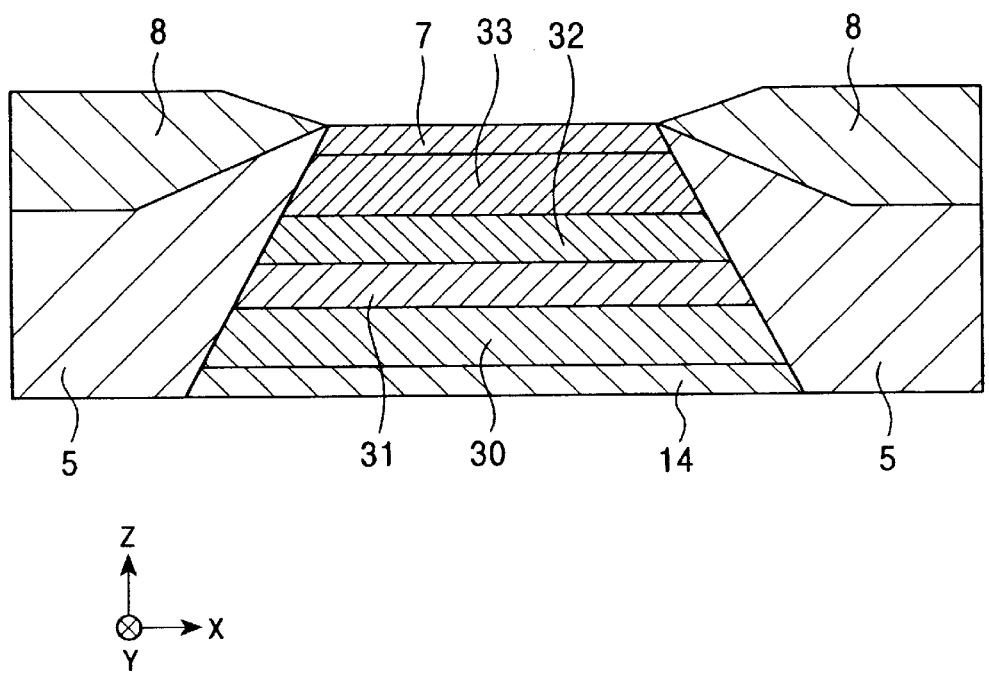
FIG. 25 is a partial sectional view of a conventional magnetic detection element viewed from the surface facing a recording medium side.
Figure 26:
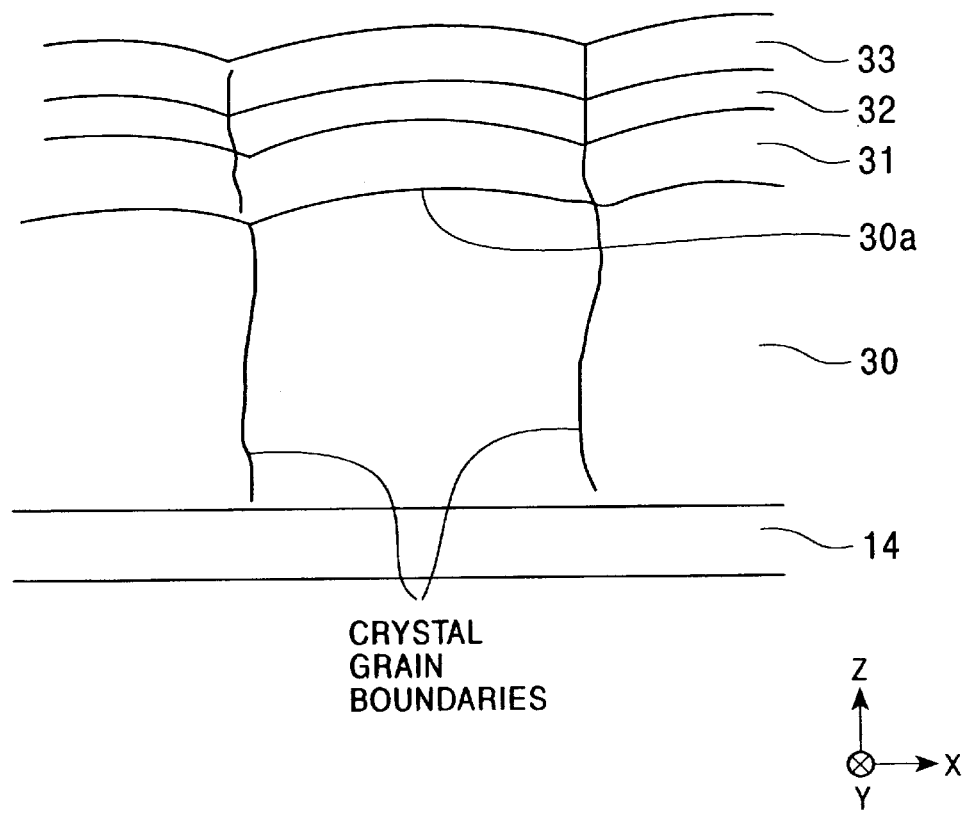
FIG. 26 is a partial schematic diagram of a part of the magnetic detection element shown in FIG. 25 for showing the layer structure under magnification.
Figure 27:
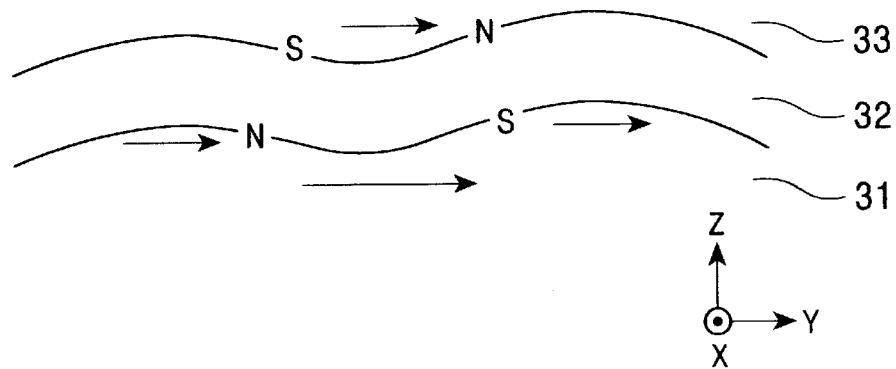
FIG. 27 is a partial schematic diagram of the part of fixed magnetic layer, non-magnetic material layer, and free magnetic layer shown in FIG. 26 for showing the layer structure under magnification.

FIG. 24 is a graph showing the relationships between the film thickness of the seed layer formed from NiFeCr (the compositional ratio of Cr is 90 at %) or Cr and the ferromagnetic coupling magnetic field $H_{in}$ which acts between the fixed magnetic layer and free magnetic layer.

As shown in FIG. 24, according to the experiment results regarding "Ta/NiFeCr (the compositional ratio of Cr is 90 at %)", in which the Ta film was placed under the seed layer, it was made clear that when the film thickness of NiFeCr was 20 Å or more, the aforementioned ferromagnetic coupling magnetic field $H_{in}$ became a value getting closer and closer to 0 (A/m).

In particular, it is clear that when the film thickness of the aforementioned NiFeCr was 20 Å or more regarding "Ta/NiFeCr (the compositional ratio of Cr is 90 at %), the ferromagnetic coupling magnetic field $H_{in}$ becomes a value getting closer and closer to 0 (A/m) and, in addition, the value takes a negative value. When the ferromagnetic coupling magnetic field $H_{in}$ takes a negative value, a coupling force, which tends to make the magnetization antiparallel, is effected from the aforementioned fixed magnetic layer to the free magnetic layer. This is very similar to that in the laminated ferrimagnetic structure. The laminated ferrimagnetic structure refers to a film structure formed by facing ferromagnetic layers on and under a non-magnetic layer, and by properly adjusting the film thickness of the non-magnetic layer and the like, magnetization of the aforementioned ferromagnetic layers is made in a condition of being antiparallel to each other by a coupling magnetic field due to the RKKY interaction acting between the aforementioned ferromagnetic layers. At this time, the smoothness of the surfaces of the aforementioned ferromagnetic layers and non-magnetic layer is important. When the surfaces of the aforementioned ferromagnetic layers and non-magnetic layer do not have extremely excellent smoothness, the magnetization cannot be made antiparallel to each other.

Consequently, the fact that in the experiment results regarding "Ta/NiFeCr (the compositional ratio of Cr is 90 at %)" shown in FIG. 24, the ferromagnetic coupling magnetic field $H_{in}$ is a value getting closer and closer to 0 (A/m) and, in addition, the value takes a negative value and, thereby, the action which makes magnetization antiparallel to each other has a slight effect between the fixed magnetic layer and the free magnetic layer indicates that the surfaces of the aforementioned fixed magnetic layer and free magnetic layer are smoother than those in the case where the ferromagnetic coupling magnetic field $H_{in}$ takes a positive value and, therefore, the action which tends to aim both magnetization in the same direction has an effect between the fixed magnetic layer and the free magnetic layer.

On the other hand, according to the experiment results regarding "Ta/Cr", when the film thickness of the seed layer becomes 20 Å, the ferromagnetic coupling magnetic field $H_{in}$ is reduced and becomes a value getting closer and closer to 0 (A/m). However, at that time, the ferromagnetic coupling magnetic field $H_{in}$ takes a positive value and, therefore, it is believed that the smoothness of each layer surface on the seed layer in the case of "Ta/Cr" is slightly inferior to those in the case of "Ta/NiFeCr (the compositional ratio of Cr is 90 at %)".

The aforementioned film thickness of the seed layer is preferably 60 Å or less and, thereby, the ferromagnetic coupling magnetic field $H_{in}$ can be set at a value getting closer and closer to 0 (A/m) with reliability. In the present invention, when the compositional ratio of Cr is 90 at % or more, the ferromagnetic coupling magnetic field $H_{in}$ can be set at a value getting closer and closer to 0 (A/m) with reliability.

Next, the experiment results in the case where no Ta substrate layer is formed will be discussed. As shown in FIG. 24, according to the experiment results regarding "NiFeCr (the compositional ratio of Cr is 90 at %)", it is clear that when the film thickness of the seed layer is specified to be 30 Å or more, the ferromagnetic coupling magnetic field $H_{in}$ can be set at a value getting closer and closer to 0 (A/m).

On the other hand, according to the experiment results regarding "Cr" as well, it is clear that when the film thickness of the seed layer is specified to be 30 Å or more, the aforementioned ferromagnetic coupling magnetic field $H_{in}$ can be set at a value getting closer and closer to 0 (A/m).

In the present invention, the aforementioned film thickness of the seed layer is preferably 60 Å or less and, thereby, the ferromagnetic coupling magnetic field $H_{in}$ can be set at a value getting closer and closer to 0 (A/m) with reliability. Furthermore, when the compositional ratio of Cr is 90 at % or more, the aforementioned ferromagnetic coupling magnetic field $H_{in}$ can be set at a value getting closer and closer to 0 (A/m) with reliability.

As described above in detail, in the exchange coupling film according to the present invention, the substrate layer formed from an element, for example, Ta, is formed under the aforementioned seed layer, the aforementioned seed layer is formed containing Cr and an element X (wherein the element X is at least one selected from the group consisting of Fe, Ni, Co, Ti, V, Nb, Zr, Hf, Ta, Mo, W, and Y), the compositional ratio of the aforementioned Cr is 80 at % or more, and the film thickness of the aforementioned seed layer is 20 Å or more, but 130 Å or less. When the aforementioned substrate layer is not placed, the film thickness of the aforementioned seed layer is preferably 30 Å or more, but 130 Å or less.

In the seed layer according to the present invention, the compositional ratio of Cr is very high compared to that in the case where the seed layer is formed from conventional NiFeCr having the compositional ratio of Cr of 40 at % or less and, therefore, the wettability of the seed layer surface can be improved remarkably. Consequently, each of the layers, for example, the antiferromagnetic layer deposited on the aforementioned seed layer, is likely to bring about laminar growth, the average crystal particle diameter can be increased compared to that heretofore attained, and a unidirectional exchange bias magnetic field (Hex*) and rate of resistance change in the ferromagnetic layer can be further increased compared to that in the case where the aforementioned seed layer is formed from the NiFeCr alloy having the compositional ratio of Cr of 40 at % or less.

Since this unidirectional exchange bias magnetic field can be increased, the improvement of reliability in current-carrying represented by the improvement of electromigration resistance can be achieved properly, for example, the aforementioned ferromagnetic layer can be pinned properly in the predetermined direction, magnetization of the aforementioned ferromagnetic layer can be maintained in the condition of being fixed in the predetermined direction even when high heat is generated and, in addition, occurrence of grain boundary diffusion along crystal grain boundaries between respective layers can be prevented due to large crystal particle diameter.

In the present invention, in addition to the remarkable improvement of the wettability of the aforementioned seed layer surface, generation of waves on the surface of each layer formed on the aforementioned seed layer can be prevented compared to that heretofore attained and, therefore, the smoothness of the surface can be improved properly.

When the aforementioned exchange coupling film is used for a magnetic detection element, the ferromagnetic coupling magnetic field $H_{in}$ due to the magnetostatic coupling (topological coupling) between the fixed magnetic layer and the free magnetic layer can be reduced, and asymmetry of the playback waveform can be reduced. When the mirror reflection layer is formed, the mirror reflectivity of the aforementioned mirror reflection layer can be improved and, therefore, the improvement of the rate of resistance change can be achieved.

When compared to the case in which the aforementioned seed layer is formed from Cr, the unidirectional exchange bias magnetic field (Hex*) and the rate of resistance change ($\Delta R/R$) can be improved and, in addition, the smoothness of the surface of each layer formed on the aforementioned seed layer can be improved properly.

As described above, according to the exchange coupling film in the present invention and the magnetic detection element using this exchange coupling magnetic film, the wettability of the aforementioned seed layer can be improved remarkably compared to that heretofore attained, the smoothness of the surface of each layer formed on the aforementioned seed layer can be improved and, therefore, the unidirectional exchange bias magnetic field (Hex*) can be increased compared to that heretofore attained, the reliability in current-carrying can be improved compared to those heretofore attained even in the future increase in recording density. In addition, the stability of the playback waveform and the improvement of the rate of resistance change can be achieved properly.

What is claimed is:

1. An exchange coupling film, wherein:
   a seed layer, an antiferromagnetic layer, and a ferromagnetic layer are laminated in that order from a bottom, and a direction of magnetization of the ferromagnetic layer is set in a specified direction due to generation of an exchange coupling magnetic field at an interface between the antiferromagnetic layer and the ferromagnetic layer;
   a substrate layer formed from at least one element selected from the group consisting of Ta, Hf, Nb, Zr, Ti, Mo, and W is formed under the seed layer;
   the seed layer is formed containing Cr and an element X (wherein the element X is at least one selected from the group consisting of Fe, Ni, Go, Ti, V, Nb, Zr, Hf, Ta, Mo, W, and Y); and
   a compositional ratio of Cr is at least 80 at %, and a film thickness of the seed layer is at least 20 Å and at most 130 Å.

2. The exchange coupling film according to claim 1, wherein no substrate layer is formed under the seed layer, and the film thickness of the seed layer is at least 30 Å and at least 130 Å.

3. The exchange coupling film according to claim 1, wherein the film thickness of the seed layer is at most 60 Å.

4. The exchange coupling film according to claim 1, wherein the compositional ratio of Cr is at least 90 at %.

5. The exchange coupling film according to claim 1, wherein the element X is at least one selected from the group consisting of Ni, Fe, and Co.

6. The exchange coupling film according to claim 5, wherein the seed layer is formed from a NiFeCr alloy.

7. The exchange coupling film according to claim 6, wherein an atomic ratio X of $Ni_{1-X}$ and $Fe_X$ is $0<X\leq0.7$.

8. The exchange coupling film according to claim 7, wherein the atomic ratio is $0<X\leq0.5$.

9. The exchange coupling film according to claim 7, wherein the atomic ratio is $0<X\leq0.3$.

10. The exchange coupling film according to claim 5, wherein the seed layer is formed from a FeCr alloy.

11. The exchange coupling film according to claim 1, wherein an average crystal particle diameter in a direction parallel to a film surface of each layer formed on the seed layer is at least 200 Å.

12. The exchange coupling film according to claim 11, wherein the average crystal particle diameter is at least 210 Å.

13. The exchange coupling film according to claim 1, wherein the ferromagnetic layer is formed including a mirror reflection layer.

14. The exchange coupling film according to claim 1, wherein when the exchange coupling film is cut parallel to a direction of the film thickness, grain boundaries formed in the antiferromagnetic layer and grain boundaries formed in the ferromagnetic layer, which are observed on the cut surface, are discontinuous in at least a part of the interface between the antiferromagnetic layer and the ferromagnetic layer.

15. The exchange coupling film according to claim 1, wherein when the exchange coupling film is cut parallel to a direction of the film thickness, grain boundaries formed in the antiferromagnetic layer and grain boundaries formed in the seed layer, which are observed on the cut surface, are discontinuous in at least a part of an interface between the antiferromagnetic layer and the seed layer.

16. The exchange coupling film according to claim 1, wherein twin crystals are formed in at least a part of the antiferromagnetic layer, and twin boundaries are formed not parallel to an interface to the seed layer in at least a part of the twin crystals.

17. The exchange coupling film according to claim 1, wherein the antiferromagnetic layer is formed from an antiferromagnetic material containing an element Z (wherein Z is at least one element selected from the group consisting of Pt, Pd, Ir, Rh, Ru, and Os) and Mn.

18. The exchange coupling film according to claim 17, wherein the compositional ratio of the element Z is at least 45 (at %) and at most 60 (at %).

19. The exchange coupling film according to claim 1, wherein the antiferromagnetic layer is formed from an X—Mn—X' alloy (wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements).

20. The exchange coupling film according to claim 19, wherein the X—Mn—X' alloy is one of an interstitial solid solution in which the element X' has penetrated into a gap of a space lattice composed of the element X and Mn, and is a substitutional solid solution in which the element X' has substituted for a part of lattice points of a crystal lattice composed of the element X and Mn.

21. The exchange coupling film according to claim 19, wherein a compositional ratio of one of the element X and elements X+X' is at least 45 (at %) and at most 60 (at %).

22. A magnetic detection element, wherein:
   a seed layer, an antiferromagnetic layer, a fixed magnetic layer, a non-magnetic material layer and a free magnetic layer are laminated in that order from a bottom, and magnetization of the free magnetic layer is arranged in a direction intersecting magnetization of the fixed magnetic layer; and
   the seed layer, the antiferromagnetic layer, and the fixed magnetic layer are formed from the exchange coupling film according to claim 1.

23. The magnetic detection element according to claim 22, wherein a mirror reflection layer is further formed on the magnetic detection element.

24. A magnetic detection element, wherein:
   a seed layer, an antiferromagnetic exchange bias layer, a free magnetic layer, a non-magnetic material layer, a fixed magnetic layer, and an antiferromagnetic layer are laminated in that order from a bottom, and magnetization of the free magnetic layer is arranged in a direction intersecting magnetization of the fixed magnetic layer; and
   the seed layer, the exchange bias layer, and the free magnetic layer are formed from the exchange coupling film according to claim 1.

25. The magnetic detection element according to claim 24, wherein a mirror reflection layer is further formed on the magnetic detection element.

26. A magnetic detection element, wherein:
   non-magnetic material layers laminated on and under a free magnetic layer, fixed magnetic layers located on a first of the non-magnetic material layers and under a second of the non-magnetic material layers, and antiferromagnetic layers located on a first of the fixed magnetic layers and under a second of the fixed magnetic layers are included, a seed layer is formed under the antiferromagnetic layer formed on the side lower than the free magnetic layer, and magnetization of the free magnetic layer is arranged in a direction intersecting magnetization of the fixed magnetic layer; and the seed layer, the antiferromagnetic layer joined thereon, and the fixed magnetic layer are formed from the exchange coupling film according to claim 1.

27. The magnetic detection element according to claim 26, wherein a mirror reflection layer is further formed on the magnetic detection element.

28. A magnetic detection element in which a seed layer, an antiferromagnetic exchange bias layer, a magnetoresistive layer, a non-magnetic layer, and a soft magnetic layer are laminated in that order from a bottom, wherein the seed layer, the exchange bias layer, and the magnetoresistive layer are formed from the exchange coupling film according to claim 1.

* * * * *